(12) United States Patent
Koyama et al.

(10) Patent No.: US 8,507,352 B2
(45) Date of Patent: Aug. 13, 2013

(54) METHOD OF MANUFACTURING SEMICONDUCTOR DEVICE INCLUDING INSULATED GATE BIPOLAR TRANSISTOR AND DIODE

(75) Inventors: Masaki Koyama, Nukata-gun (JP); Yutaka Fukuda, Kariya (JP)

(73) Assignee: DENSO CORPORATION, Kariya (JP)

( * ) Notice: Subject to any disclaimer, the term of this patent is extended or adjusted under 35 U.S.C. 154(b) by 880 days.

(21) Appl. No.: 12/591,694

(22) Filed: Nov. 30, 2009

(65) Prior Publication Data

US 2010/0140658 A1    Jun. 10, 2010

(30) Foreign Application Priority Data

Dec. 10, 2008  (JP) ................. 2008-314221
Dec. 12, 2008  (JP) ................. 2008-316709
Aug. 25, 2009  (JP) ................. 2009-194330

(51) Int. Cl.
| | |
|---|---|
| H01L 21/8222 | (2006.01) |
| H01L 21/8234 | (2006.01) |
| H01L 21/8249 | (2006.01) |
| H01L 21/70 | (2006.01) |
| H01L 21/331 | (2006.01) |
| H01L 21/338 | (2006.01) |

(52) U.S. Cl.
USPC ........... 438/328; 438/170; 438/234; 438/237; 438/314; 438/364; 438/372; 257/370; 257/375; 257/592; 257/E21.383; 257/E27.022; 257/E27.037; 257/E27.038; 257/E27.039

(58) Field of Classification Search
USPC ................ 257/E29.198, E21.383, 370, 375, 257/E27.017, E27.02, E27.022, E27.037–E27.039, 257/577, 592; 438/170, 234, 237, 314, 369, 438/372
See application file for complete search history.

(56) References Cited

U.S. PATENT DOCUMENTS

| | | | | |
|---|---|---|---|---|
| 4,509,250 | A | * | 4/1985 | Blossfeld ...................... 438/331 |
| 5,751,023 | A | * | 5/1998 | Aono ............................. 257/138 |
| 5,834,809 | A | | 11/1998 | Kato et al. |

(Continued)

FOREIGN PATENT DOCUMENTS

| JP | A-62-243355 | 10/1987 |
|---|---|---|
| JP | A-06-005880 | 1/1994 |

(Continued)

OTHER PUBLICATIONS

Office Action mailed Oct. 25, 2011 in corresponding JP Application No. 2009-194330 (and English translation).

*Primary Examiner* — Cheung Lee
*Assistant Examiner* — Jeremy Joy
(74) *Attorney, Agent, or Firm* — Posz Law Group, PLC

(57) ABSTRACT

In a method of manufacturing a semiconductor device, a semiconductor substrate of a first conductivity type having first and second surfaces is prepared. Second conductivity type impurities for forming a collector layer are implanted to the second surface using a mask that has an opening at a portion where the collector layer will be formed. An oxide layer is formed by enhanced-oxidizing the collector layer. First conductivity type impurities for forming a first conductivity type layer are implanted to the second surface using the oxide layer as a mask. A support base is attached to the second surface and a thickness of the semiconductor substrate is reduced from the first surface. An element part including a base region, an emitter region, a plurality of trenches, a gate insulating layer, a gate electrode, and a first electrode is formed on the first surface of the semiconductor substrate.

9 Claims, 32 Drawing Sheets

(56) References Cited

U.S. PATENT DOCUMENTS

| | | | |
|---|---|---|---|
| 6,054,748 | A | 4/2000 | Tsukuda et al. |
| 6,084,284 | A * | 7/2000 | Adamic, Jr. ............... 257/506 |
| 6,451,645 | B1 | 9/2002 | Ozeki et al. |
| 7,009,292 | B2 | 3/2006 | Miura et al. |
| 7,145,254 | B2 | 12/2006 | Hirano et al. |
| 7,271,040 | B2 * | 9/2007 | Tanaka ..................... 438/133 |
| 8,102,025 | B2 * | 1/2012 | Ozeki et al. ............... 257/577 |
| 2005/0017290 | A1 * | 1/2005 | Takahashi et al. ......... 257/328 |
| 2005/0156283 | A1 | 7/2005 | Tokuda et al. |
| 2005/0170555 | A1 | 8/2005 | Hirano et al. |
| 2006/0170406 | A1 * | 8/2006 | Kawashima et al. ....... 323/294 |
| 2007/0075332 | A1 | 4/2007 | Tokuda et al. |
| 2007/0228554 | A1 | 10/2007 | Yoshimi et al. |
| 2008/0135932 | A1 | 6/2008 | Ozeki et al. |
| 2008/0296611 | A1 * | 12/2008 | Kobayashi et al. .......... 257/133 |
| 2008/0315248 | A1 | 12/2008 | Tokura et al. |

FOREIGN PATENT DOCUMENTS

| | | |
|---|---|---|
| JP | A-06-196705 | 7/1994 |
| JP | A-09-082955 | 3/1997 |
| JP | A-11-97715 | 4/1999 |
| JP | A-2003-158131 | 5/2003 |
| JP | A-2005-175174 | 6/2005 |
| JP | A-2006-49933 | 2/2006 |
| JP | B2-3932743 | 3/2007 |
| JP | A-2008-159848 | 7/2008 |

* cited by examiner

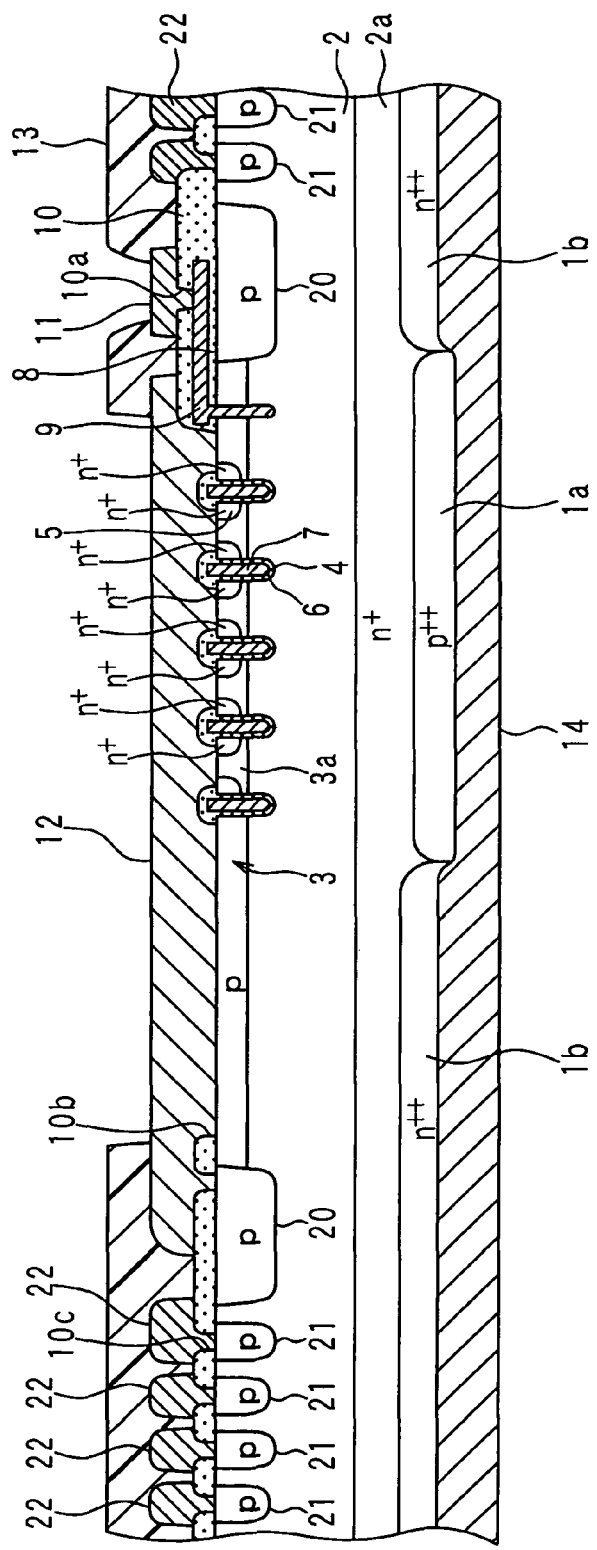

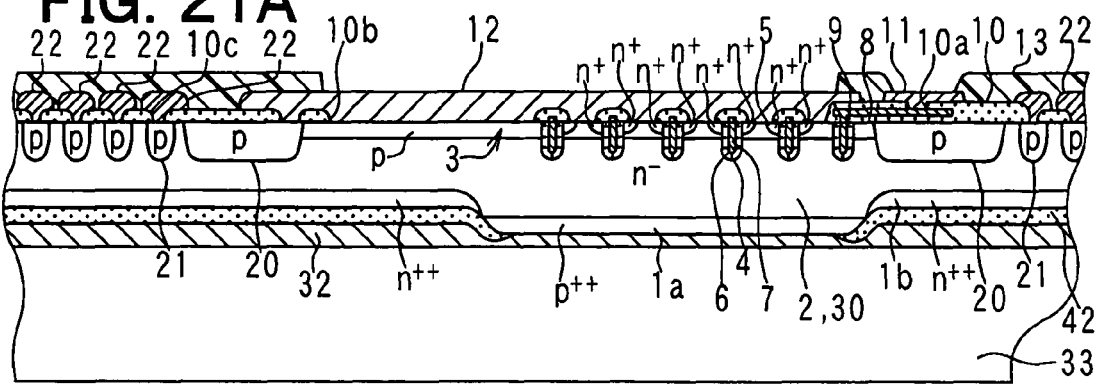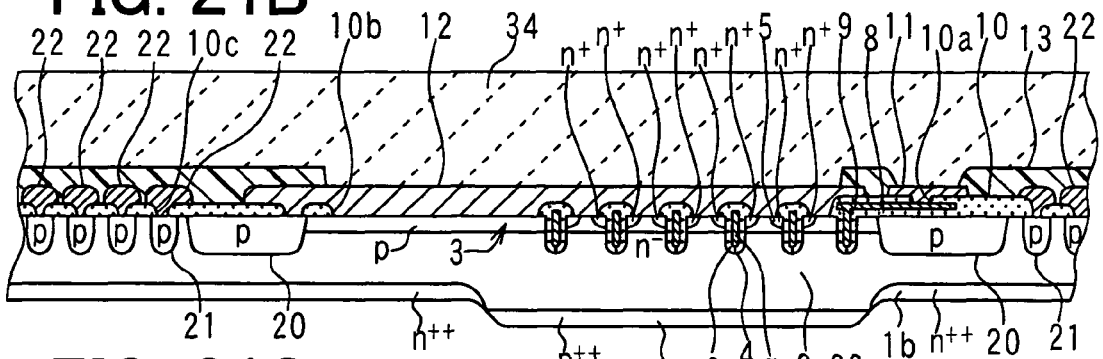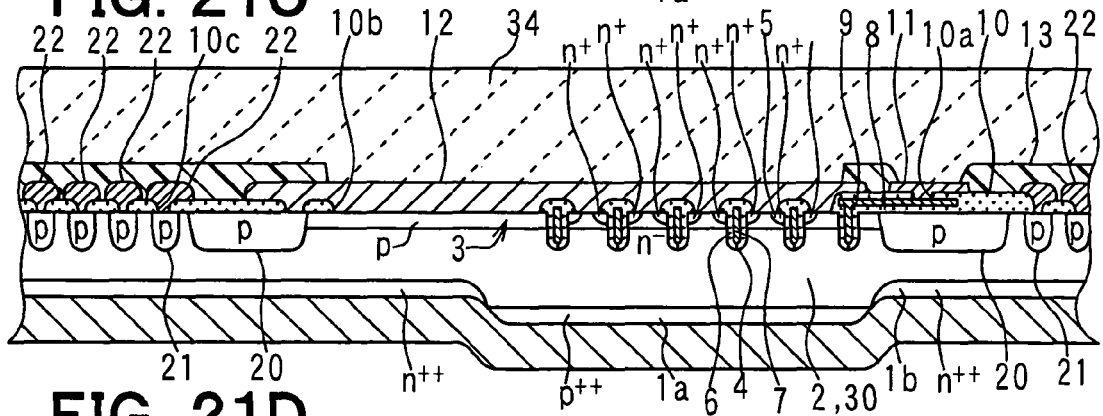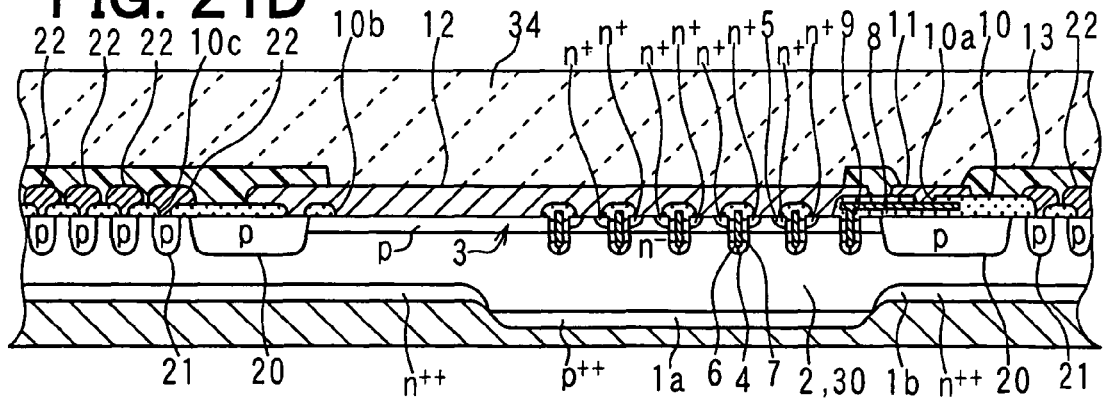

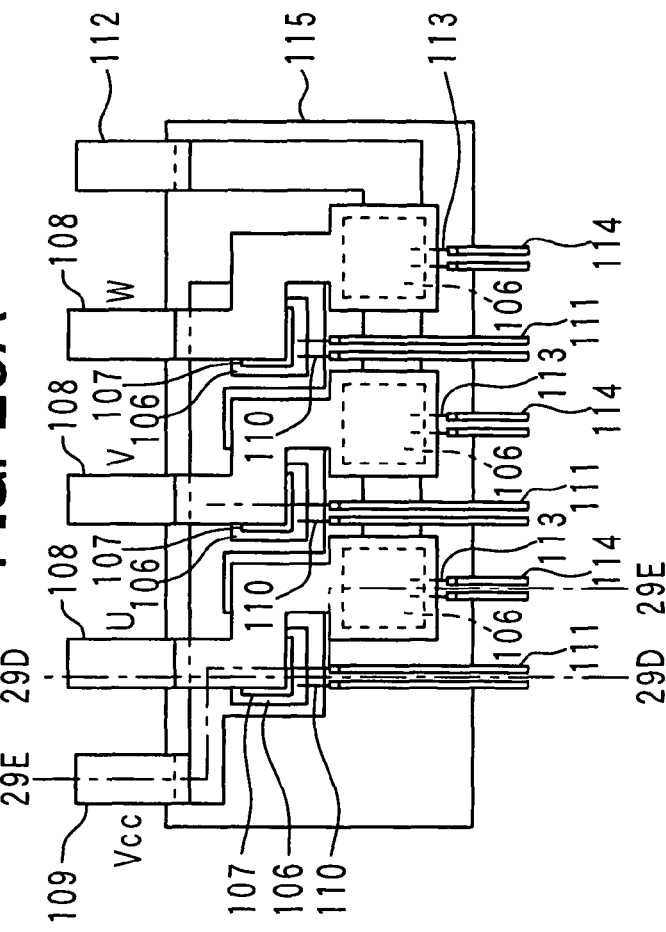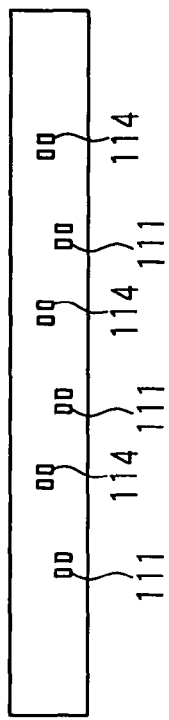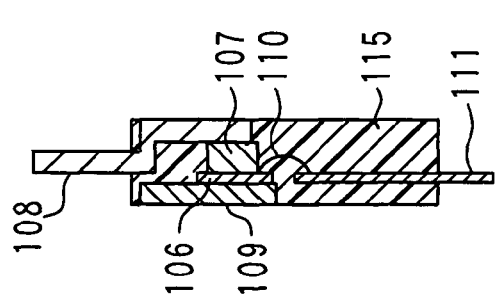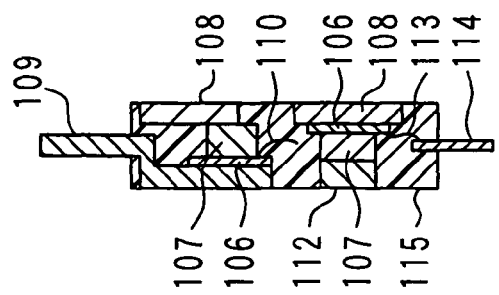

METHOD OF MANUFACTURING SEMICONDUCTOR DEVICE INCLUDING INSULATED GATE BIPOLAR TRANSISTOR AND DIODE

CROSS REFERENCE TO RELATED APPLICATIONS

The present application is based on and claims priority to Japanese Patent Applications No. 2008-314221 filed on Dec. 10, 2008, and No. 2008-316709 filed on Dec. 12, 2008, and No. 2009-194330 filed on Aug. 25, 2009, the contents of which are incorporated in their entirety herein by reference.

BACKGROUND OF THE INVENTION

1. Field of the Invention

The present invention relates to a semiconductor device including an insulated gate bipolar transistor (IGBT) and a free wheel diode (hereafter, diode) in one chip. The present invention also relates to a method of manufacturing a semiconductor device in which an IGBT and a diode are formed in one chip.

2. Description of the Related Art

In a conventional semiconductor chip including an IGBT and a diode in one chip, an N+ type layer operating as a cathode layer is formed in a diode forming region and a P+ type layer operating as a collector layer is formed in an IGBT forming region as described, for example, in US 2005/0017290 A (corresponding to JP-A-2005-57235). In a process of manufacturing the semiconductor device having the above-described structure, a crack may generate when the semiconductor device is handled in a thin-film state. An exemplary process of manufacturing a conventional semiconductor device, in which an IGBT and a diode are integrated, will be described with reference to FIG. 35A to FIG. 36D.

During a process illustrated in FIG. 35A, an N type semiconductor substrate J1 is prepared. The N type semiconductor substrate J1 has a thickness of greater than or equal to 200 µm and is not warped. The N type semiconductor substrate J1 is, for example, a FZ substrate. After forming an oxide layer J2 on a main surface of the N type semiconductor substrate J1, openings are provided at predetermined portions of the oxide layer J2 by a pattern forming process. Then, P type impurities are implanted through the openings in the oxide layer J2 so as to form a P type diffusion layer J3 and a P type guard ring layer J2 in an outer peripheral section. The openings also function as alignment targets during the subsequent patterning process.

During a process illustrated in FIG. 35B, a P type base region J5 is formed. Then, a trench gate structure J6 is formed in an IGBT forming region and a gate wire J7 and an emitter electrode J8 are formed so as to provide a metal oxide semiconductor (MOS) device.

During a process illustrated in FIG. 35C, a main surface of the N type semiconductor substrate J1, that is, a surface of the N type semiconductor substrate J1 on which the MOS device is formed, is attached on a support base J10, for example, through an adhesive. During a process illustrated in FIG. 35D, a thickness of the N type semiconductor substrate J1 is reduced to a predetermined thickness from a rear surface of the N type semiconductor substrate J1. Although the thickness of the N type semiconductor substrate J1 is reduced during the above-described process, the N type semiconductor substrate J1 is not handled in a thin-film state because the N type semiconductor substrate J1 is attached to the support base J10. In the above-described process, the thickness of the N type semiconductor substrate J1 may be reduced, for example, by a grinding process or a wet etching process. When the thickness of the N type semiconductor substrate J1 is reduced by a grinding process, large amount of particles may generate.

During a process illustrated in FIG. 36A, N type impurities are implanted from the rear-surface side of the N type semiconductor substrate J1. During a process illustrated in FIG. 36B, a mask is disposed on the rear surface of the N type semiconductor substrate J1. Openings are provided at predetermined portions of the mask by a pattern forming process, and P type impurities are implanted through the openings. Another mask is disposed on the rear surface of the N type semiconductor substrate J1. Openings are provided at predetermined portions of the mask by a pattern forming process, and N type impurities are implanted through the openings. Then, an anneal treatment is performed so that a field stop (FS) layer J11, a P++ type collector layer J12, and an N++ type cathode layer (first conductivity type layer) J13 are formed.

During a process illustrated in FIG. 36C, a rear-surface electrode J14 being in contact with the P++ type collector layer J12 and the N++ type cathode layer J13 is formed. During a process illustrated in FIG. 36D, the support base J10 is separated from the N type semiconductor substrate J10. In the above-described way, the semiconductor device including the IGBT and the diode in one chip is manufactured.

In the above-described manufacturing method, the P++ type collector layer J12 and the N++ type cathode layer J13 as well as the FS layer J11 are formed after forming the MOS device at the main-surface side of the N type semiconductor substrate J12. Thus, the anneal treatment performed after implanting the N type impurities or the P type impurities is limited to a laser anneal. A protective layer and a wiring structure are formed at the main-surface side of the N type semiconductor substrate J1. For example, an upper temperature limit of a protective layer made of polyimide is about 350° C., and an upper temperature limit of a wiring structure made of aluminum is about 490° C., and an upper temperature limit of an adhesive layer of the support base J10 is about 200° C. Thus, an anneal treatment that increases a temperature of the whole substrate cannot be performed, and only a laser anneal that increases a temperature of the rear surface locally can be performed.

The laser anneal is an instantaneous anneal. The laser anneal can activate the implanted impurities, but the laser anneal cannot diffuse the impurities. Thus, a leakage is likely to occur. In particular, in a case where the thickness of the N type semiconductor substrate J1 is reduced by a grinding process, large amount of particles may generate, and the particles may block the implanted impurities. Thus, a deficiency may generate at the P++ type collector layer J12 and the N++ type cathode layer J13, and a leakage is more likely to occur.

When the mask for forming the P++ type collector layer J12 or the N++ type cathode layer J13 is pattern formed, an insulating layer formed on the main surface, for example, a gate oxide layer in the trench gate structure is used as an alignment key. Thus, a relative position of the P++ type collector layer J12 and the N++ type cathode layer J13 may be misaligned. For example, a distance between the P++ type collector layer J12 and the N++ type cathode layer J13 may be longer than a predetermined distance, or the P++ type collector layer J12 and the N++ type cathode layer J13 may overlap.

In order to prevent an exhaustion of holes at a recovery, a P type layer may be partially formed in an N type layer that operates as a cathode layer. Also in this case, a forming position of the P type layer may be out of a predetermined position.

SUMMARY OF THE INVENTION

In view of the foregoing problems, it is an object of the present invention to provide a semiconductor device including an IGBT and a diode in one chip. Another object of the present invention is to provide a method of manufacturing a semiconductor device including an IGBT and a diode formed in one chip.

In a method of manufacturing a semiconductor device according to a first aspect of the present invention, a semiconductor substrate of a first conductivity type is prepared. The semiconductor substrate has first and second surfaces opposing each other. Second conductivity type impurities for forming a collector layer is implanted to the second surface of the semiconductor substrate using a mask that has an opening at a portion where the collector layer will be formed. An oxide layer is formed by enhanced-oxidizing the collector layer. First conductivity type impurities for forming a first conductivity type layer is implanted to the second surface of the semiconductor substrate using the oxide layer as a mask. A support base is attached to a side of the semiconductor substrate where the oxide layer and the first conductivity type layer are formed. A thickness of the semiconductor substrate is reduced from the first surface in a state where the semiconductor substrate is attached with the support base. An element part including a base region, an emitter region, a plurality of trenches, a gate insulating layer, a gate electrode, and a first electrode is formed on the first surface of the semiconductor substrate after reducing the thickness of the semiconductor substrate.

In the method according to the first aspect, the collector layer and the first conductivity type layer are formed before forming the element part. Thus, an anneal treatment other than a laser anneal can be performed. In addition, because the support base is attached to the semiconductor substrate before forming the element part, the semiconductor substrate is not handled in a thin-film state.

In a method of manufacturing a semiconductor device according to a second aspect of the present invention, a semiconductor substrate of a first conductivity type is prepared. The semiconductor substrate has first and second surfaces opposing each other. First conductivity type impurities for forming a first conductivity type layer are implanted to the second surface of the semiconductor substrate using a mask that has an opening at a portion where the first conductivity type layer will be formed. An oxide layer is formed by enhanced-oxidizing the first conductivity type layer. Second conductivity type impurities for forming a collector layer are implanted to the second surface of the semiconductor substrate using the oxide layer as a mask. A support base is attached to a side of the semiconductor substrate where the oxide layer and the collector layer are formed. A thickness of the semiconductor substrate is reduced from the first surface in a state where the semiconductor substrate is attached with the support base. An element part including a base region, an emitter region, a plurality of trenches, a gate insulating layer, a gate electrode, and a first electrode is formed on the first surface of the semiconductor substrate after reducing the thickness of the semiconductor substrate.

In the method according to the second aspect, the collector layer and the first conductivity type layer are formed before forming the element part. Thus, an anneal treatment other than a laser anneal can be performed. In addition, because the support base is attached to the semiconductor substrate before forming the element part, the semiconductor substrate is not handled in a thin-film state.

In a method of manufacturing a semiconductor device according to a third aspect of the present invention, a semiconductor substrate of a first conductivity type is prepared. The semiconductor substrate has first and second surfaces opposing each other. Second conductivity type impurities for forming a collector layer are implanted to a whole area of the second surface of the semiconductor substrate. A recess portion is formed at a portion where a first conductivity type layer will be formed using a silicon nitride layer that has an opening at the portion where a first conductivity type layer will be formed as a mask so that the collector layer is removed and the semiconductor substrate is exposed at the portion where the first conductivity type layer will be formed. First conductivity type impurities for forming the first conductivity type layer are implanted to an exposed surface of the semiconductor substrate using the silicon nitride layer as a mask. An oxide layer is formed by oxidizing the first conductivity type layer in a state where the collector layer is covered with the silicon nitride layer. After removing the silicon nitride layer, a support base is attached to a side of the semiconductor substrate where the oxide layer and the collector layer are formed. A thickness of the semiconductor substrate is reduced from the first surface in a state where the semiconductor substrate is attached with the support base. An element part including a base region, an emitter region, a plurality of trenches, a gate insulating layer, a gate electrode, and a first electrode is formed on, the first surface of the semiconductor substrate after reducing the thickness of the semiconductor substrate.

In the method according to the third aspect, the collector layer and the first conductivity type layer are formed before forming the element part. Thus, an anneal treatment other than a laser anneal can be performed. In addition, because the support base is attached to the semiconductor substrate before forming the element part, the semiconductor substrate is not handled in a thin-film state.

In a method of manufacturing a semiconductor device according to a fourth aspect of the present invention, a semiconductor substrate of a first conductivity type is prepared. The semiconductor substrate has first and second surfaces opposing each other. First conductivity type impurities for forming the first conductivity type layer are implanted to a whole area of the second surface of the semiconductor substrate. A recess portion is formed at a portion where the collector layer will be formed using a silicon nitride layer that has an opening at the portion where the collector layer will be formed as a mask so that the first conductivity type layer is removed and the semiconductor substrate is exposed at the portion where the collector layer will be formed. Second conductivity type impurities for forming the collector layer are implanted to an exposed surface of the semiconductor substrate using the silicon nitride layer as a mask. An oxide layer is formed by oxidizing the collector layer in a state where the first conductivity type layer is covered with the silicon nitride layer. After removing the silicon nitride layer, a support base is attached to a side of the semiconductor substrate where the oxide layer and the first conductivity type layer are formed. A thickness of the semiconductor substrate is reduced from the first surface in a state where the semiconductor substrate is attached with the support base. An element part including a base region, an emitter region, a plurality of trenches, a gate insulating layer, a gate electrode; and a first electrode is formed on the first surface of the semiconductor substrate after reducing the thickness of the semiconductor substrate.

In the method according to the fourth aspect, the collector layer and the first conductivity type layer are formed before forming the element part. Thus, an anneal treatment other than a laser anneal can be performed. In addition, because the support base is attached to the semiconductor substrate before forming the element part, the semiconductor substrate is not handled in a thin-film state.

In a method of manufacturing a semiconductor device according to a fifth aspect of the present invention, a semiconductor substrate of a first conductivity type is prepared. The semiconductor substrate has first and second surfaces opposing each other. A recess portion is formed at a portion of the second surface of the semiconductor substrate where a first conductivity type layer will be formed using a silicon nitride layer that has an opening at the portion where the first conductivity type layer will be formed as a mask. First conductivity type impurities for forming the first conductivity type layer are implanted to the second surface of the semiconductor substrate using the silicon nitride layer as a mask. An oxide layer is formed by oxidizing the first conductivity type layer in a state where the silicon nitride layer covers a portion of the second surface, of the semiconductor substrate where a collector layer will be formed. After removing the silicon nitride layer, second conductivity type impurities for forming the collector layer are implanted to the second surface of the semiconductor substrate using the oxide layer as a mask. A support base is attached to a side of the semiconductor substrate where the oxide layer and the collector layer are formed. A thickness of the semiconductor substrate is reduced from the first surface in a state where the semiconductor substrate is attached with the support base. An element part including a base region, an emitter region, a plurality of trenches, a gate insulating layer, a gate electrode, and a first electrode is formed on the first surface of the semiconductor substrate after reducing the thickness of the semiconductor substrate.

In the method according to the fifth aspect, the collector layer and the first conductivity type layer are formed before forming the element part. Thus, an anneal treatment other than a laser anneal can be performed. In addition, because the support base is attached to the semiconductor substrate before forming the element part, the semiconductor substrate is not handled in a thin-film state.

In a method of manufacturing a semiconductor device according to a sixth aspect of the present invention, a semiconductor substrate of a first conductivity type is prepared. The semiconductor substrate has first and second surfaces opposing each other. A recess portion is formed at a portion of the second surface of the semiconductor substrate where a collector layer will be formed using a silicon nitride layer that has an opening at the portion where the collector layer will be formed as a mask. Second conductivity type impurities for forming the collector layer are implanted to the second surface of the semiconductor substrate using the silicon nitride layer as a mask. An oxide layer is formed by oxidizing a collector layer in a state where the silicon nitride layer covers a portion of the second surface of the semiconductor substrate where the first conductivity type layer will be formed. After removing the silicon nitride layer, first conductivity type impurities for forming the first conductivity type layer are implanted to the second surface of the semiconductor substrate using the oxide layer as a mask. A support base is attached to a side of the semiconductor substrate where the oxide layer and the first conductivity type layer are formed. A thickness of the semiconductor substrate is reduced from the first surface in a state where the semiconductor substrate is attached with the support base. An element part including a base region, an emitter region, a plurality of trenches, a gate insulating layer, a gate electrode, and a first electrode is formed on the first surface of the semiconductor substrate after reducing the thickness of the semiconductor substrate.

In the method according to the sixth aspect, the collector layer and the first conductivity type layer are formed before forming the element part. Thus, an anneal treatment other than a laser anneal can be performed. In addition, because the support base is attached to the semiconductor substrate before forming the element part, the semiconductor substrate is not handled in a thin-film state.

In a method of manufacturing a semiconductor device according to a seventh aspect of the present invention, a semiconductor substrate of a first conductivity type is prepared. The semiconductor substrate has first and second surfaces opposing each other. First conductivity type impurities for forming a first conductivity type layer are implanted to the second surface of semiconductor substrate using a mask that has an opening at a portion where the first conductivity type layer will be formed. An oxide layer is formed by enhanced-oxidizing the first conductivity type layer. Second conductivity type impurities for forming a collector layer are implanted to the second surface of the semiconductor substrate using the oxide layer as a mask. A support base is attached to a side of the semiconductor substrate where the oxide layer and the collector layer are formed. A thickness of the semiconductor substrate is reduced from the first surface in a state where the semiconductor substrate is attached with the support base. An element part including a base region, an emitter region, a plurality of trenches, a gate insulating layer, a gate electrode, and a first electrode is formed on the first surface of the semiconductor substrate after reducing the thickness of the semiconductor substrate.

In the method according to the seventh aspect, the collector layer and the first conductivity type layer are formed before forming the element part. Thus, an anneal treatment other than a laser anneal can be performed. In addition, because the support base is attached to the semiconductor substrate before forming the element part, the semiconductor substrate is not handled in a thin-film state.

In a method of manufacturing a semiconductor device according to a eighth aspect of the present invention, a semiconductor substrate of a first conductivity type is prepared. The semiconductor substrate has first and second surfaces opposing each other. Second conductivity type impurities for forming a collector type layer are implanted to the second surface of semiconductor substrate using a mask that has an opening at a portion where the collector layer will be formed. An oxide layer is formed by enhanced-oxidizing the collector layer. First conductivity type impurities for forming the first conductivity type layer are implanted to the second surface of the semiconductor substrate using the oxide layer as a mask. A support base is attached to a side of the semiconductor substrate where the oxide layer and the first conductivity type layer are formed. A thickness of the semiconductor substrate is reduced from the first surface in a state where the semiconductor substrate is attached with the support base. An element part including a base region, an emitter region, a plurality of trenches, a gate insulating layer, a gate electrode, and a first electrode is formed on the first surface of the semiconductor substrate after reducing the thickness of the semiconductor substrate.

In the method according to the eighth aspect, the collector layer and the first conductivity type layer are formed before forming the element part. Thus, an anneal treatment other than a laser anneal can be performed. In addition, because the support base is attached to the semiconductor substrate before forming the element part, the semiconductor substrate is not handled in a thin-film state.

A semiconductor device according to a ninth aspect of the present invention includes an IGBT forming region and a diode forming region. The semiconductor device includes a first conductivity type layer, a collector layer, a drift layer, a base region, a plurality of trenches, an emitter region, a gate insulating layer, a gate electrode, a first electrode, and a second electrode. The first conductivity type layer of a first conductivity type is disposed in the diode forming region. The collector layer of a second conductivity type is disposed in the IGBT forming region. The drift layer of the first conductivity type is disposed above the first conductivity type layer and the collector layer. The base region of the second conductivity type is disposed above the drift layer. The trenches penetrate the base region into the drift layer so as to divide the base region into a plurality of portions. The emitter region of the first conductivity type is disposed in one of the portions of the base region divided by the trenches and being in contact with a sidewall of one of the trenches. The gate insulating layer is disposed on a surface of the trenches. The gate electrode is disposed on the gate insulating layer in the trenches. The first electrode is electrically coupled with the base region and the emitter region. The second electrode is disposed on an opposite side of the collector layer from the drift layer. In the IGBT forming region, the collector layer, the drift layer, the base region, the emitter region, and the gate electrode provide an IGBT. In the diode forming region, the first conductivity type layer and the drift layer have a PN junction with the base region so as to provide the diode. The IGBT and the diode are integrated. The collector layer protrudes in an opposite direction from the drift layer with respect to the first conductivity type layer.

In the semiconductor device according to the ninth aspect, because the collector layer protrudes the opposite direction from the drift layer with respect to the first conductivity type layer, the drift layer in the IGBT forming region can have a thickness greater than the thickness of the drift layer in the diode forming region. Thus, a steady loss of the diode can be reduced.

A semiconductor device according to a tenth aspect of the present invention includes an IGBT forming region and a diode forming region. The semiconductor device includes a first conductivity type layer, a collector layer, a drift layer, a base region, a plurality of trenches, an emitter region, a gate insulating layer, a gate electrode, a first electrode, and a second electrode. The first conductivity type layer of a first conductivity type is disposed in the diode forming region. The collector layer of a second conductivity type is disposed in the IGBT forming region. The drift layer of the first conductivity type is disposed above the first conductivity type layer and the collector layer. The base region of the second conductivity type is disposed above the drift layer. The trenches penetrate the base region into the drift layer so as to divide the base region into a plurality of portions. The emitter region of the first conductivity type is disposed in one of the portions of the base region divided by the trenches and being in contact with a sidewall of one of the trenches. The gate insulating layer is disposed on a surface of the trenches. The gate electrode is disposed on the gate insulating layer in the trenches. The first electrode is electrically coupled with the base region and the emitter region. The second electrode is disposed on an opposite side of the collector layer from the drift layer. In the IGBT forming region, the collector layer, the drift layer, the base region, the emitter region, and the gate electrode provide an IGBT. In the diode forming region, the first conductivity type layer and the drift layer have a PN junction with the base region so as to provide the diode. The IGBT and the diode are integrated. The first conductivity type layer protrudes in an opposite direction from the drift layer with respect to the collector layer.

In the semiconductor device according to the tenth aspect, because the first conductivity type layer protrudes the opposite direction from the drift layer with respect to the collector layer, the drift layer in the diode forming region can have a thickness greater than the thickness of the drift layer in the IGBT forming region. Thus, a steady loss of the IGBT can be reduced.

In a method of manufacturing a semiconductor device according to an eleventh aspect of the present invention, a semiconductor substrate of a first conductivity type is prepared. The semiconductor substrate has first and second surfaces opposing each other. A collector layer and a first conductivity type layer are formed on the second surface of the semiconductor substrate. A support base is attached to a side of the semiconductor substrate where the collector layer and the first conductivity layer are formed. A thickness of the semiconductor substrate is reduced from the first surface in a state where the semiconductor substrate is attached with the support base. An element part including a base region, an emitter region, a plurality of trenches, a gate insulating layer, a gate electrode, and a first electrode is formed on the first surface of the semiconductor substrate after reducing the thickness of the semiconductor substrate. A heat sink substrate including a plurality of heat sinks is attached to the semiconductor substrate by bonding the heat sinks to the first electrode. After removing the support base from the semiconductor substrate, the heat sinks are divided into individual heat sinks. The semiconductor substrate is diced into a plurality of chips in a state where the individual heat sinks are attached to the semiconductor substrate.

In the method according to the eleventh aspect, the collector layer and the first conductivity type layer are formed before forming the element part. Thus, an anneal treatment other than a laser anneal can be performed. In addition, because the support base is attached to the semiconductor substrate before forming the element part, the semiconductor substrate is not handled in a thin-film state. Furthermore, because the heat sink substrate is attached to the semiconductor substrate before removing the support base, the semiconductor substrate is not handled in a thin-film state even after removing the support base.

BRIEF DESCRIPTION OF THE DRAWINGS

Additional objects and advantages of the present invention will be more readily apparent from the following detailed description of exemplary embodiments when taken together with the accompanying drawings. In the drawings:

FIG. 1 is a diagram illustrating a cross-sectional view of a semiconductor device according to a first embodiment of the present invention;

FIG. 21A to FIG. 21D are diagrams illustrating processes of manufacturing the semiconductor device according to the seventh embodiment;

FIG. 29A is diagram illustrating a plan view of the semiconductor device according to a tenth embodiment of the present invention, FIG. 29B is a diagram illustrating a side view of the semiconductor device, FIG. 29C is a diagram illustrating another side view of the semiconductor device, FIG. 29D is a diagram illustrating a cross-sectional view of the semiconductor device taken along line 29D-29D in FIG. 29A, and FIG. 29E is a diagram illustrating a cross-sectional view of the semiconductor device taken along line 29E-29E in FIG. 29A;

DETAILED DESCRIPTION OF THE EXEMPLARY EMBODIMENTS

First Embodiment

Figure 2A:
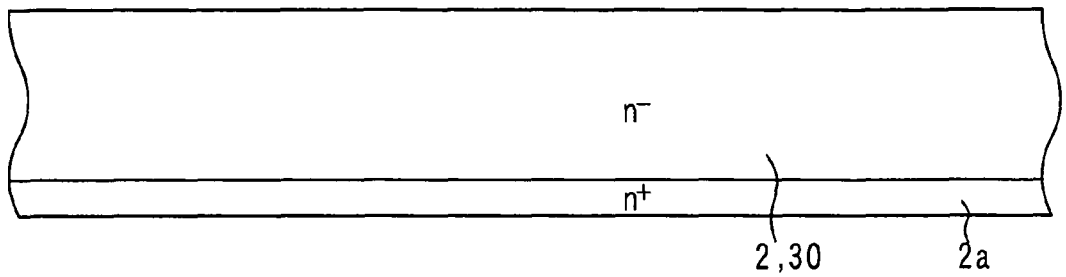
FIG. 2A to FIG. 2D are diagrams illustrating processes of manufacturing the semiconductor device according to the first embodiment.

A semiconductor device according to a first embodiment of the present invention will be described with reference to FIG. 1. In the semiconductor device, an IGBT and a diode are integrated.

The semiconductor device includes a cell section in which the IGBT is provided and an outer peripheral section surrounding a periphery of the cell section. The semiconductor device includes a P++ type collector layer 1a and an N++ type cathode layer (first conductivity type layer) 1b. On surfaces of the P++ type collector layer 1a and the N++ type cathode layer 1b, an FS layer (field stop layer) 2a having a high concentration N type impurity is disposed. On a surface of the FS layer 2a, an N− type drift layer 2 is disposed. The N− type drift layer 2 has an impurity concentration lower than the P++ type collector layer 1a, the N++ type cathode layer 1b, and the FS layer 2a.

The P++ type collector layer 1a includes, for example, boron, as P type impurities. The P++ type collector layer 1a has an impurity concentration of, from about $5 \times 10^{14}$ cm$^{-3}$ to about $5 \times 10^{15}$ cm$^{-3}$ (for example, about $1 \times 10^{15}$ cm$^{-3}$). The N++ type cathode layer 1b includes, for example, phosphorous, as N type impurities. The N++ type cathode layer 1b has an impurity concentration of, from about $1\times10^{15}$ cm$^{-3}$ to about $1\times10^{16}$ cm$^{-3}$ (for example, about $5\times10^{15}$ cm$^{-3}$). The FS layer 2a includes, for example, phosphorous, as N type impurities. The FS layer 2a has an impurity concentration of, from about $1\times10^{12}$ cm$^{-3}$ to about $1\times10^{14}$ cm$^{-3}$ (for example, about $5\times10^{13}$ cm$^{-3}$). The impurity concentration of the N− type drift layer 2 is set so that a specific resistance is from about 40 Ω·cm to about 70 Ω·cm (for example, about 55 Ω·cm). The FS layer 2a can be omitted. The FS layer 2a is provided for improving a breakdown voltage and a steady loss by restricting diffusion of a depletion layer and for controlling the amount of holes implanted from a rear-surface side of a substrate.

In the cell section, a P type base region 3 is disposed at a surface portion of the N− type drift layer 2. The P type base region 3 has a thickness of about 4 μm. The P type base region 3 has a predetermined impurity concentration. For example, the P type base region has an impurity concentration of about $1\times10^{14}$ cm$^{-3}$. In an IGBT forming region in the cell section, a plurality of trenches 4 penetrates the P type base region 3 into the N− type drift layer 2. The trenches 4 divide the P type base region 3 into a plurality of portions. The trenches 4 are provided at predetermined intervals. The trenches 4 may extend in one direction and may be arranged in parallel to each other in a stripe structure. The trenches 4 may also be arranged in a ring structure. When the trenches 4 are arranged in the ring structures, a group of few trenches 4 configurates one multiple ring structure, and a longitudinal direction of the one multiple ring structure is parallel to a longitudinal direction of adjacent multiple ring structure.

The P type base region 3 is divided by the trenches 4 into a plurality of portions. At least some portions of the P type base region 3 become channel P layers 3a for providing channel regions. At a surface portion of each of the channel P layer 3a, N+ type emitter regions 5 are disposed. Each of the N+ type emitter regions 5 is shallower than the channel P layer 3a. Each of the N+ type emitter regions 5 has a predetermined impurity concentration. For example, each of the N+ type emitter regions 5 has an impurity concentration of about $2\times10^{14}$ cm$^{-3}$. In an example illustrated in FIG. 1, each of the divided portions of the P type base region 3 becomes the channel P layer 3a. A part of divided portions of the P type base region 3 may also become a floating layer in which the N+ type emitter region 5 is not disposed.

Each of the N+ type emitter regions 5 has an impurity concentration higher than the N− type drift layer 2. Each of the N+ type emitter regions 5 terminates in the P type base region 3 and is in contact with a sidewall of one of the trenches 4. Each of the N+ type emitter regions 5 extends in the longitudinal direction of the one of the trenches 4 and terminates inside an end of the one of the trenches 4.

In each of the trenches 4, a gate insulating layer 6 is disposed so as to cover an inner wall of each of the trenches 4. On a surface of the gate insulating layer 6, a gate electrode 7 is disposed so as to fill each of the trenches 4. The gate electrode 7 is made of, for example, doped polysilicon.

The gate electrodes 7 in the trenches 4 are electrically coupled with each other in a cross section different from a cross section illustrated in FIG. 1. The gate electrodes 7 are coupled with a doped polysilicon layer 9 disposed on an insulating layer 8. On a surface of the doped polysilicon layer 9, an interlayer insulating layer 10 is disposed. The interlayer insulating layer 10 has contact holes 10a, 10b, and 10c. The doped polysilicon layer 9 is electrically coupled with a gate wire 11 through the contact hole 10a. The gate wire 11 is applied with a gate voltage.

The N+ type emitter regions 5 and the channel P layers 3a are electrically coupled with an upper electrode 12 through the contact holes 10b provided in the interlayer insulating layer 10. The upper electrode 12 and the gate wire 11 are electrically separated, for example, by a protective layer 13. On a rear-surface side of the P++ type collector layer 1a, a lower electrode 14 is disposed. The IGBT has the above-described configuration.

In a diode forming region in the cell section, the trench 4 is not provided at a portion corresponding to the N++ type cathode layer 1b. The P type base region 3 can operate as an anode, and the N+ type FS layer 2a and the N++ type cathode layer 1b can operate as a cathode, and thereby a diode is provided by a PN junction. The P type base region 3 that can operate as the anode of the diode is electrically coupled with the upper electrode 12. The N++ type cathode layer 1b that can operate as a part of the cathode is electrically coupled with the lower electrode 14.

An emitter and the anode are electrically coupled with each other and a collector and the cathode are electrically coupled with each other. Thus, the IGBT and the diode are coupled in parallel in one chip.

In the outer peripheral section, at a surface portion of the N− type drift layer 2, a P type diffusion layer 20 is disposed so as to surround the periphery of the cell section. The P type diffusion layer 20 is deeper than the P type base region 3. In addition, P type guard ring layers 21 having a multiple ring structures are disposed so as to surround an outer periphery of the P type diffusion layer 20. Each of the P type guard ring layers 21 is electrically coupled with one of an outer peripheral electrodes 22 through the contact hole 10c provided in the interlayer insulating layer 10. The outer peripheral electrodes 22 are disposed so as to correspond to the P type guard ring layers 21. The outer peripheral electrodes 22 are electrically separated from each other. The outer peripheral electrodes 22 have a multiple ring structure in a manner similar to the P type guard ring layers 21.

In the semiconductor device according to the present embodiment, the IGBT and the diode are integrated in the above-described manner. A manufacturing method of the semiconductor device according to the present embodiment will be described with reference to FIG. 2A to FIG. 4D.

During a process illustrated in FIG. 2A, an N type semiconductor substrate 30 is prepared. The N type semiconductor substrate 30 has a thickness of greater than or equal to about 200 μm and is does not warp. The N type semiconductor substrate 30 is, for example, an FZ substrate. N type impurities are implanted on a rear surface of the N type semiconductor substrate 30, and the N type semiconductor substrate 30 is treated with an anneal treatment. Accordingly, the N+ type FS layer 2a having a depth from about 1.0 μm to about 2.0 μm is formed at a rear-surface portion of the N type semiconductor substrate 30. A portion of the N type semiconductor substrate 30 other than the FS layer 2a becomes the N− type drift layer 2.

Figure 2B:
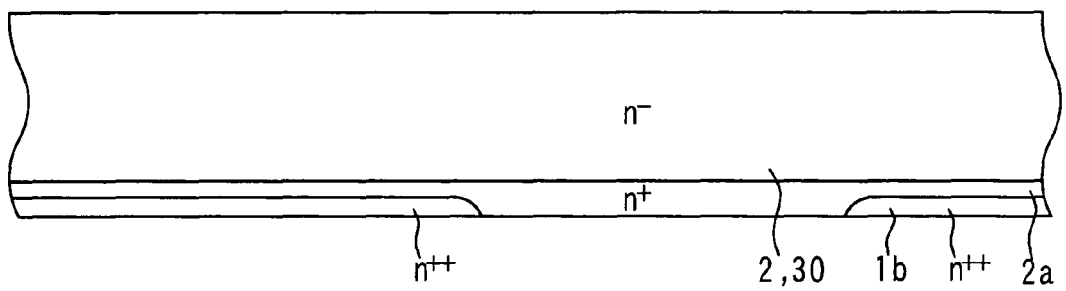

During a process illustrated in FIG. 2B, a mask is disposed on the FS layer 2a. The mask has openings at portions where the N++ type cathode layers 1b are formed. The N type impurities are implanted through the openings, and an anneal treatment is performed. Accordingly, the N++ type cathode layer 1b having a depth of, for example, about 0.5 μm is formed.

Figure 2C:
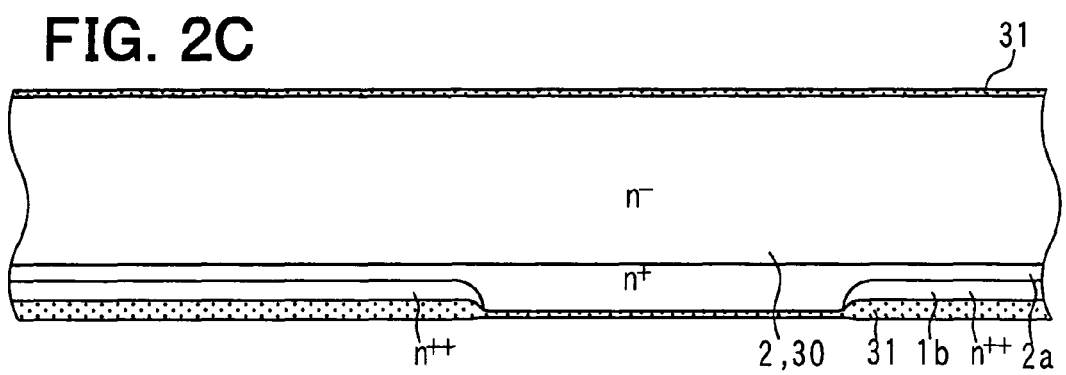

During a process illustrated in FIG. 2C, a thermal oxidation is performed, and thereby an oxide layer 31 is formed. During the thermal oxidation, the N++ type cathode layer 1b including a high concentration of the N type impurity is enhanced-oxidized. Thus, at the N++ type cathode layer 1b, a thickness of the oxide layer 31 is greater than other region. At a boundary portion between the FS layer 2a and the N++ type cathode layer 1b, the oxide layer 31 has a rounded stepped portion having a bird beak shape.

A portion of the oxide layer 31 formed on the FS layer 2a is removed as needed, for example, by etching. In a case where phosphorous is used as the N type impurities in the FS layer 2a and arsenic is used as the N type impurities in the N++ type cathode layer 1b, because arsenic is more likely enhanced-oxidized than phosphorous is, the thickness of the portion of the oxide layer 31 formed on the FS layer 2a is sufficiently less than the portion of the oxide layer 31 formed on the N++ type cathode layer 1b. In such a case, the portion of the oxide layer 31 formed on the FS layer 2a is not required to be removed.

Figure 2D:
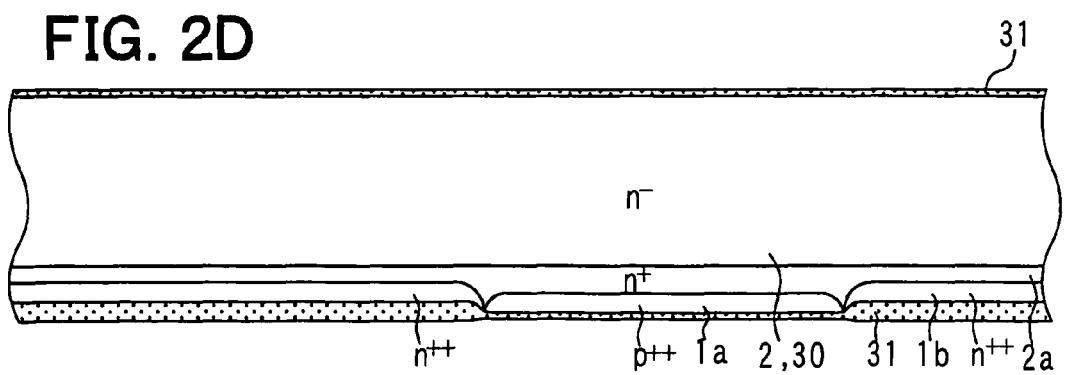

During a process illustrated in FIG. 2D, P type impurities are implanted using the oxide layer 31 as a mask and an anneal treatment is performed. Accordingly the P++ type collector layer 1a having a depth of, for example, about 0.3 μm is formed. The P++ type collector layer 1a is formed at a portion where the oxide layer 31 is removed or a portion where the thickness of the oxide layer 31 is less than other portion. Thus, the P++ type collector layer 1a is self-aligned with respect to the N++ type cathode layer 1b. Therefore, the P++ type collector layer 1a and the N++ type cathode layer 1b can be formed at predetermined positions with certainty. The N++ type cathode layer 1b is recessed and the boundary between the FS layer 2a and the N++ type cathode layer 1b is roundly oxidized by the thermal oxidation during the process illustrated in FIG. 2C. Thus, the P++ type collector layer 1a smoothly protrudes in an opposite direction from the FS layer 2a and the N− type drift layer 2 with respect to the N++ type cathode layer 1b.

Figure 3A:
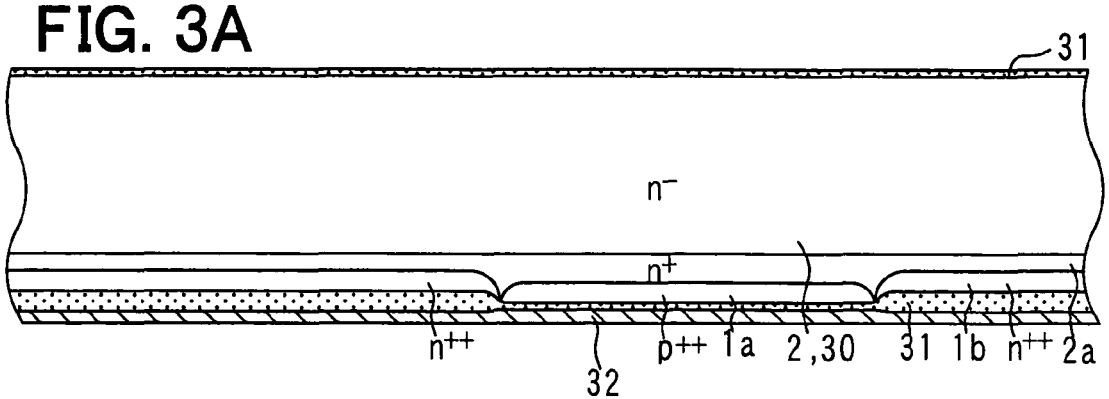
FIG. 3A to FIG. 3D are diagrams illustrating processes of manufacturing the semiconductor device according to the first embodiment.

During a process illustrated in FIG. 3A, a bonding layer 32 made of polysilicon or silicon oxide is formed on the rear-surface side of the N type semiconductor substrate 30, that is, on a surface of the oxide layer 31 formed on the N++ type cathode layer 1b and the P++ type collector layer 1a.

Figure 3B:
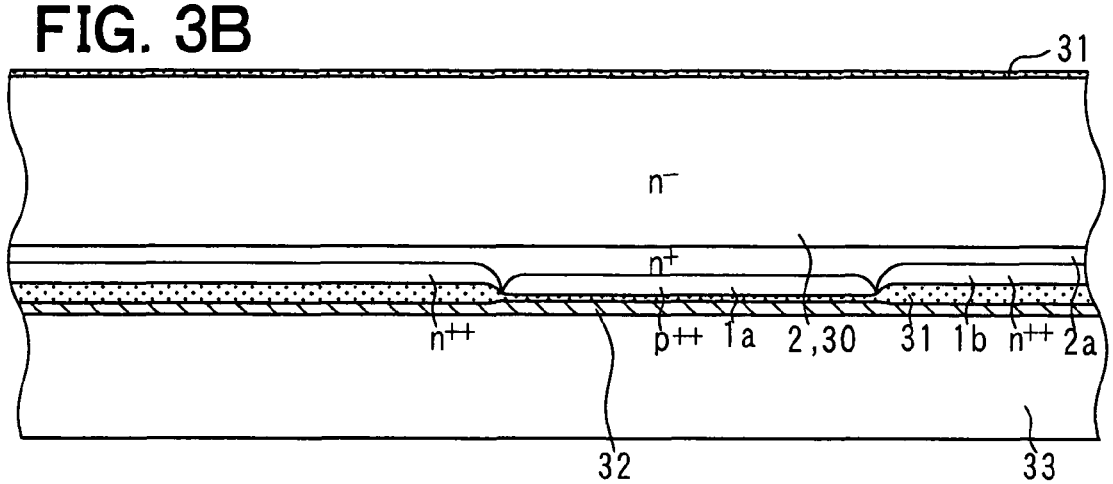

During a process illustrated in FIG. 3B, the support base 33 made of, for example, silicon, is bonded on the rear-surface side of the N type semiconductor substrate 30 through the bonding layer 32. In the present embodiment, the support base 33 is bonded on the rear-surface side of the N type semiconductor substrate 30. Alternatively, the support base 33 may be disposed on the rear-surface side of the N type semiconductor substrate 30, for example, by depositing silicon on a surface of the bonding layer 32 with a chemical vapor deposition (CVD) method or by epitaxially growing silicon on the surface of the bonding layer 32. The support base 33 may be made of other material.

Figure 3C:
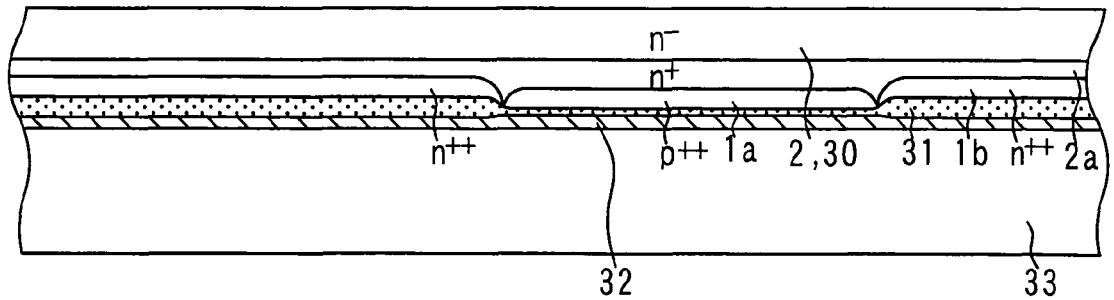

During a process illustrated in FIG. 3C, a thickness of the N type semiconductor substrate 30 is reduced by grinding or etching from the main surface of the N type semiconductor substrate 30. Accordingly, the N type semiconductor substrate 30 provides the N− type drift layer 2 having a predetermined thickness.

Figure 3D:
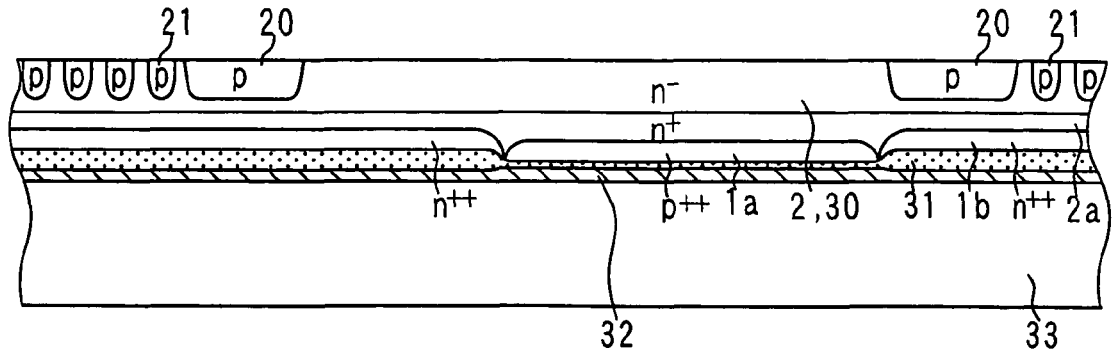

During a process illustrated in FIG. 3D, the P type diffusion layers 20, the P type guard ring layers 21, and the P type base region 3 are formed at the surface portion of the N− type drift layer 2. When the P type diffusion layers 20, the P type guard ring layers 21, and the P type base region 3 are formed, the oxide layer 31 is disposed on the surface of the N++ type cathode layer 1b on the rear surface of the N type semiconductor substrate 30. Thus, the P type impurities for forming the P type diffusion layers 20, the P type guard ring layers, and the P type base region 3 can be implanted by using the oxide layer 31 as a target with an infrared ray. Therefore, an additional process for forming an alignment target on the main surface of the N type semiconductor substrate 30 is not required.

Figure 4A:
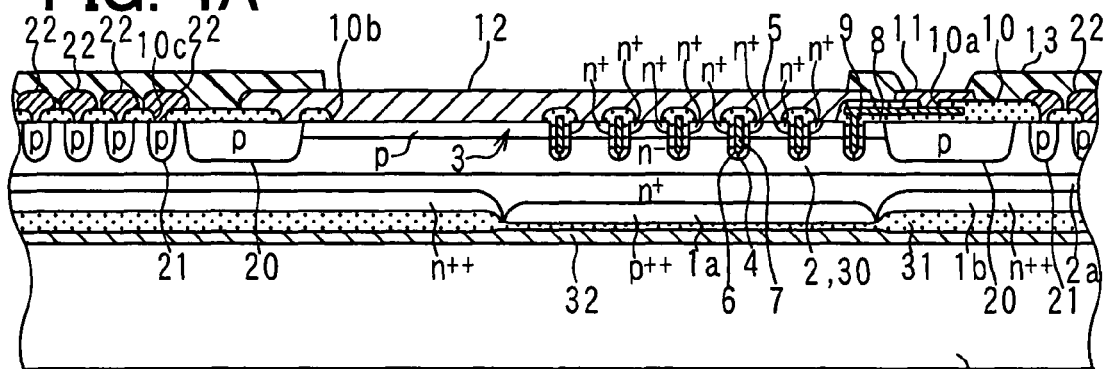
FIG. 4A to FIG. 4D are diagrams illustrating processes of manufacturing the semiconductor device according to the first embodiment.

During a process illustrated in FIG. 4A, an element part including the trenches 4, the N+ type emitter regions 5, the gate insulating layers 6, the gate electrodes 7, the insulating layers 8, the doped polysilicon layer 9, the interlayer insulating layer 10, the gate wire 11, the upper electrode 12 and the protective layer 13 is formed in the IGBT forming region and the diode forming region by a known method. In the outer peripheral section, the outer peripheral electrodes 22 and the protective layer 13 are formed.

Figure 4B:
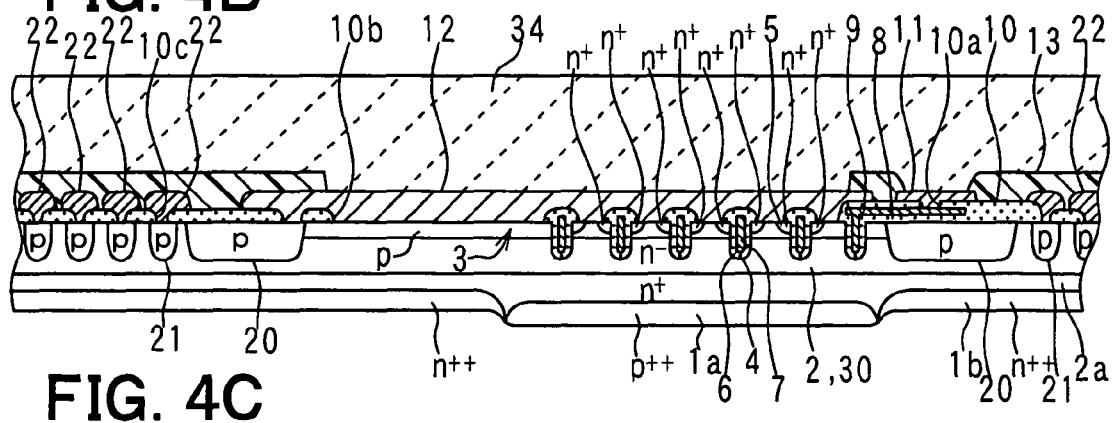

During a process illustrated in FIG. 4B, a support member 34 is attached on surfaces of the upper electrode 12 and the protective layer 13 at the main-surface side of the N type semiconductor substrate 30. The support member 34 may be a support base or a tape, for example. At the rear-surface side of the N type semiconductor substrate 30, the P++ type collector layer 1a and the N++ type cathode layer 1b are exposed by removing the support base 33 and the bonding layer 32. During the above-described process, the support member 34 is attached on the main-surface side of the N type semiconductor substrate 30. Thus, the N type semiconductor substrate 30 is not handled in a thin-film state.

The support base 33 and the bonding layer 32 may be removed, for example, by grinding or wet etching. In a case where the support base 33 and the bonding layer 32 are removed by wet etching, the wet etching is automatically stopped when the bonding layer 32 made of polysilicon layer appears. Then, polysilicon and silicon oxide are selectively etched so that the support base 33 and the bonding layer 32 are removed with a high degree of accuracy. The support base 33 and the bonding layer 32 may also be removed, for example, a slice cutting method, a smart cutting method, an epitaxial layer transfer (ELTRAN) method, or a laser lift off method.

Figure 4C:
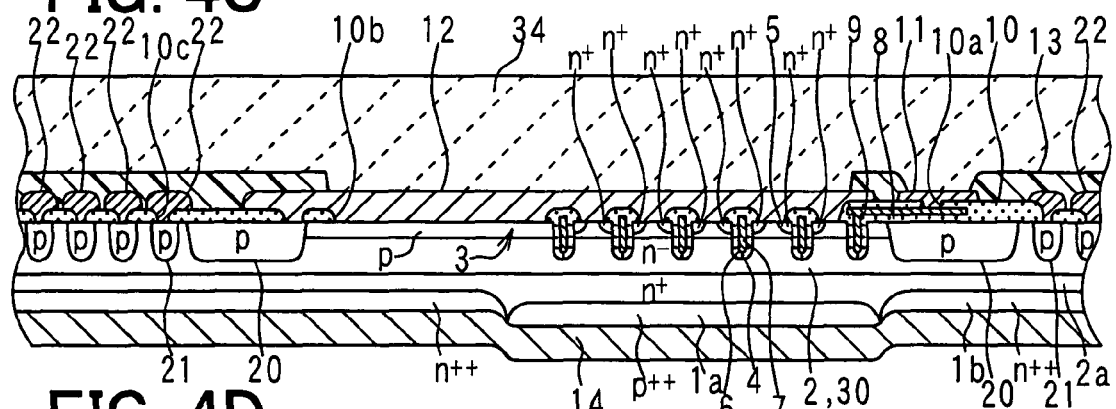

During a process illustrated in FIG. 4C, the lower electrode 14 is formed on the surface of the P++ type collector layer 1a and the surface of the N++ type cathode layer 1b. The lower electrode 14 is formed, for example, by depositing aluminum. Due to the stepped portion between the P++ type collector layer 1a and the N++ type cathode layer 1b, a stepped portion is provided at a surface portion of lower electrode 14. Because the stepped portion between the P++ type collector layer 1a and the N++ type cathode layer 1b has the rounded shape, the stepped portion provided at the surface portion of the lower electrode 14 has a rounded shape. Furthermore, because the stepped portion provided between the P++ type collector layer 1a and the N++ type cathode layer 1b has the rounded shape, the lower electrode 14 can be formed on the stepped portion without an insufficient metal growth and a metal crack.

Figure 4D:
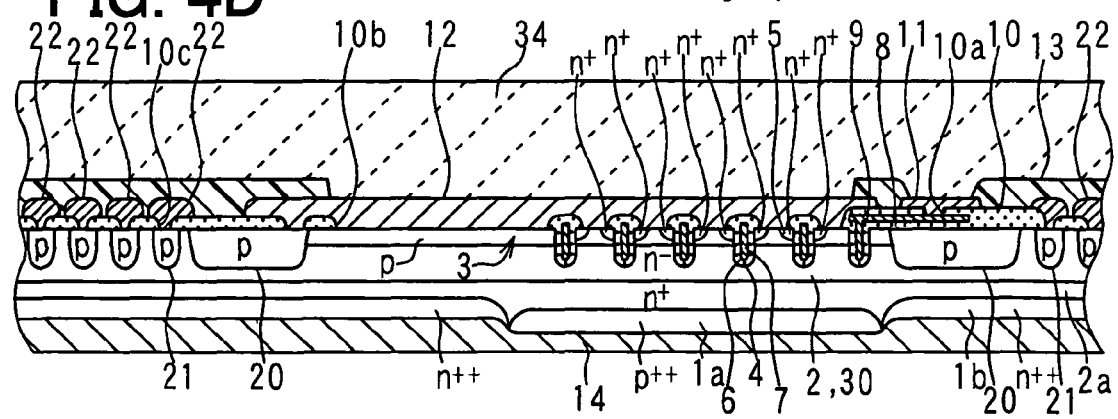

During a process illustrated in FIG. 4D, the surface of the lower electrode 14 is planarized. Because the stepped portion provided at the surface portion of the lower electrode 14 has the rounded shape, a planarization process of the surface of the lower electrode 14 is not always required. If the planarization process is performed, the lower electrode 14 can be mounted without being influenced by the stepped portion. Thus, in the present example, the surface of the lower electrode 14 is planarized. The planarization process may be performed, for example, by chemical mechanical polishing (CMP).

Finally, the support member 34 is removed, and thereby the semiconductor device illustrated in FIG. 1 in which the IGBT and the diode are integrated is formed. If a dicing process is performed in a state where a dicing tape is attached on the lower electrode 14 on the rear-surface side of the N type semiconductor substrate 30, the N type semiconductor substrate 30 is not handled in a thin-film state during the dicing process.

In the above-described way, the semiconductor device illustrated in FIG. 1 in which the IGBT and the diode are integrated is completed.

In the manufacturing method according to the present embodiment, the FS layer 2a, the P++ type collector layer 1a and the N++ type cathode layer 1b are formed before forming the MOS device. Thus, an anneal treatment other than a laser anneal can be performed. In addition, since the support base 33 is bonded before forming the MOS device, the N type semiconductor substrate 30 is not handled in a thin-film state.

Furthermore, in the manufacturing method according to the present embodiment, the P++ type collector layer 1a is self-aligned with respect to the N++ type cathode layer 1b. Thus, a misalignment of the P++ type collector layer 1a of the IGBT and the N++ type cathode layer 1b can be restricted.

In the semiconductor device according to the present embodiment, the P++ type collector layer 1a smoothly protrudes in the opposite direction from the FS layer 2a and the N− type drift layer 2 with respect to the N++ type cathode layer 1b. Thus, the following effects can be obtained.

An IGBT in a semiconductor device has a curvature junction due to a trench gate. Thus, a breakdown voltage of the IGBT is lower than a diode. Thus, in a conventional semiconductor device in which an IGBT and a diode are integrated and a rear surface is flat, a thickness of an N− type drift layer or an FS layer is increased in view of a breakdown voltage of the IGBT. Thus, a steady loss of the diode is sacrificed.

In the semiconductor device according to the present embodiment, the P++ type collector layer 1a smoothly protrudes in the opposite direction of the FS layer 2a and the N− type drift layer 2 with respect to the N++ type cathode layer 1b. Thus, the thickness of the FS layer 2a can be increased only in the IGBT having a breakdown voltage smaller than the diode, and thereby the steady loss of the diode is not sacrificed.

Second Embodiment

A manufacturing method of a semiconductor device according to a second embodiment of the present invention will be described with reference to FIG. 5A to FIG. 7D.

Figure 5A:
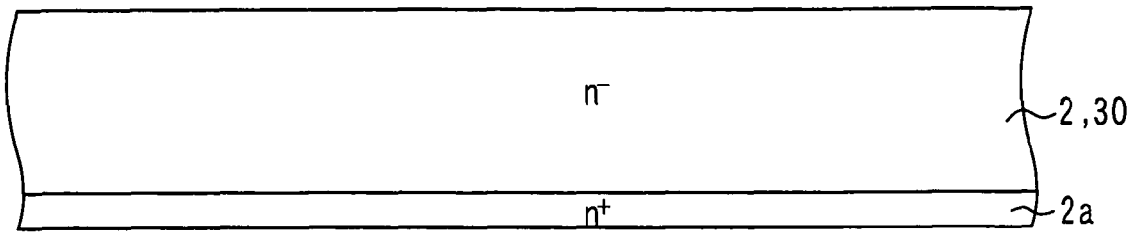
FIG. 5A to FIG. 5E are diagrams illustrating processes of manufacturing a semiconductor device according to a second embodiment of the present invention.
Figure 5B:
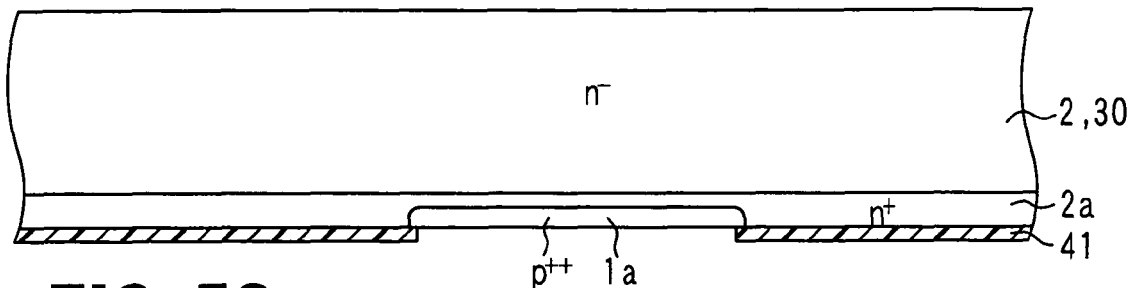

During a process illustrated in FIG. 5A, the FS layer 2a is formed on the rear surface of the N type semiconductor substrate 30 in a manner similar to the process illustrated in FIG. 2A. During a process illustrated in FIG. 5B, a silicon nitride layer 41 is formed on a surface of the FS layer 2a. The silicon nitride layer 41 is pattern-formed by a photolithography process so that a portion where the P++ type collector layer 1a will be formed opens. In order to restrict a channeling during the subsequent processes, a silicon oxide layer of about 500 Å may be formed before forming the silicon nitride layer 41. The P type impurities are implanted using the silicon nitride layer 41 as a mask, and an anneal treatment is performed so as to form the P++ type collector layer 1a.

Figure 5C:
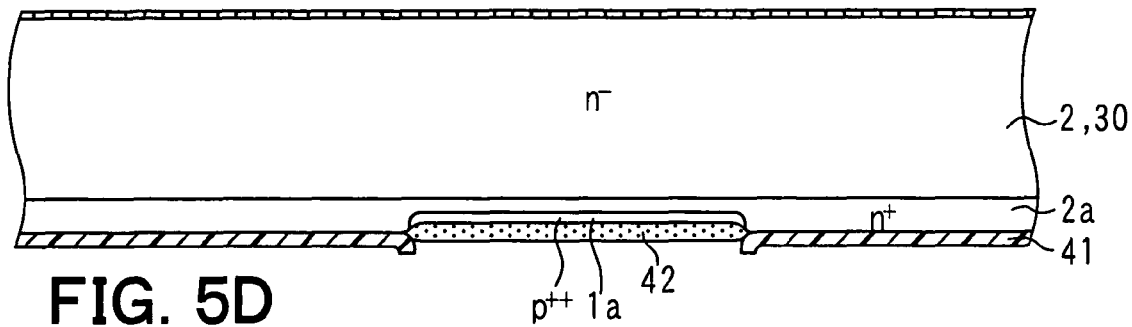

During a process illustrated in FIG. 5C, a thermal oxidation process is performed using the silicon nitride layer 41 as a mask. Accordingly, an oxide layer 42 is formed only on a surface of the P++ type collector layer 1a on which the silicon nitride layer 41 is not disposed. Also during the present process, a surface of the P++ type collector layer 1a is enhanced-oxidized. However, the enhanced-oxidation is not pronounced as a case where arsenic is implanted. Thus, by performing the thermal oxidation process while covering with the silicon nitride layer 41, the thickness of the oxide layer 42 formed on the surface of the P++ type collector layer 42 can be increased and the other region can be restricted from being oxidized. By the thermal oxidation process, a stepped portion provided at a boundary portion between the surface of the P++ type collector layer 1a and the surface of the FS layer 2a, which provides the N++ type cathode layer 1b during the subsequent process, is rounded.

Figure 5D:
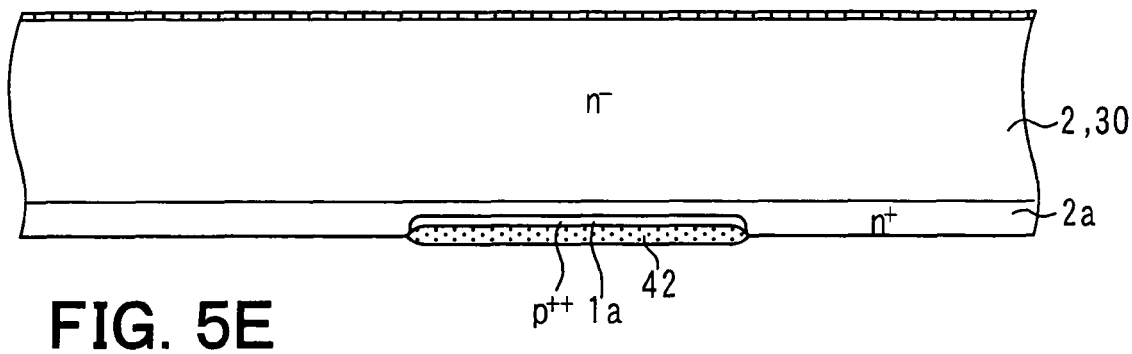
Figure 5E:
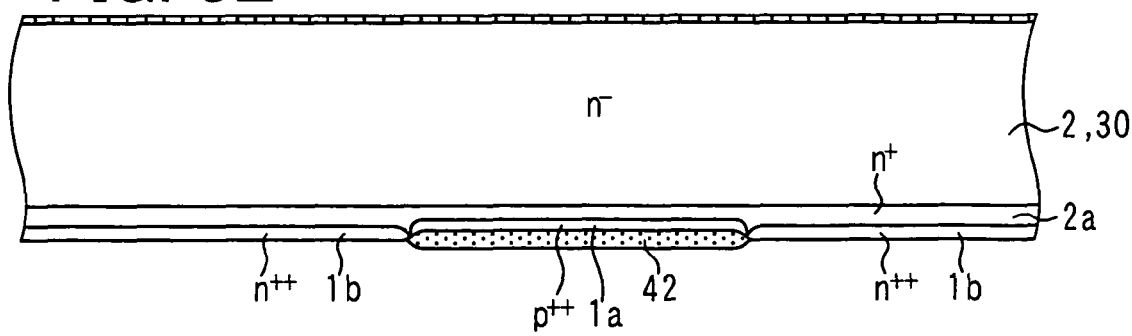

During a process illustrated in FIG. 5D, the silicon nitride layer 41 is removed. During a process illustrated in FIG. 5E, the N type impurities are implanted using the oxide layer 42 as a mask, and an anneal treatment is performed so as to form the N++ type cathode layer 1b. The N++ type cathode layer 1b is formed at a region where the oxide layer 42 is not disposed. Thus, the N++ type cathode layer 1b is self-aligned with respect to the P++ type collector layer 1a. Thus, a misalignment of the P++ type collector layer 1a and the N++ type cathode layer 1b can be restricted. The P++ type collector layer 1a is recessed by the oxidation process illustrated in FIG. 5C, and a boundary portion between the FS layer 2a and the P++ type collector layer 1a is roundly oxidized. Thus, the N++ type cathode layer 1b smoothly protrudes in an opposite direction from the FS layer 2a and the N− type drift layer 2 with respect to the P++ type collector layer 1a.

Figure 6A:
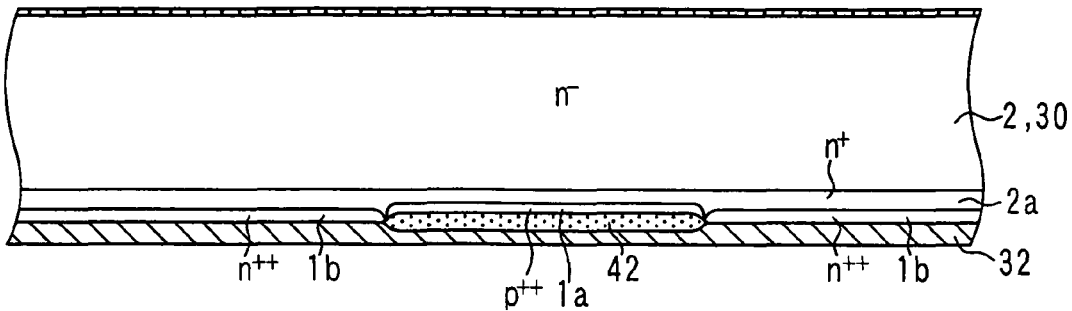
FIG. 6A to FIG. 6D are diagrams illustrating processes of manufacturing the semiconductor device according to the second embodiment.
Figure 6B:
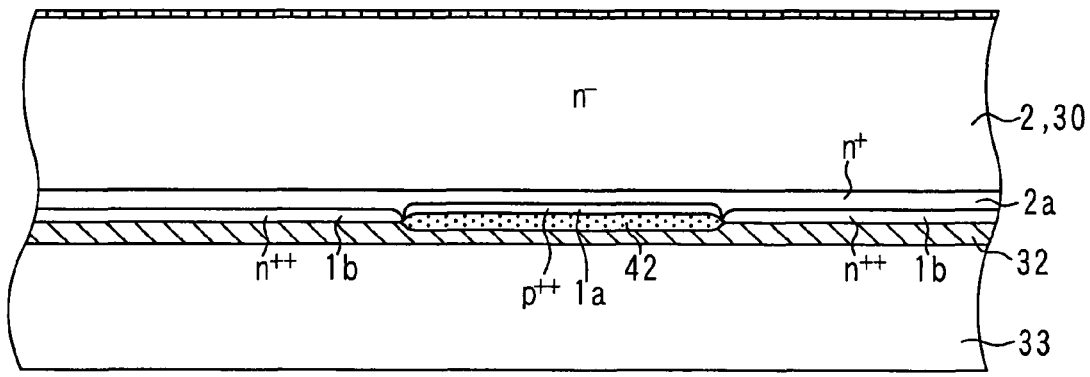

During a process illustrated in FIG. 6A, the bonding layer 32 made of polysilicon or silicon oxide is formed on the rear-surface side of the N type semiconductor substrate 30, that is, on a surface of the oxide layer 31 formed on the N++ type cathode layer 1b and the P++ type collector layer 1a. During a process illustrated in FIG. 6B, the support base 33 made of, for example, silicon, is bonded on the rear-surface side of the N type semiconductor substrate 30 through the bonding layer 32.

Figure 6C:
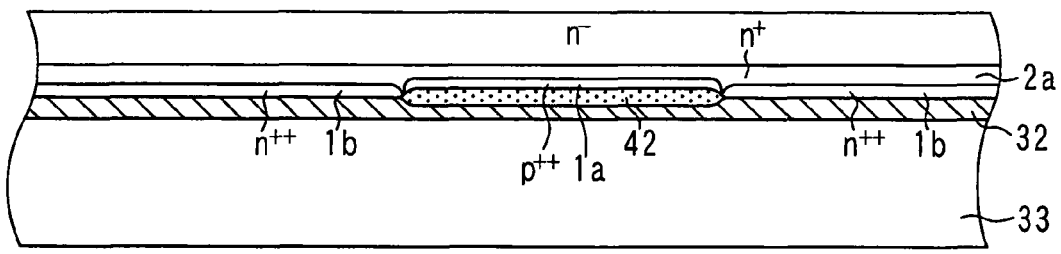
Figure 6D:
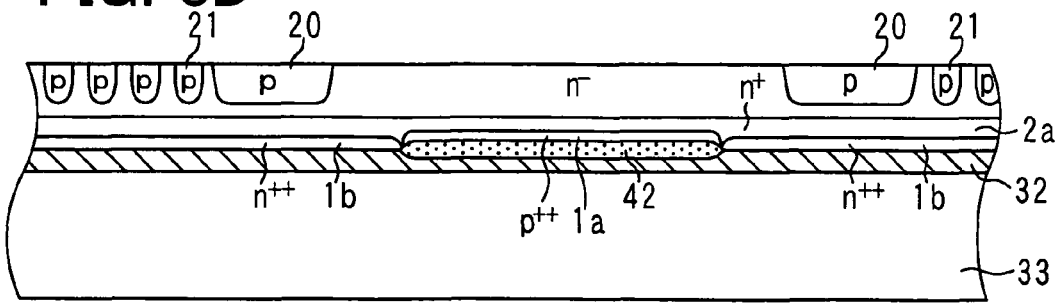

During a process illustrated in FIG. 6C, the thickness of the N type semiconductor substrate 30 is reduced by grinding or etching from the main surface, and thereby the N− type drift layer 2 is provided. During a process illustrated in FIG. 6D, the P type diffusion layers 20, the P type guard ring layers 21, and the P type base region 3 are formed at the surface portion of the N− type drift layer 2. When the P type diffusion layers 20, the P type guard ring layers 21, and the P type base region 3 are formed, the oxide layer 31 is disposed on the surface of the N++ type cathode layer 1b on the rear-surface side of the N type semiconductor substrate 30. Thus, the P type impurities for forming the P type diffusion layers 20, the P type guard ring layers, and the P type base region 3 can be implanted by using the oxide layer 31 as a target with an infrared ray. Therefore, an additional process for forming an alignment target on the main surface of the N type semiconductor substrate 30 is not required.

Figure 7A:
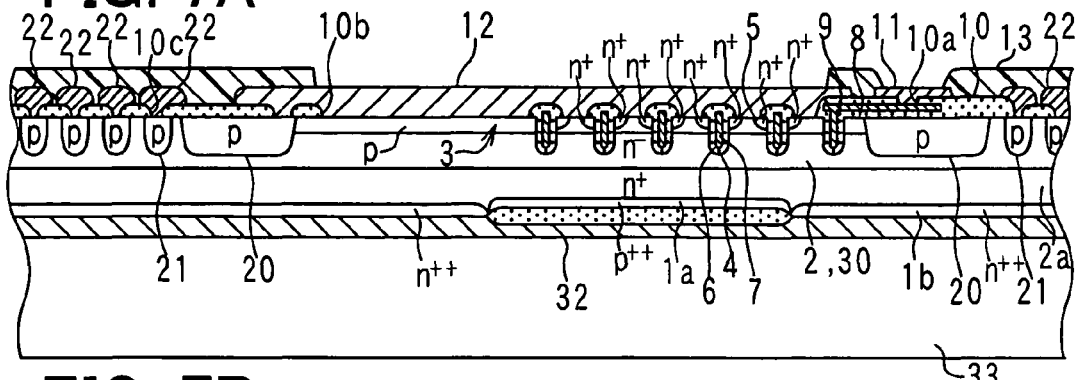
FIG. 7A to FIG. 7D are diagrams illustrating processes of manufacturing the semiconductor device according to the second embodiment.
Figure 7B:
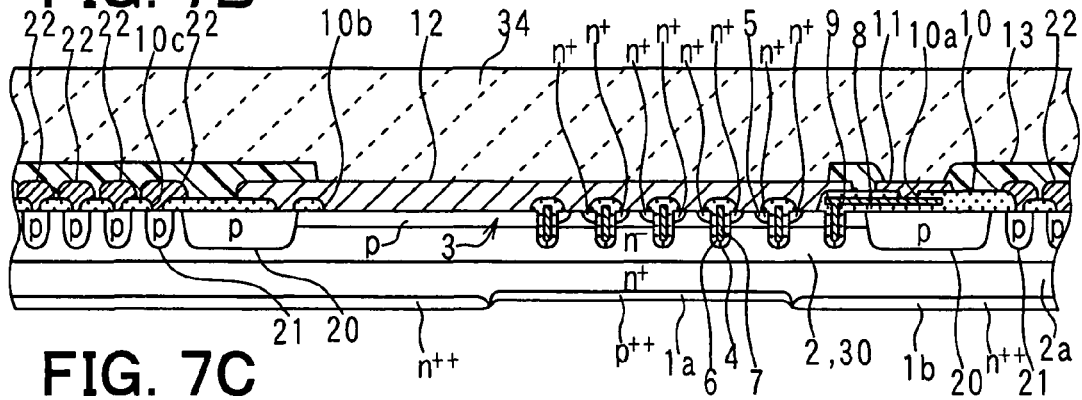

During a process illustrated in FIG. 7A, the element part including the trenches 4, the N+ type emitter regions 5, the gate insulating layers 6, the gate electrodes 7, the insulating layers 8, the doped polysilicon layer 9, the interlayer insulating layer 10, the gate wire 11, the upper electrode 12 and the protective layer 13 is formed in the IGBT forming region and the diode forming region by a known method. In the outer peripheral section, the outer peripheral electrodes 22 and the protective layer 13 are formed. During a process illustrated in FIG. 7B, the support member 34 is attached on surfaces of the upper electrode 12 and the protective layer 13 at the main-surface side of the N type semiconductor substrate 30. The support member 34 may be a support base or a tape, for example. At the rear-surface side of the N type semiconductor substrate 30, the P++ type collector layer 1a and the N++ type cathode layer 1b are exposed by removing the support base 33 and the bonding layer 32. During the above-described process, the support member 34 is attached on the main-surface side of the N type semiconductor substrate 30. Thus, the N type semiconductor substrate 30 is not handled in a thin-film state. The above-described process may be performed by any method in a manner similar to the process illustrated in FIG. 4B.

Figure 7C:
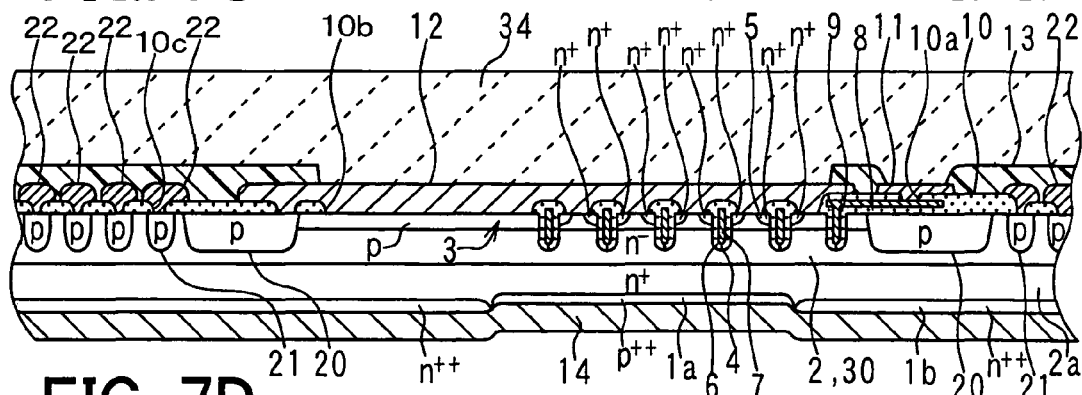

During a process illustrated in FIG. 7C, the lower electrode 14 is formed on the surface of the P++ type collector layer 1a and the surface of the N++ type cathode layer 1b. The stepped portion between the P++ type collector layer 1a and the N++ type cathode layer 1b has the rounded shape due to a local oxidation of silicon. Thus, the stepped portion at the surface portion of the lower electrode 14 also has a rounded shape. Furthermore, because the stepped portion provided between the P++ type collector layer 1a and the N++ type cathode layer 1b has the rounded shape, the lower electrode 14 can be formed on the stepped portion without an insufficient metal growth and a metal crack.

Figure 7D:
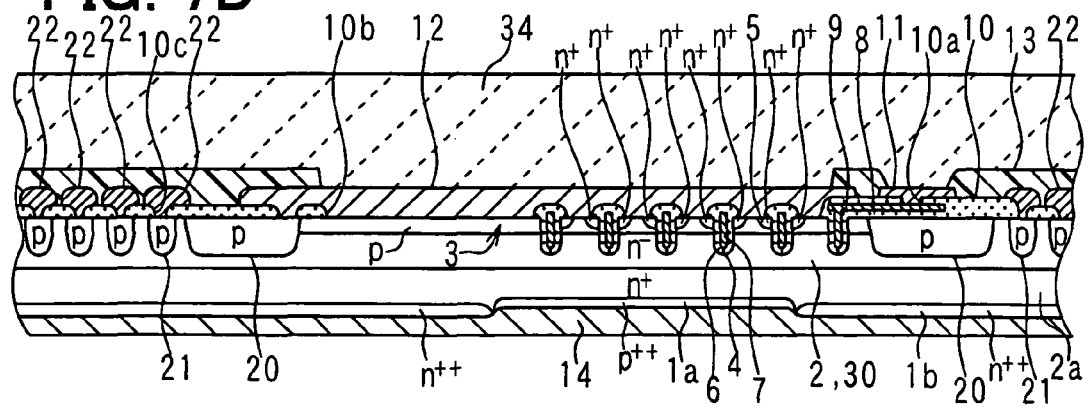

During a process illustrated in FIG. 7D, the surface of the lower electrode 14 is planarized, for example, by CMP. Because the stepped portion at the surface portion of the lower electrode 14 has the rounded shape, the planarization is not always required. If the planarization process is performed, the lower electrode 14 can be mounted without being influenced by the stepped portion. Thus, the lower electrode 14 can be mounted with certainty.

Finally, the support member 34 is removed. If a dicing process is performed in a state where a dicing tape is attached on the lower electrode 14 on the rear-surface side of the N type semiconductor substrate 30, the N type semiconductor substrate 30 is not handled in a thin-film state during the dicing process.

Figure 8:
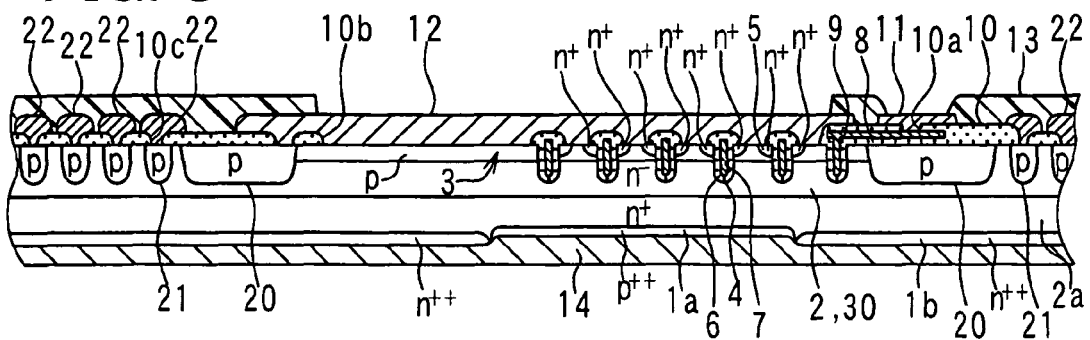
FIG. 8 is a diagram illustrating a cross-sectional view of the semiconductor device according to the second embodiment.

In the above-described way, the semiconductor device illustrated in FIG. 8 in which the IGBT and the diode are integrated is completed. The semiconductor device according to the present embodiment has a configuration substantially similar to the semiconductor device according to the first embodiment. However, in the semiconductor device according to the present embodiment, the N++ type cathode layer 1b smoothly protrudes in the opposite direction from the FS layer 2a and the N− type drift layer 2 with respect to the P++ type collector layer 1a.

As described above, the P++ type collector layer 1a may be formed before forming the N++ type cathode layer 1b, the oxide layer 42 may be formed by oxidizing the P++ type collector layer 1a, and the N++ type cathode layer 1b may be formed using the oxide layer 42 as the mask.

In the semiconductor device according to the present embodiment, the N++ type cathode layer 1b smoothly protrudes in the opposite direction from the FS layer 2a and the N− type drift layer 2 with respect to the P++ type collector layer 1a. Thus, the following effects can be obtained.

In order to reduce a steady loss, the thickness of the N− type drift layer 2 or the FS layer 2a is reduced within a range of securing a breakdown voltage of an element. A recovery surge voltage of the diode may be dominative depending on a use of the semiconductor device. In order to reduce the recovery surge voltage, the thickness of the N− type drift layer 2 and the FS layer 2a of the diode is required to be increased so that minor carriers are located on a cathode side of the N− type drift layer 2 and the FS layer 2a at a recovery as much as possible.

In the semiconductor device according to the present embodiment, the N++ type cathode layer 1b smoothly protrudes in the opposite direction from the FS layer 2a and the N− type drift layer 2 with respect to the P++ type collector layer 1a, and thereby the thickness of the FS layer 2a can be increased only in the diode. Thus, a loss property of the diode can be secured without sacrificing the steady loss of the IGBT.

Third Embodiment

A manufacturing method of a semiconductor device according to a third embodiment of the present invention will be described with reference to FIG. 9A to FIG. 11D.

Figure 9A:
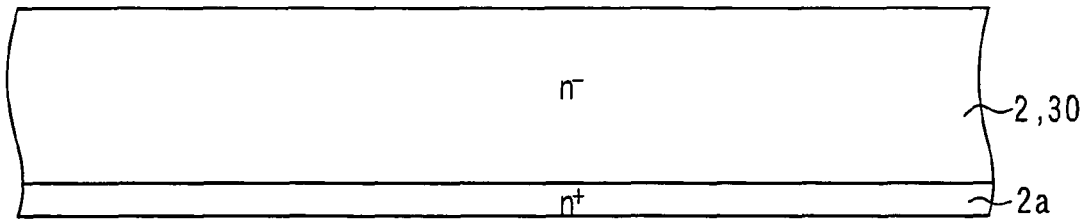
FIG. 9A to FIG. 9D are diagrams illustrating processes of manufacturing a semiconductor device according to a third embodiment of the present invention.
Figure 9B:
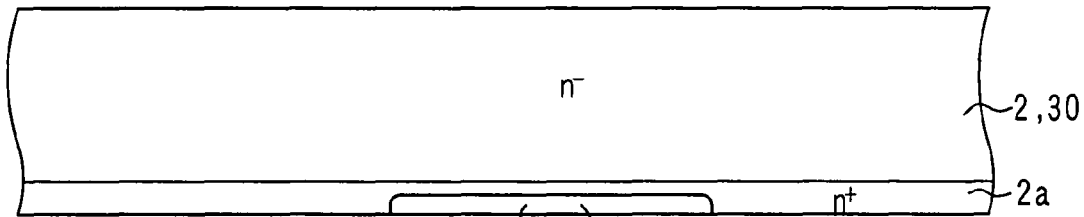

During a process illustrated in FIG. 9A, the FS layer 2a is formed on the rear surface of the N type semiconductor substrate 30 in a manner similar to the process illustrated in FIG. 2A. During a process illustrated in FIG. 9B, a mask is disposed on a surface of the FS layer 2a. The mask has an opening at a portion where the P++ type collector layer 1a will be formed. The P type impurities are implanted using the mask and an anneal treatment is performed so as to form the P++ type collector layer 1a having a depth of, for example, about 0.5 μm.

Figure 9C:
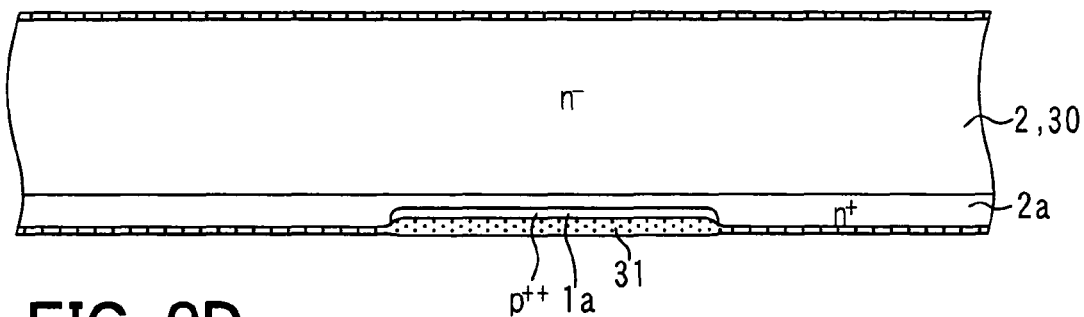
Figure 9D:
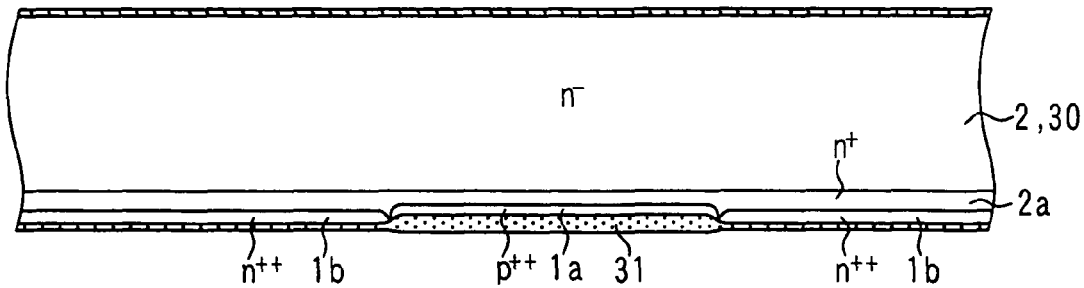
Figure 10A:
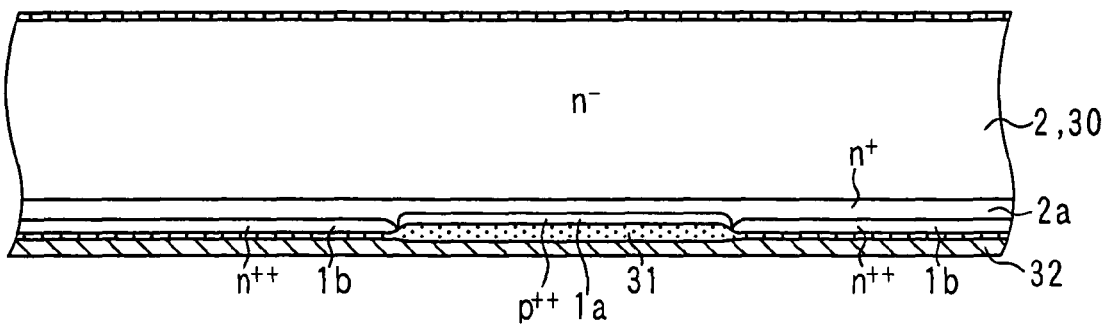
FIG. 10A to FIG. 10D are diagrams illustrating processes of manufacturing the semiconductor device according to the third embodiment.
Figure 10B:
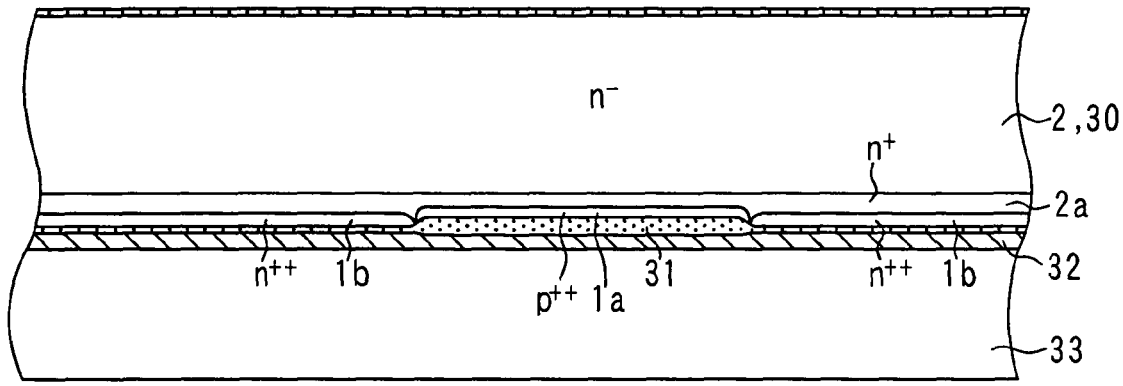
Figure 10C:
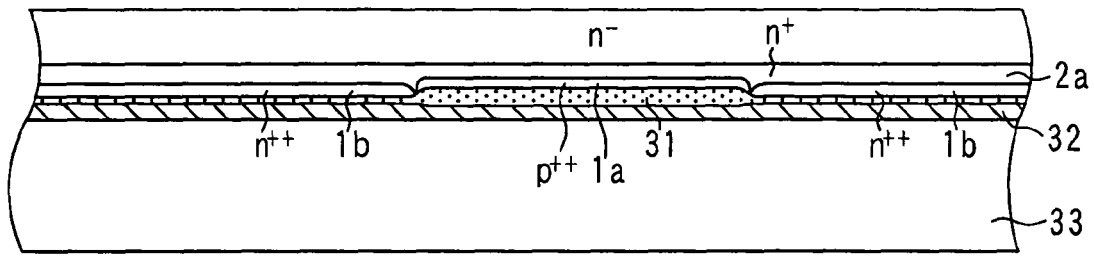
Figure 10D:
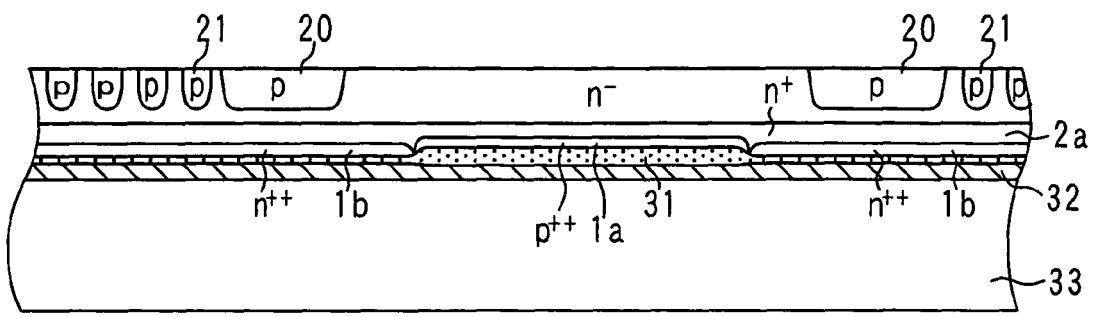
Figure 11A:
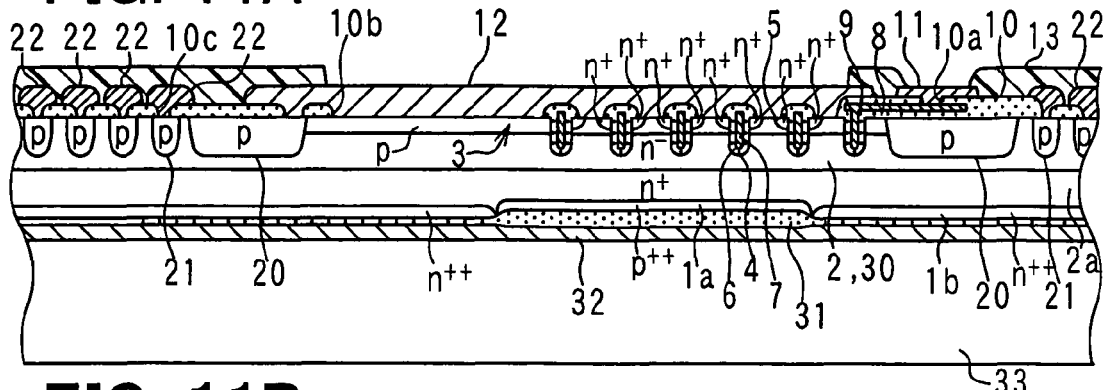
FIG. 11A to FIG. 11D are diagrams illustrating processes of manufacturing the semiconductor device according to the third embodiment.
Figure 11B:
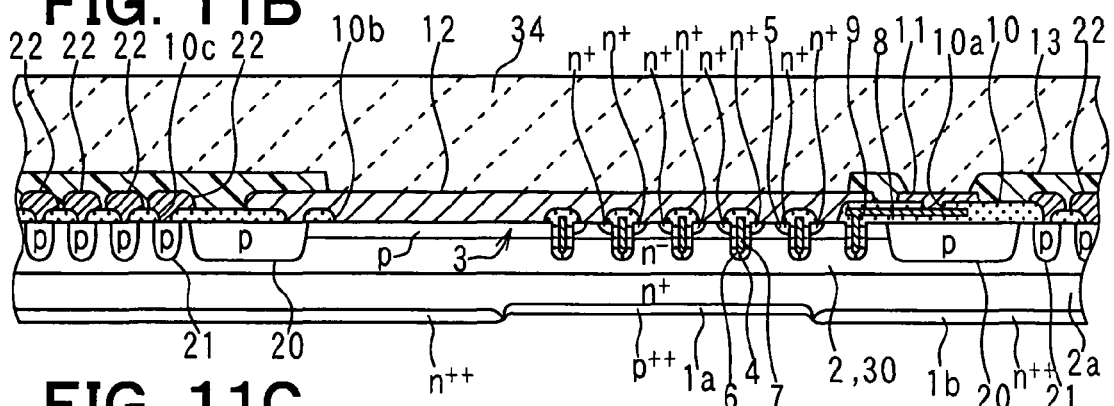
Figure 11C:
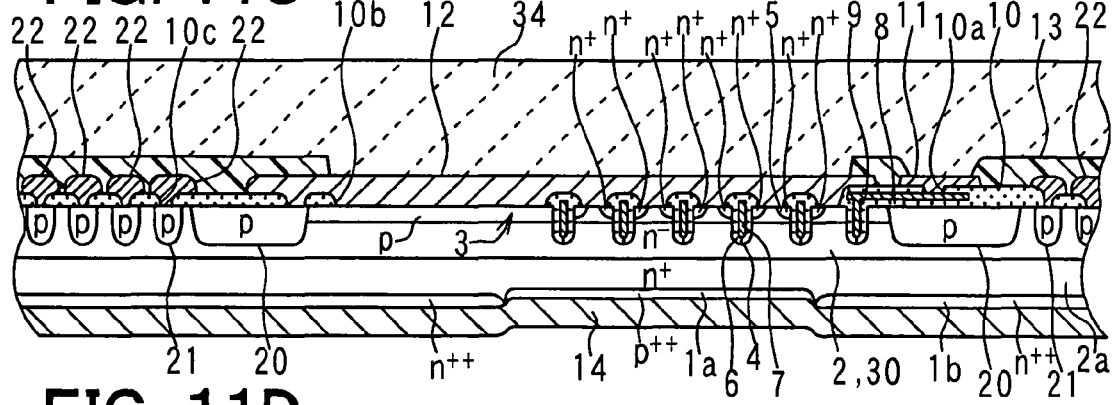
Figure 11D:
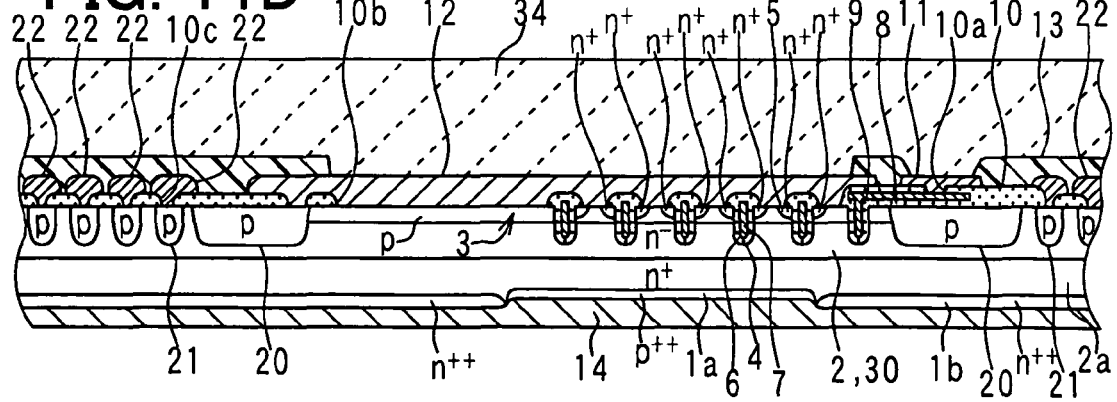

During a process illustrated in FIG. 9C, the oxide layer 31 is formed by a thermal oxidation process. In the thermal oxidation process, the P++ type collector layer 1a having a high concentration of the N type impurities is enhanced-oxidized. Thus, the thickness of the oxide layer 31 formed on the P++ type collector layer 1a is greater than the thickness of the oxide layer 31 formed on other region. At a boundary portion between the FS layer 2a and the P++ type collector layer 1a, the oxide layer 31 has a rounded stepped portion having a bird beak shape. A portion of the oxide layer 31 formed on the FS layer 2a is removed as needed, for example, by etching.

The N type impurities are implanted using the oxide layer 31 as a mask, and anneal treatment is performed so as to form the P++ type collector layer having a depth of, for example, about 0.3 μm. The N++ type cathode layer 1b is formed at a portion where the oxide layer 31 is removed or a portion where the thickness of the oxide layer 31 is less than other portion. Thus, the N++ type cathode layer 1b is self-aligned with respect to the P++ type collector layer 1a. Therefore, a misalignment of the P++ type collector layer 1a and the N++ type cathode layer 1b can be restricted. The P++ type collector layer 1a is recessed by the oxidation process illustrated in FIG. 9C, and a boundary portion between the FS layer 2a and the P++ type collector layer 1a is roundly oxidized. Thus, the N++ type cathode layer 1b smoothly protrudes in the opposite direction from the FS layer 2a and the N− type drift layer 2 with respect to the P++ type collector layer 1a.

During processes illustrated in FIG. 10A to FIG. 10D and FIG. 11A to FIG. 11D, processes similar to those illustrated in FIG. 3A to FIG. 3D and FIG. 4A to FIG. 4D are performed, and thereby the semiconductor device in which the IGBT and the diode are integrated is completed.

As described above, the P++ type collector layer 1a may be formed before forming the N++ type cathode layer 1b, the P++ type collector layer 1a may be enhanced oxidized, and the N++ type cathode layer 1b may be formed using the oxide layer 31 as the mask.

The semiconductor device according to the present embodiment has a configuration substantially similar to the semiconductor device according to the first embodiment. However, the N++ type cathode layer 1b smoothly protrudes in the opposite direction from the FS layer 2a and the N− type drift layer 2 with respect to the P++ type collector layer 1a in a manner similar to the semiconductor device according to the second embodiment. Thus, the semiconductor device according to the present embodiment can have effects similar to those of the semiconductor device according to the second embodiment.

Fourth Embodiment

A manufacturing method of a semiconductor device according to a fourth embodiment of the present invention will be described with reference to FIG. 12A to FIG. 14D.

Figure 12A:
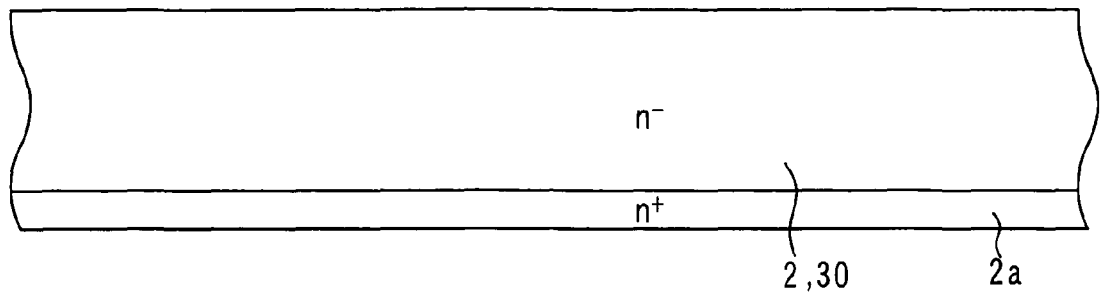
FIG. 12A to FIG. 12D are diagrams illustrating processes of manufacturing a semiconductor device according to a fourth embodiment of the present invention.
Figure 12B:
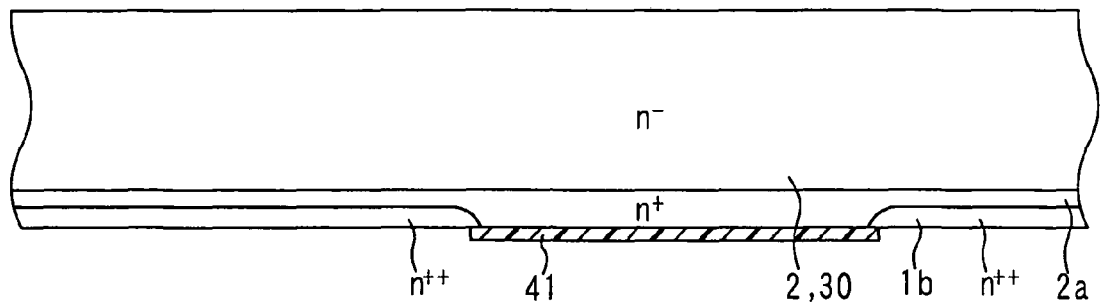

During a process illustrated in FIG. 12A, the FS layer 2a is formed on the rear surface of the N type semiconductor substrate 30 in a manner similar to the process illustrated in FIG. 2A. During a process illustrated in FIG. 12B, the silicon nitride layer 41 is formed on a surface of the FS layer 2a. The silicon nitride layer 41 is pattern-formed by a photolithography process so that a portion where the N++ type cathode layer 1b will be formed opens. A silicon oxide layer of about 500 Å may be formed before forming the silicon nitride layer 41. The N type impurities are implanted using the silicon nitride layer 41 as a mask, and an anneal treatment is performed so as to form the N++ type cathode layer 1b.

Figure 12C:
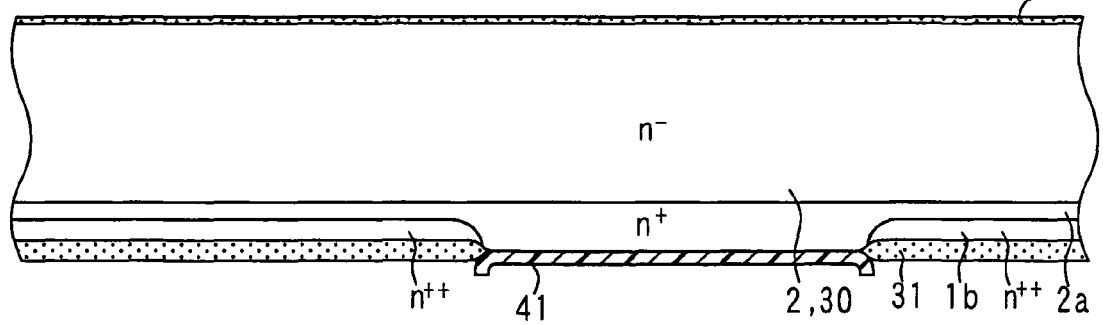

During a process illustrated in FIG. 12C, a thermal oxidation process is performed using the silicon nitride layer 41 as a mask. Accordingly, an oxide layer 42 is formed only on a surface of the N++ type cathode layer 1b on which the silicon nitride layer 41 is not disposed. By the thermal oxidation process, a stepped portion between the surface of the N++ type cathode layer 1b and the surface of the FS layer 2a that provides the P++ type collector layer 1a during the subsequent process is rounded.

Figure 12D:
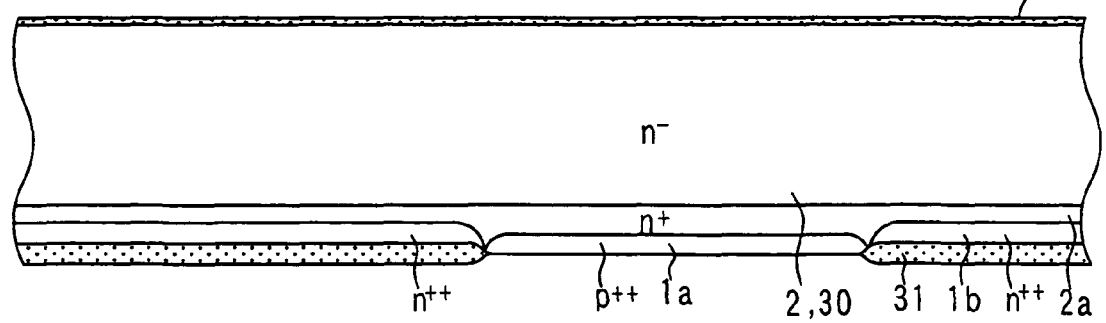
Figure 13A:
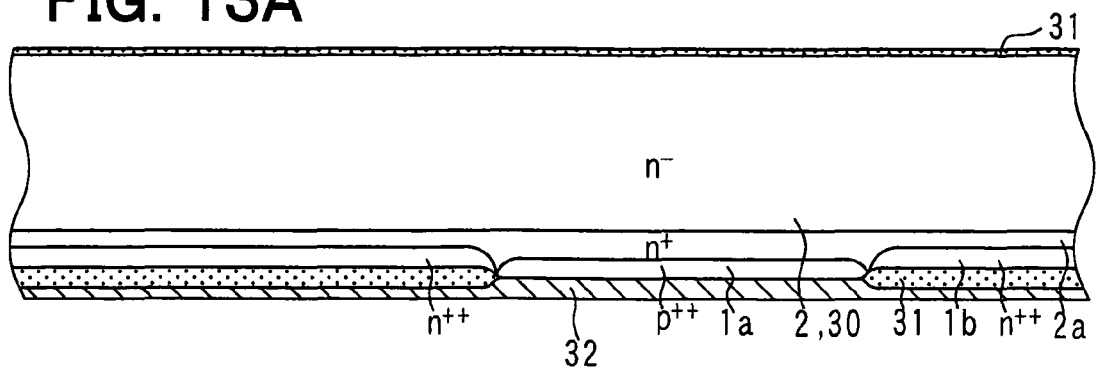
FIG. 13A to FIG. 13D are diagrams illustrating processes of manufacturing the semiconductor device according to the fourth embodiment.
Figure 13B:
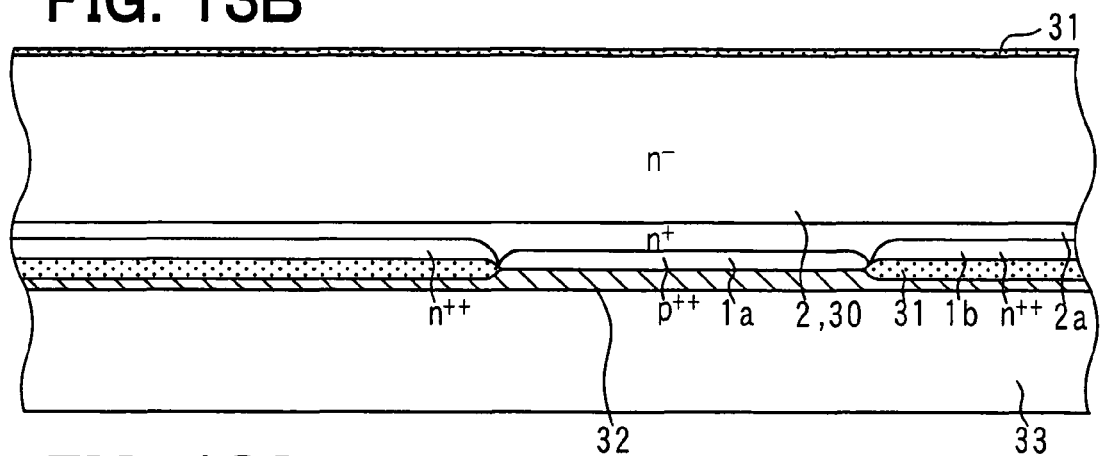
Figure 13C:
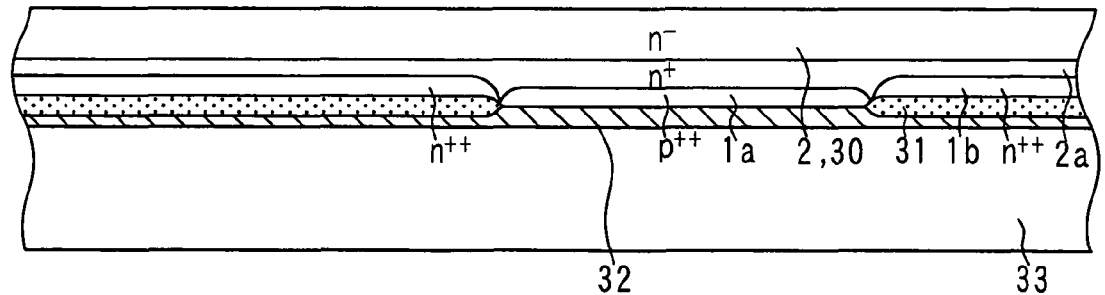
Figure 13D:
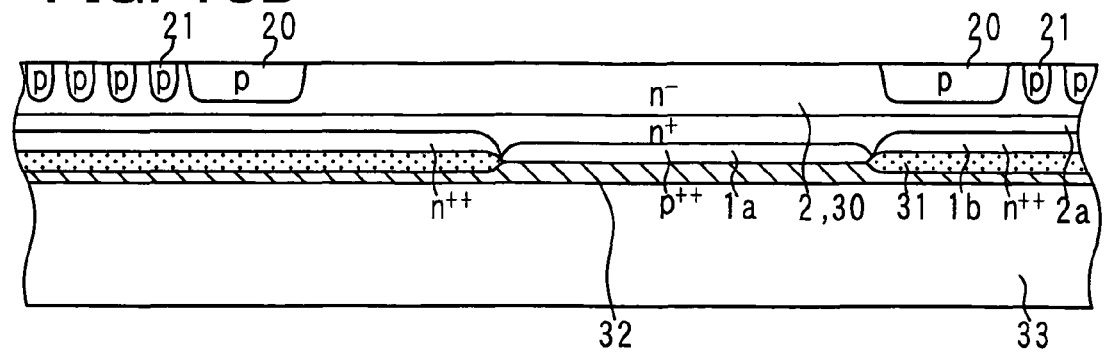
Figure 14A:
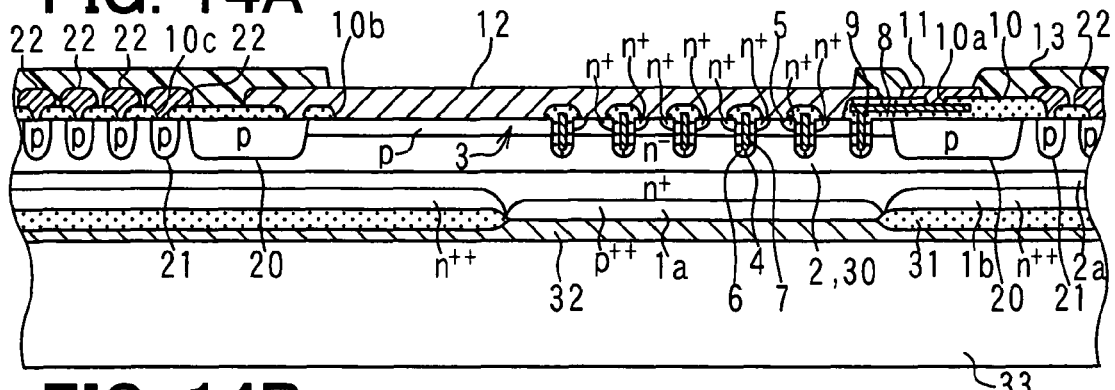
FIG. 14A to FIG. 14D are diagrams illustrating processes of manufacturing the semiconductor device according to the fourth embodiment.
Figure 14B:
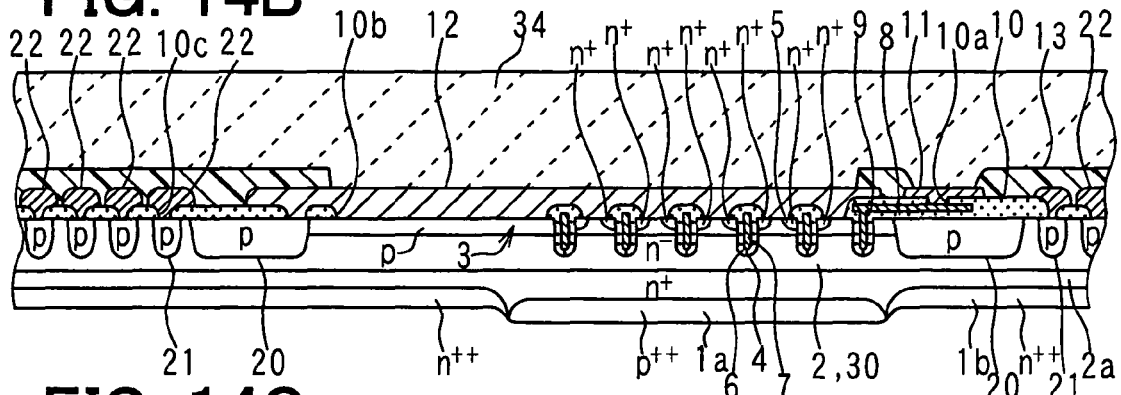
Figure 14C:
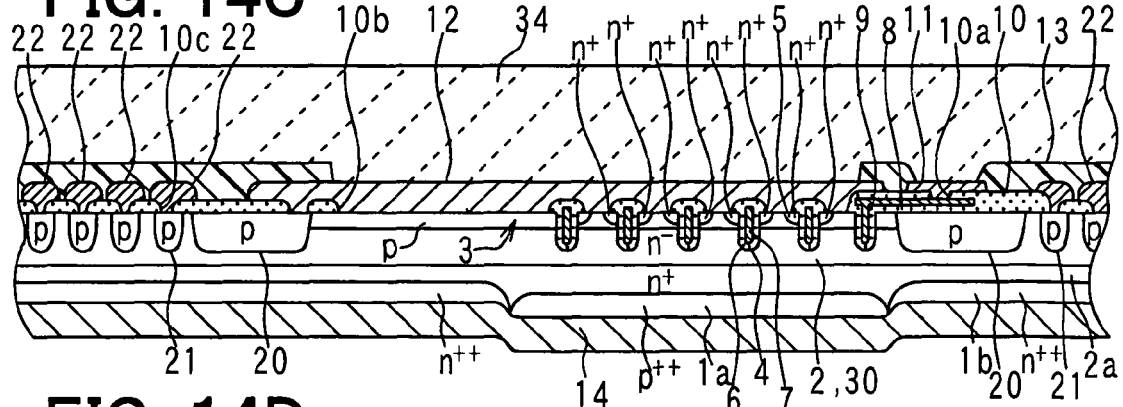
Figure 14D:
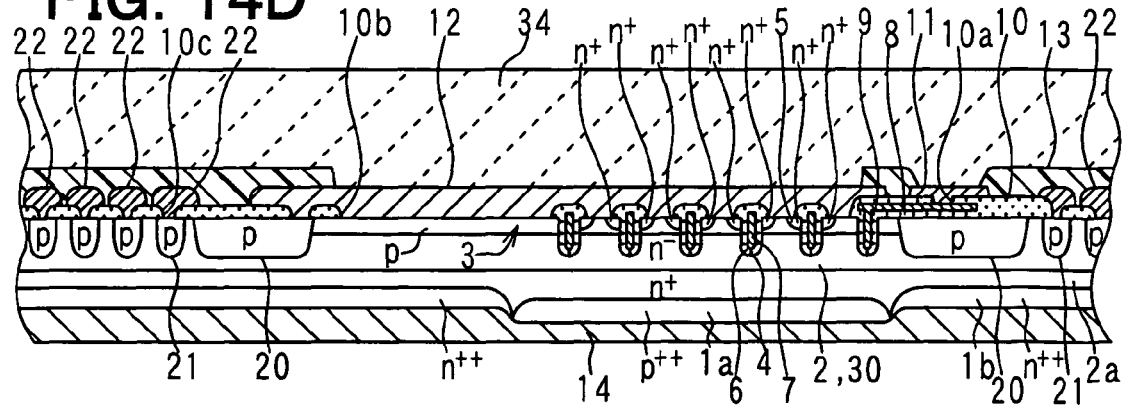

During the process illustrated in FIG. 12D, the silicon nitride layer 41 is removed and the P type impurities are implanted using the oxide layer 42 as a mask. Then, an anneal treatment is performed so as to form the P++ type collector layer 1a. The P++ type collector layer 1a is formed at a region where the oxide layer 42 is not disposed. Thus, the P++ type collector layer 1a is self-aligned with respect to the N++ type cathode layer 1b. Therefore, a misalignment of the P++ type collector layer 1a and the N++ type cathode layer 1b can be restricted. In addition, the N++ type cathode layer 1b is recessed by the oxidation process illustrated in FIG. 12C, and a boundary portion between the FS layer 2a and the N++ type cathode layer 1b is roundly oxidized. Thus, the P++ type collector layer 1a smoothly protrudes in the opposite direction from the FS layer 2a and the N− type drift layer 2 with respect to the N++ type cathode layer 1b.

During processes illustrated in FIG. 13A to FIG. 13D and FIG. 14A to FIG. 14D, processes similar to those illustrated in FIG. 3A to FIG. 3D and FIG. 4A to FIG. 4D are performed, and thereby the semiconductor device in which the IGBT and the diode are integrated is completed.

As described above, the N++ type cathode layer 1b may be formed before forming the P++ type collector layer 1a, the oxide layer 42 may be formed by oxidizing the N++ type cathode layer 1b, and the P++ type collector layer 1a may be formed using the oxide layer 42 as the mask.

The semiconductor device according to the present embodiment has a configuration substantially similar to the semiconductor device according to the first embodiment, and the P++ type collector layer 1a smoothly protrudes in the opposite direction from the FS layer 2a and the N− type drift layer 2 with respect to the N++ type cathode layer 1b. Thus, the semiconductor device according to the present embodiment can have effects similar to those of the semiconductor device according to the first embodiment.

Fifth Embodiment

A manufacturing method of a semiconductor device according to a fifth embodiment of the present invention will be described with reference to FIG. 15A to FIG. 17C.

Figure 15A:
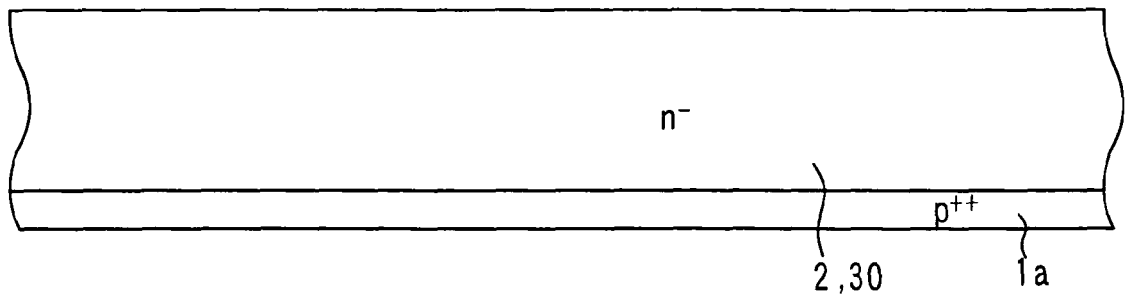
FIG. 15A to FIG. 15D are diagrams illustrating processes of manufacturing a semiconductor device according to a fifth embodiment of the present invention.

During a process illustrated in FIG. 15A, the N type semiconductor substrate 30 is prepared. The P type impurities are implanted to the whole rear surface of the N type semiconductor substrate 30, and an anneal treatment is performed so as to form the P++ type collector layer 1a. Although the N type semiconductor substrate 30 does not include the FS layer 2a in an example illustrated in FIG. 15A, the N type semiconductor substrate 30 may also include the FS layer 2a.

Figure 15B:
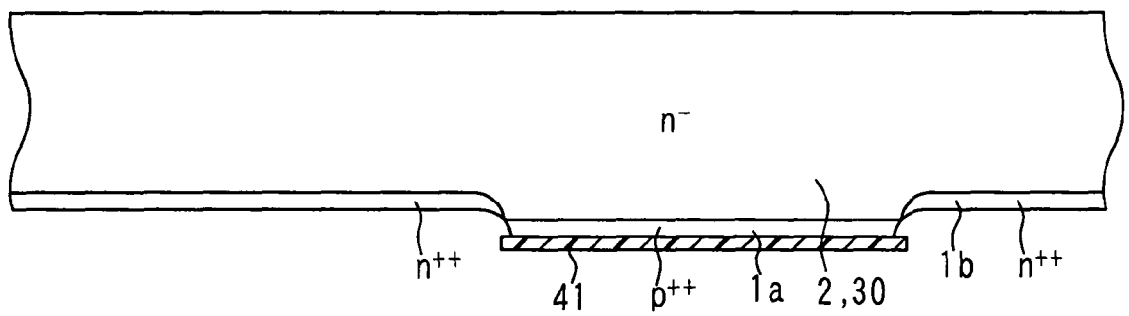

During a process illustrated in FIG. 15B, the silicon nitride layer 41 is formed on the rear surface of the N type semiconductor substrate 30. The silicon nitride layer 41 is pattern-formed by a photolithography process so that a portion where the N++ type cathode layer 1b will be formed opens. A silicon oxide layer of about 500 Å may be formed before forming the silicon nitride layer 41. Then, a silicon etching is performed using the silicon nitride layer 41 as a mask so as to remove the P++ type collector layer 1a from the portion where the N++ type cathode layer 1b will be formed and to expose the N type semiconductor substrate 30. The N type impurities are implanted using the silicon nitride layer 41 as a mask, and an anneal treatment is performed so as to form the N++ type cathode layer 1b. The N++ type cathode layer 1b is formed at a region where the oxide layer 42 is not disposed. Thus, the N++ type cathode layer 1b is self-aligned with respect to the P++ type collector layer 1a. Therefore, a misalignment of the P++ type collector layer 1a and the N++ type cathode layer 1b can be restricted.

Figure 15C:
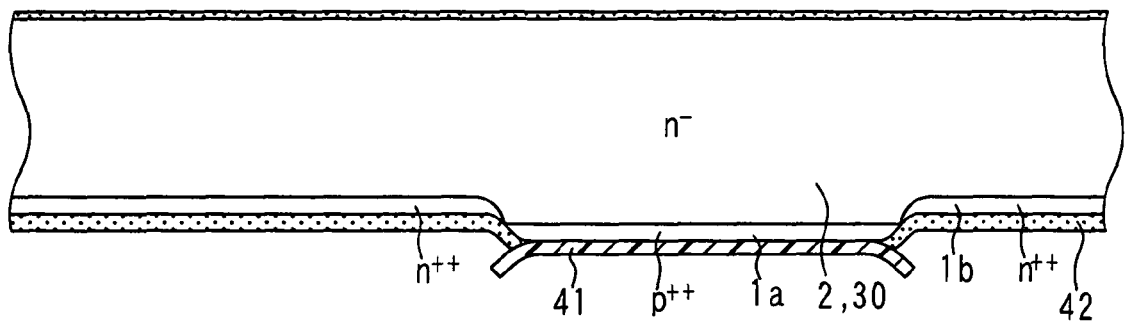
Figure 15D:
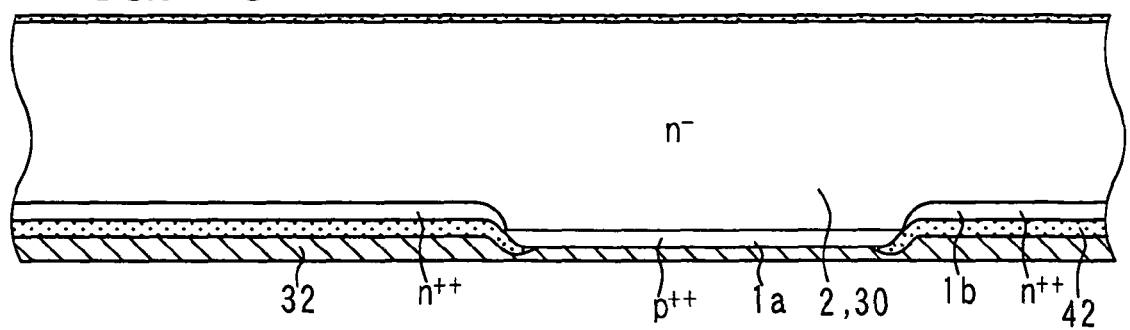
Figure 16A:
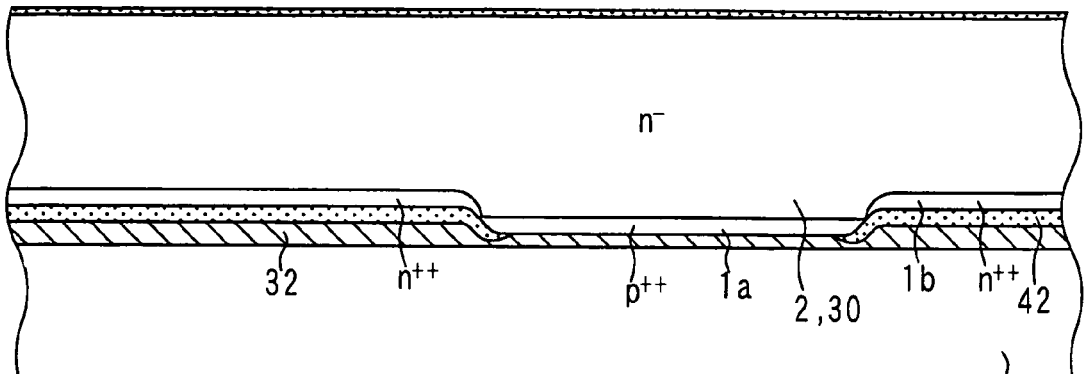
FIG. 16A to FIG. 16D are diagrams illustrating processes of manufacturing the semiconductor device according to the fifth embodiment.
Figure 16B:
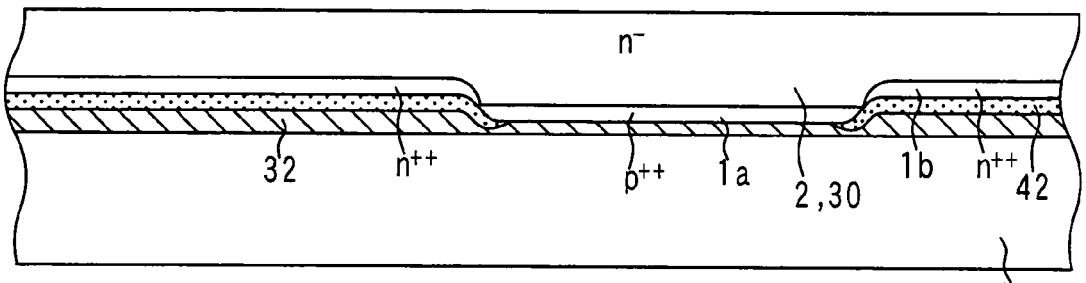
Figure 16C:
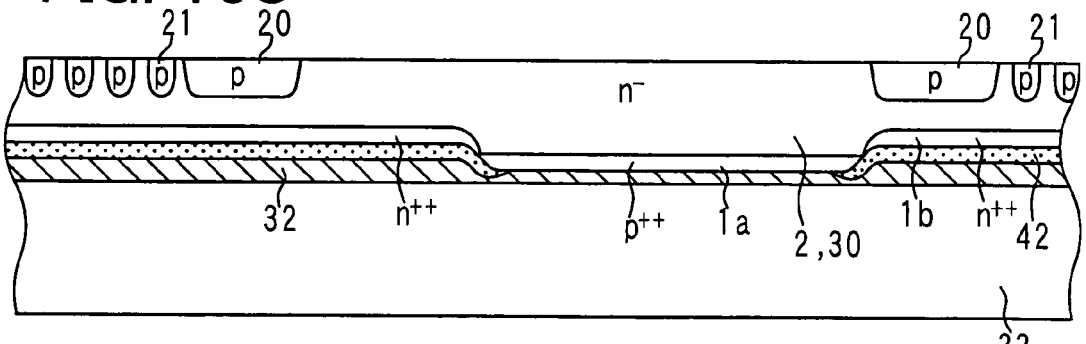
Figure 16D:
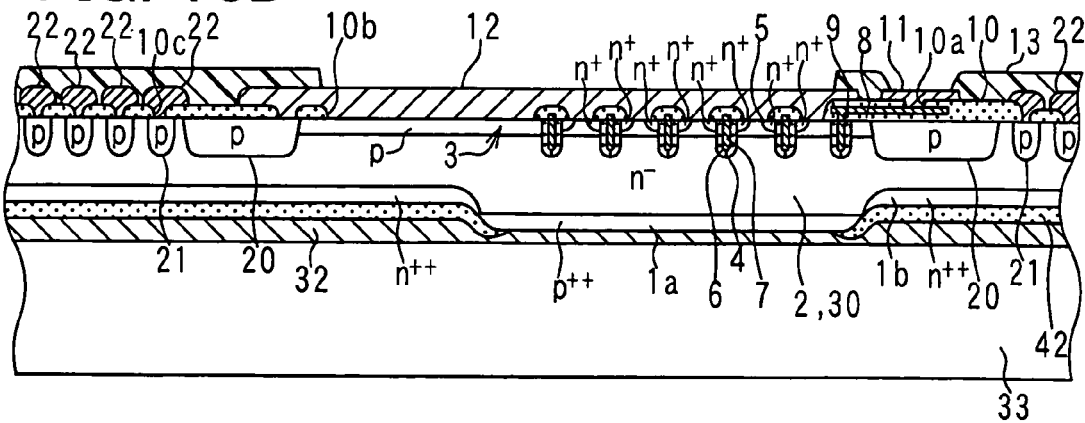
Figure 17A:
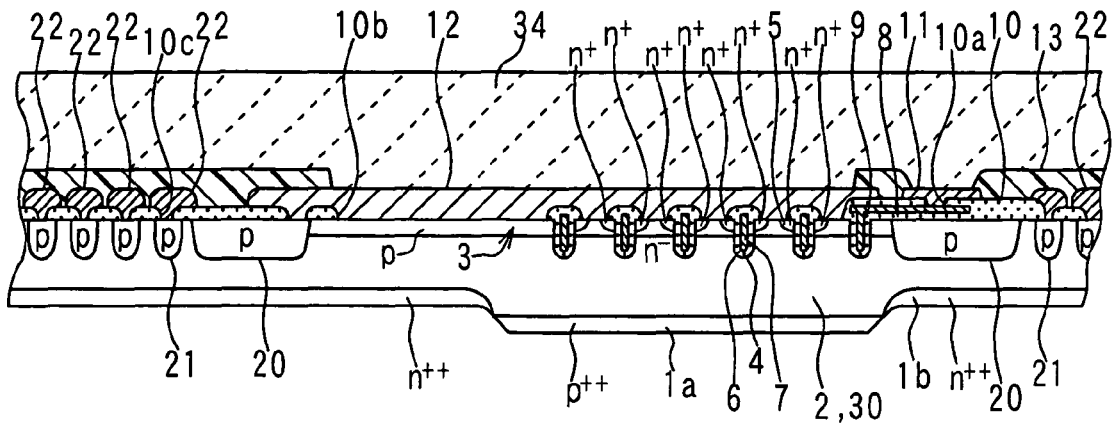
FIG. 17A to FIG. 17C are diagrams illustrating processes of manufacturing the semiconductor device according to the fifth embodiment.
Figure 17B:
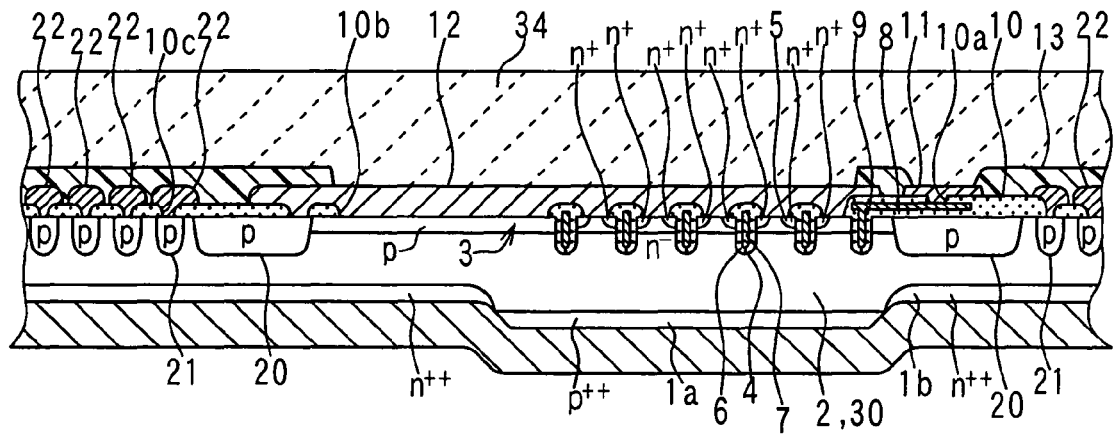
Figure 17C:
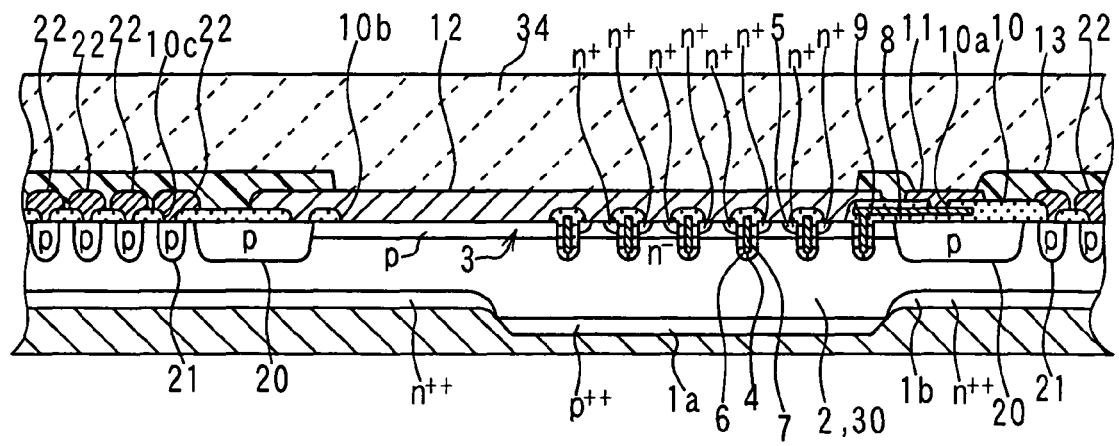

During a process illustrated in FIG. 15C, a thermal oxidation process is performed using the silicon nitride layer 41 as a mask. Accordingly, an oxide layer 42 is formed only on a surface of the N++ type cathode layer 1b on which the silicon nitride layer 41 is not disposed. By the thermal oxidation process, a stepped portion between the surface of the N++ type cathode layer 1b and the surface of the P++ type collector layer 1a is rounded. Thus, the P++ type collector layer 1a smoothly protrudes in the opposite direction from the N− type drift layer 2 with respect to the N++ type cathode layer 1b.

During processes illustrated in FIG. 15, FIG. 16A to FIG. 16D and FIG. 17A to FIG. 17C, processes similar to those illustrated in FIG. 3A to FIG. 3D and FIG. 4A to FIG. 4D are performed, and thereby the semiconductor device in which the IGBT and the diode are integrated is completed.

As described above, the P++ type collector layer 1a may be formed on the whole rear surface of the N type semiconductor substrate 30, a portion of the P++ type collector layer 1a where the N++ type cathode layer 1b will be formed may be removed using the silicon nitride layer 41 as the mask, and the N++ type cathode layer 1b may be formed at the portion.

The semiconductor device according to the present embodiment has a configuration substantially similar to the semiconductor device according to the first embodiment, and the P++ type collector layer 1a smoothly protrudes in the opposite direction from the N− type drift layer 2 with respect to the N++ type cathode layer 1b. Thus, the semiconductor device according to the present embodiment can have effects similar to those of the semiconductor device according to the first embodiment.

Sixth Embodiment

A manufacturing method of a semiconductor device according to a sixth embodiment of the present invention will be described with reference to FIG. 18A to FIG. 18C.

Figure 18A:
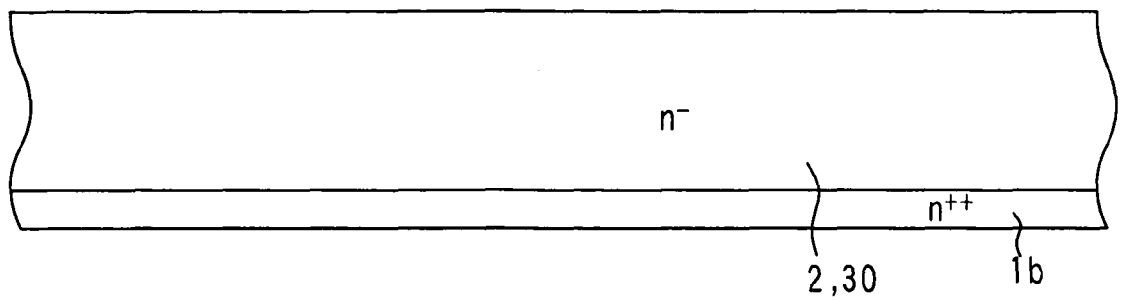
FIG. 18A to FIG. 18C are diagrams illustrating processes of manufacturing a semiconductor device according to a sixth embodiment of the present invention.

During a process illustrated in FIG. 18A, the N type semiconductor substrate 30 is prepared. The N type impurities are implanted to the whole rear surface of the N type semiconductor substrate 30, and an anneal treatment is performed so as to form the N++ type cathode layer 1b. Although the N type semiconductor substrate 30 does not include the FS layer 2a in an example illustrated in FIG. 18A, the N type semiconductor substrate 30 may also include the FS layer 2a.

Figure 18B:
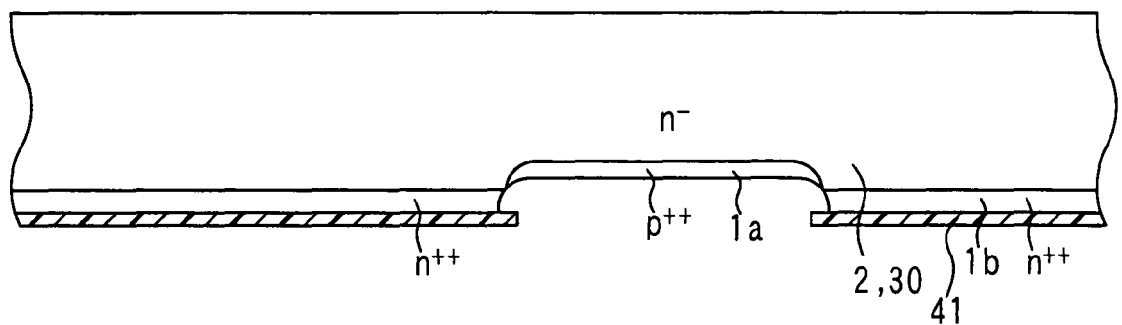

During a process illustrated in FIG. 18B, the silicon nitride layer 41 is formed on the rear surface of the N type semiconductor substrate 30. The silicon nitride layer 41 is pattern-formed by a photolithography process so that a portion where the P++ type collector layer 1a will be formed opens. A silicon oxide layer of about 500 Å may be formed before forming the silicon nitride layer 41. Then, a silicon etching is performed using the silicon nitride layer 41 as a mask so as to remove the N++ type cathode layer 1b from the portion where the P++ type collector layer 1a will be formed and to expose the N type semiconductor substrate 30. The P type impurities are implanted using the silicon nitride layer 41 as a mask, and an anneal treatment is performed so as to form the P++ type collector layer 1a. The P++ type collector layer 1a is formed at a region where the silicon nitride layer 41 is not disposed. Thus, the P++ type collector layer 1a is self-aligned with respect to the N++ type cathode layer 1b. Therefore, a misalignment of the P++ type collector layer 1a and the N++ type cathode layer 1b can be restricted.

Figure 18C:
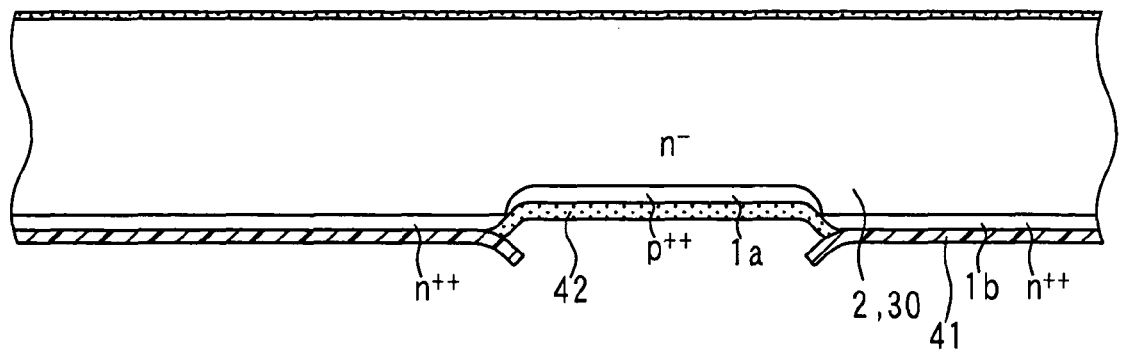

During a process illustrated in FIG. 18C, a thermal oxidation process is performed using the silicon nitride layer 41 as a mask. Accordingly, the oxide layer 42 is formed only on a surface of the P++ type collector layer 1a on which the silicon nitride layer 41 is not disposed. By the thermal oxidation process, a stepped portion between the surface of the P++ type collector layer 1a and the surface of the N++ type cathode layer 1b is rounded. Thus, the N++ type cathode layer 1b smoothly protrudes in the opposite direction from the N− type drift layer 2 with respect to the P++ type collector layer 1a.

The subsequent processes are not illustrated. By performing processes similar to those illustrated in FIG. 3A to FIG. 3D and FIG. 4A to FIG. 4D, the semiconductor device in which the IGBT and the diode are integrated is completed.

As described above, the P++ type collector layer 1a may also be formed after forming the N++ type cathode layer 1b in reverse order compared with the manufacturing method according to the fifth embodiment.

In the semiconductor device according to the present embodiment, the N++ type cathode layer 1b smoothly protrudes in the opposite direction from the N− type drift layer 2 with respect to the P++ type collector layer 1a. Thus, the semiconductor device according to the present embodiment can have effects similar to those of the semiconductor device according to the second embodiment.

Seventh Embodiment

A manufacturing method of a semiconductor device according to a seventh embodiment of the present invention will be described with reference to FIG. 19A to FIG. 21D.

Figure 19A:
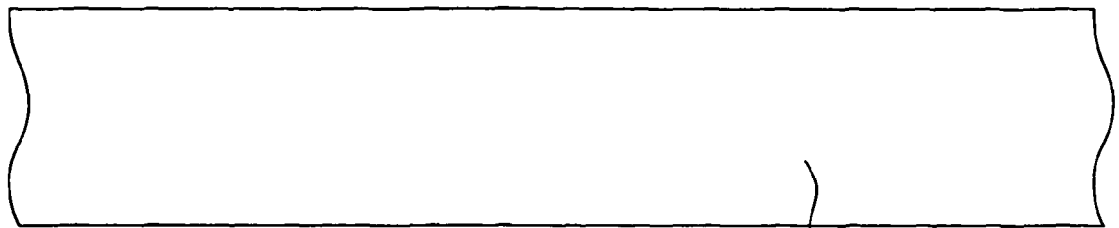
FIG. 19A to FIG. 19E are diagrams illustrating processes of manufacturing a semiconductor device according to a seventh embodiment of the present invention.
Figure 19B:
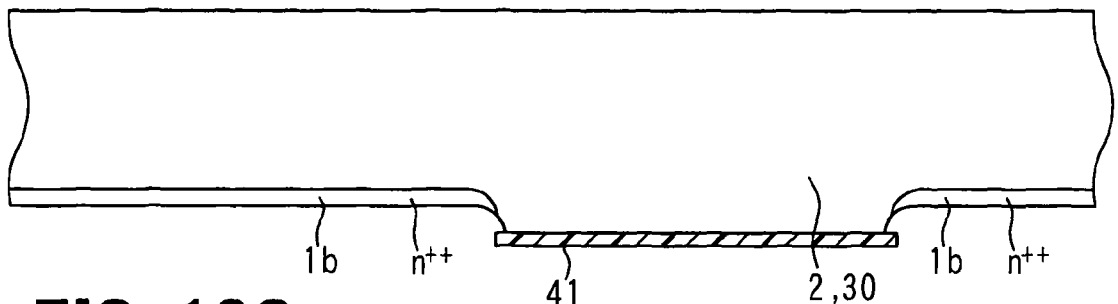

During a process illustrated in FIG. 19A, the N type semiconductor substrate 30 is prepared. Although the N type semiconductor substrate 30 does not include the FS layer 2a in an example illustrated in FIG. 19A, the N type semiconductor substrate 30 may also include the FS layer 2a. During a process illustrated in FIG. 19B, the silicon nitride layer 41 is formed on the rear surface of the N type semiconductor substrate 30. The silicon nitride layer 41 is pattern-formed by a photolithography process so that a portion where the N++ type cathode layer 1b will be formed opens. A silicon oxide layer of about 500 Å may be formed before forming the silicon nitride layer 41. A silicon etching is performed using the silicon nitride layer 41 as a mask, and a recess portion is provided at a portion where the N++ type cathode layer 1b will be formed. The N type impurities are implanted using the silicon nitride layer 41 as a mask, and an anneal treatment is performed so as to form the N++ type cathode layer 1b. The N++ type cathode layer 1b is formed at a region where the silicon nitride layer 41 is not disposed.

Figure 19C:
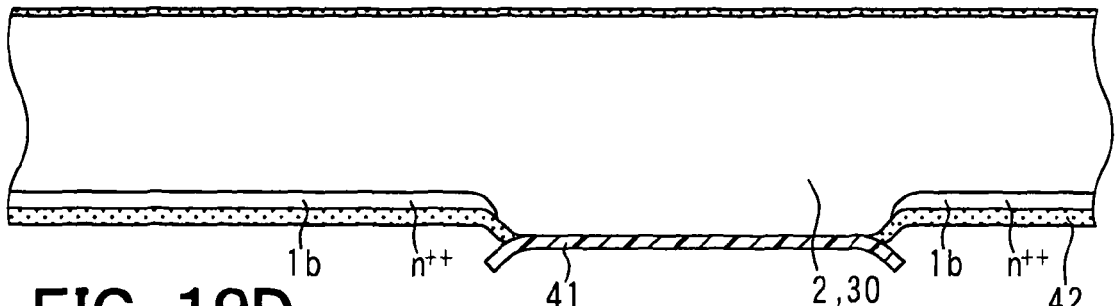

During a process illustrated in FIG. 19C, a thermal oxidation process is performed using the silicon nitride layer 41 as a mask. Accordingly, the oxide layer 42 is formed only on a surface of the N++ type cathode layer 1b on which the silicon nitride layer 41 is not disposed. By the thermal oxidation process, a stepped portion between the surface of the N++ type cathode layer 1b and a surface of a portion where the P++ type collector layer 1a will be formed is rounded.

Figure 19D:
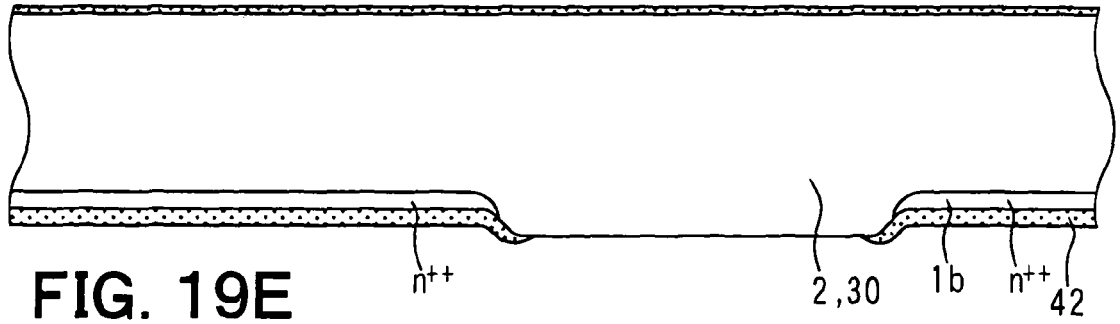
Figure 19E:
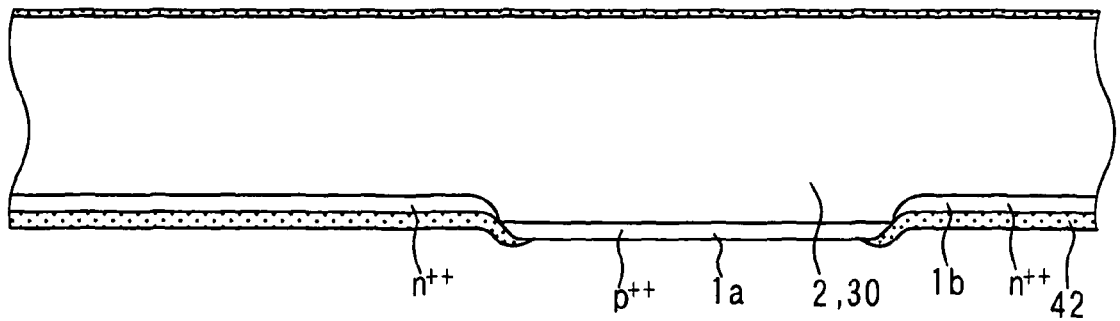
Figure 20A:
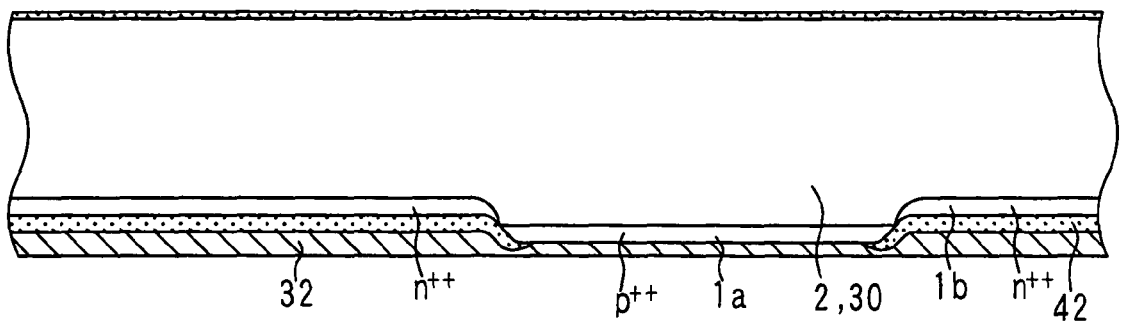
FIG. 20A to FIG. 20D are diagrams illustrating processes of manufacturing the semiconductor device according to the seventh embodiment.
Figure 20B:
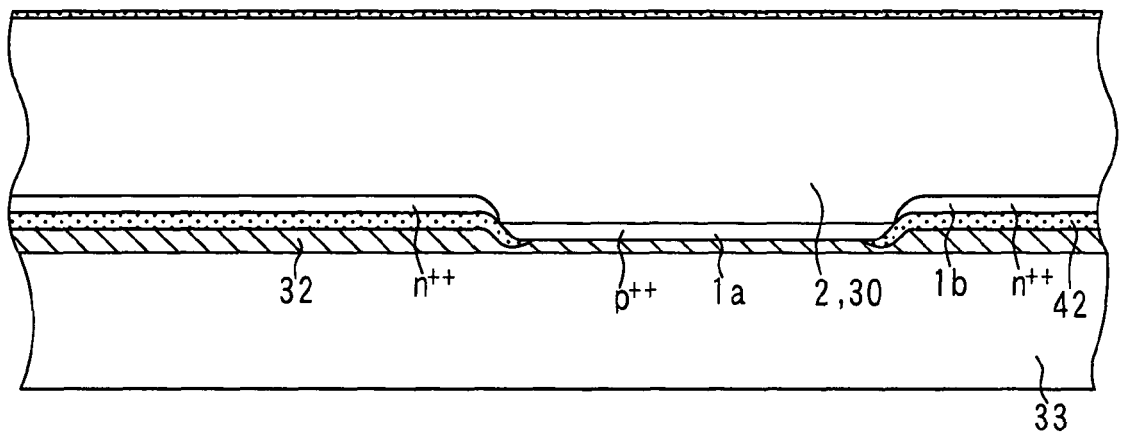
Figure 20C:
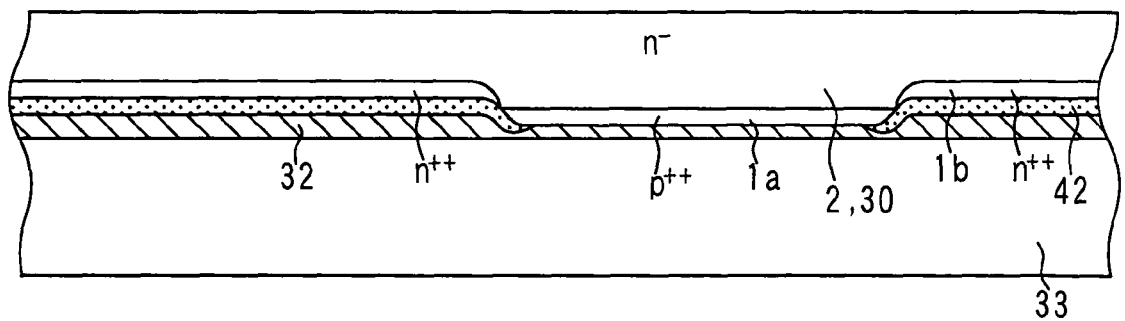
Figure 20D:
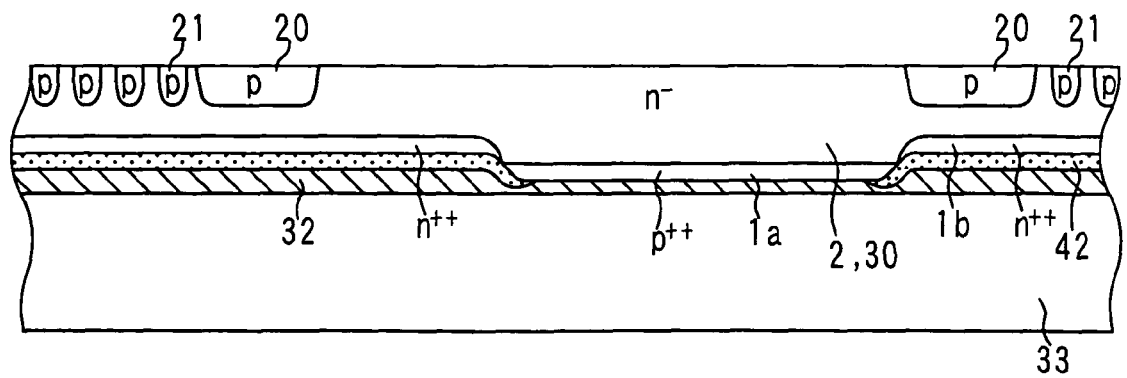

During a process illustrated in FIG. 19D, the silicon nitride layer 41 is removed. During a process illustrated in FIG. 19E, the P type impurities are implanted using the oxide layer 42 as a mask, and an anneal treatment is performed so as to form the P++ type collector layer 1a. The P++ type collector layer 1a is self-aligned with respect to the N++ type cathode layer 1b. Therefore, a misalignment of the P++ type collector layer 1a and the N++ type cathode layer 1b can be restricted. The N++ type cathode layer 1b is formed inside the recess portion and the P++ type collector layer 1a is formed outside the recess portion. Thus, the P++ type collector layer 1a smoothly protrudes in the opposite direction from the N− type drift layer 2 with respect to the N++ type cathode layer 1b.

During processes illustrated in FIG. 20A to FIG. 20D and FIG. 21A to FIG. 21D, processes similar to those illustrated in FIG. 3A to FIG. 3D and FIG. 4A to FIG. 4D are performed, and thereby the semiconductor device in which the IGBT and the diode are integrated is completed.

As described above, the recess portion may be provided at a portion of the N type semiconductor substrate 30 where N++ type cathode layer 1b will be formed, the N++ type cathode layer 1b may be formed in the recess portion, the oxide layer 42 may be formed in the recess portion, and the P++ type collector layer 1a may be formed using the oxide layer 42 as the mask.

The semiconductor device according to the present embodiment has a configuration substantially similar to the semiconductor device according to the first embodiment, and the P++ type collector layer 1a smoothly protrudes in the opposite direction from the N− type drift layer 2 with respect to the N++ type cathode layer 1b. Thus, the semiconductor device according to the present embodiment can have effects similar to those of the semiconductor device according to the first embodiment.

Eighth Embodiment

A manufacturing method of a semiconductor device according to an eighth embodiment of the present invention will be described with reference to FIG. 22A to FIG. 22D.

Figure 22A:
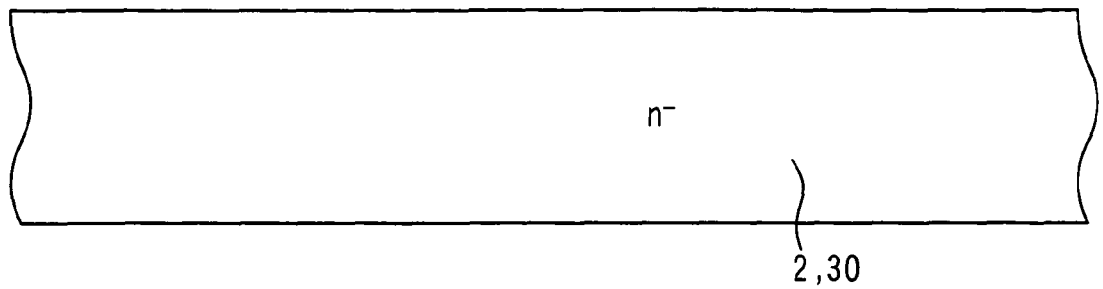
FIG. 22A to FIG. 22D are diagrams illustrating processes of manufacturing a semiconductor device according to an eighth embodiment of the present invention.

During a process illustrated in FIG. 22A, the N type semiconductor substrate 30 is prepared. Although the N type semiconductor substrate 30 does not include the FS layer 2a in an example illustrated in FIG. 22A, the N type semiconductor substrate 30 may also include the FS layer 2a.

Figure 22B:
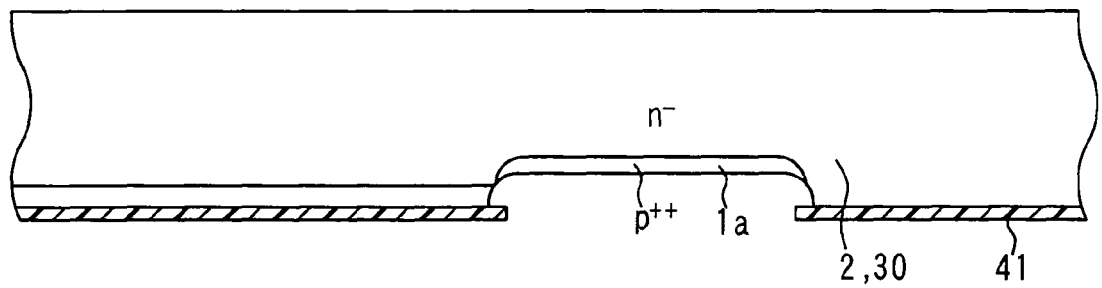

During a process illustrated in FIG. 22B, the silicon nitride layer 41 is formed on the rear surface of the N type semiconductor substrate 30. The silicon nitride layer 41 is pattern-formed by a photolithography process so that a portion where the P++ type collector layer 1a will be formed opens. A silicon oxide layer of about 500 Å may be formed before forming the silicon nitride layer 41. A silicon etching is performed using the silicon nitride layer 41 as a mask, and a recess portion is provided at a portion where the P++ type collector layer 1a will be formed. The P type impurities are implanted using the silicon nitride layer 41 as a mask, and an anneal treatment is performed so as to form the P++ type collector layer 1a.

Figure 22C:
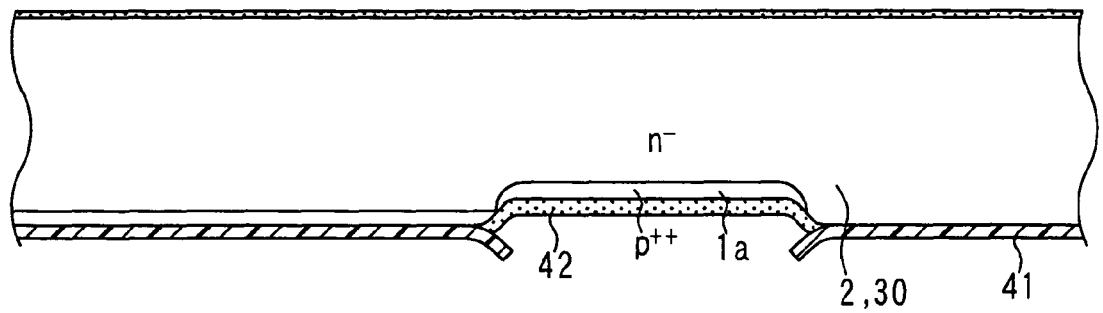

During a process illustrated in FIG. 22C, a thermal oxidation process is performed using the silicon nitride layer 41 as a mask. Accordingly, the oxide layer 42 is formed only on a surface of the P++ type collector layer 1a on which the silicon nitride layer 41 is not disposed. By the thermal oxidation process, a stepped portion between the surface of the P++ type collector layer 1a and the surface of a portion where the N++ type cathode layer 1b will be formed is rounded.

Figure 22D:
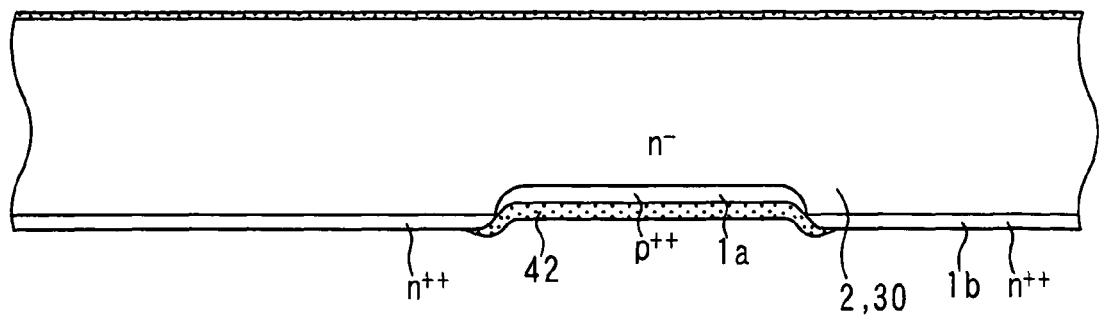

During a process illustrated in FIG. 22D, the N type impurities are implanted to the whole rear surface of the N type semiconductor substrate 30 using the oxide layer 42 as a mask, and an anneal treatment is performed so as to form the N++ type cathode layer 1b. The N++ type cathode layer 1b is formed at a region where the oxide layer 42 is not disposed. Thus, the N++ type cathode layer 1b is self-aligned with respect to the P++ type collector layer 1a. Therefore, a misalignment of the P++ type collector layer 1a and the N++ type cathode layer 1b can be restricted. The P++ type collector layer 1a is formed inside the recess portion and the N++ type cathode layer 1b is formed outside the recess portion. Thus, the N++ type cathode layer 1b smoothly protrudes in the opposite direction from the N− type drift layer 2 with respect to the P++ type collector layer 1a.

The subsequent processes are not illustrated. By performing processes similar to those illustrated in FIG. 3A to FIG. 3D and FIG. 4A to FIG. 4D, the semiconductor device in which the IGBT and the diode are integrated is completed.

As described above, the N++ type cathode layer 1b may also be formed after forming the P++ type collector layer 1a in reverse order compared with the manufacturing method according to the seventh embodiment.

In the semiconductor device according to the present embodiment, the N++ type cathode layer 1b smoothly protrudes in the opposite direction from the N− type drift layer 2 with respect to the P++ type collector layer 1a. Thus, the semiconductor device according to the present embodiment can have effects similar to those of the semiconductor device according to the second embodiment.

Ninth Embodiment

A semiconductor device according to a ninth embodiment will be described below. The semiconductor device according to the present embodiment includes an IGBT and a diode which are integrated. For example, the semiconductor device can be used as switching device in an inverter circuit for driving a three-phase motor as illustrated in FIG. 23.

Between a power source line 100 applied with a voltage Vcc from a power source and a ground line 101 coupled with a ground (GND), three circuits including a U phase, a V phase, and W phase is coupled. Each of the U phase, the V phase, and the W phase includes two semiconductor elements 102 coupled in series. Each of the semiconductor elements 102 includes an N type IGBT 103 and a diode 104. A cathode of the diode 104 is coupled with a collector of the IGBT 103, and an anode of the diode 104 is coupled with an emitter of the IGBT 103. In each of the phases, the collector of the IGBT 103 and the cathode of the diode 104 in an upper arm are coupled with the power source line 100, the emitter of the IGBT 103 and the anode of the diode 104 in a lower arm are coupled with the ground line 101, and the emitter of the IGBT 103 and the anode of the diode 104 in the upper arm are coupled with the collector of the IGBT 103 and the cathode of the diode 104 in the lower arm. In each of the phases, a portion between the upper arm and the lower arm is electrically coupled with a three-phase motor 105.

Figure 23:
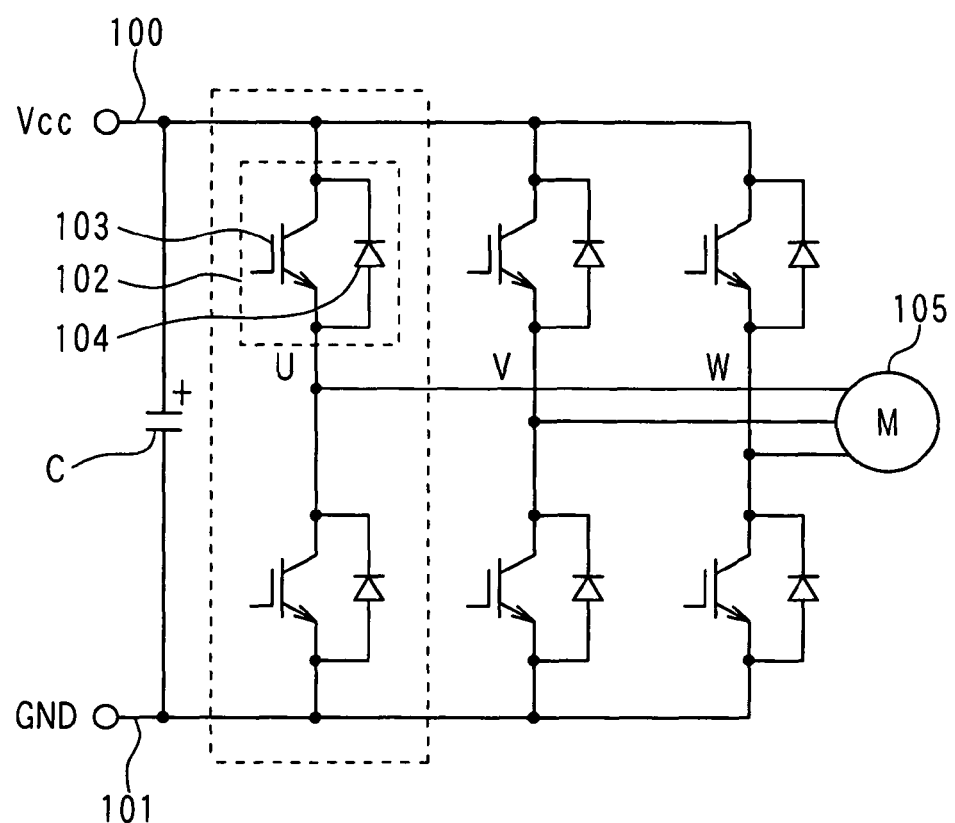
FIG. 23 is a circuit diagram of an inverter circuit in which a semiconductor element provided in a semiconductor device according to a ninth embodiment of the present invention operates as a switching element.

The two semiconductor elements 102 in each of the phases in the inverter circuit, for example, two semiconductor elements 102 in the U phase shown by the dashed line in FIG. 23, are modularized into a semiconductor device.

An exemplary configuration of the semiconductor element 102 will be described with reference to FIG. 24.

Figure 24:
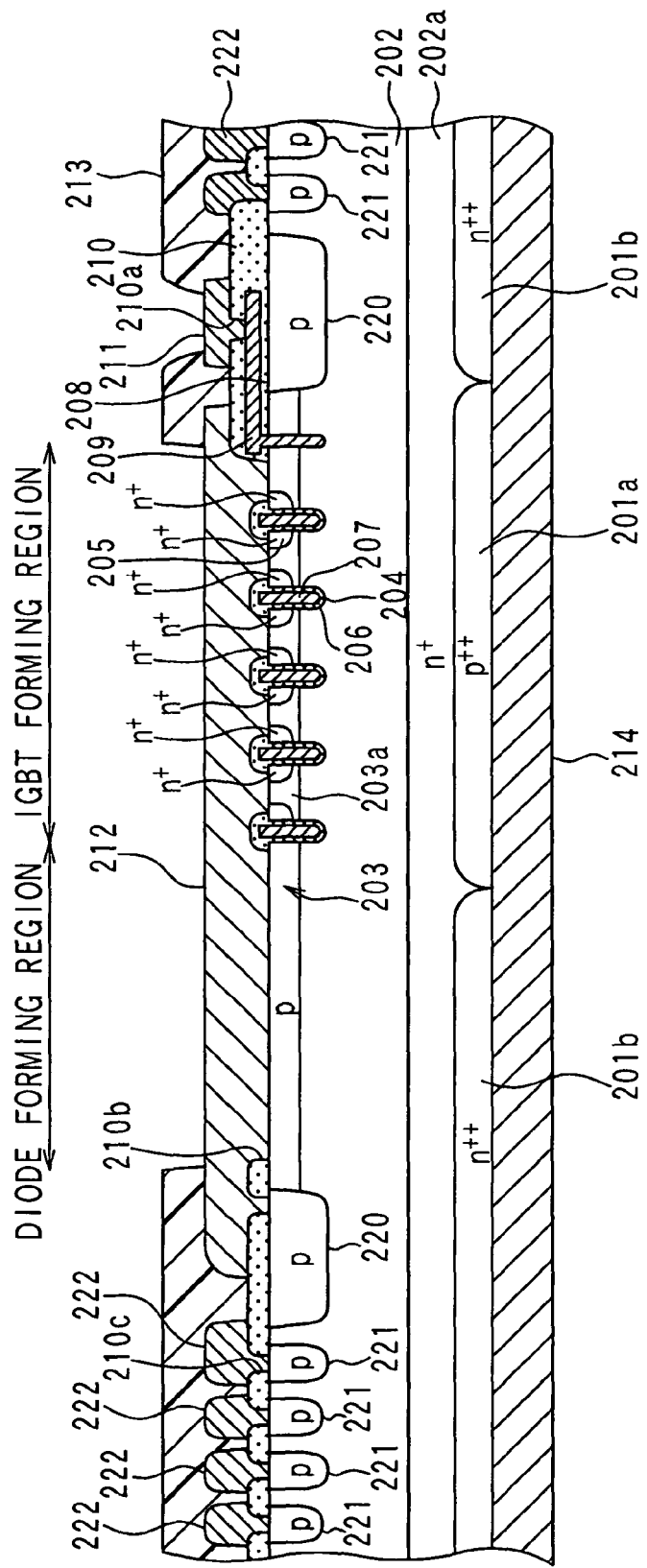
FIG. 24 is a diagram illustrating a cross sectional view of the semiconductor element.

As illustrated in FIG. 24, the semiconductor device according to the present embodiment includes a cell section in which the IGBT 103 is disposed and an outer peripheral section surrounding a periphery of the cell section. The semiconductor device includes a P++ type collector layer 201a and an N++ type cathode layer (first conductivity type layer) 201b. On surfaces of the P++ type collector layer 201a and the N++ type cathode layer 201b, an FS layer (field stop layer) 202a having a high concentration N type impurity is disposed. On a surface of the FS layer 202a, an N− type drift layer 202 is disposed. The N− type drift layer 202 has an impurity concentration lower than the P++ type collector layer 201a, the N++ type cathode layer 201b, and the FS layer 202a. The FS layer 202a is provided for improving a breakdown voltage and a steady loss by restricting diffusion of a depletion layer and for controlling an injection amount of holes injected from a rear-surface side of a substrate. The FS layer 202a is not always required.

In the cell section, a P type base region 203 having a predetermined thickness is disposed at a surface portion of the N− type drift layer 202. In an IGBT forming region in the cell section, a plurality of trenches 204 penetrates the P type base region 203 into the N− type drift layer 202. The trenches 204 divide the P type base region 203 into a plurality of portions. The trenches 204 are provided at predetermined intervals. The trenches 204 may extend in one direction and may be arranged in parallel to each other in a stripe structure. The trenches 204 may also be arranged in a ring structure. When the trenches 204 are arranged in the ring structures, a group of few trenches 204 configurates one multiple ring structure, and a longitudinal direction of the one multiple ring structure is parallel to a longitudinal direction of adjacent multiple ring structure.

The P type base region 203 is divided by the trenches 204 into a plurality of portions. At least some portions of the P type base region 203 become channel P layers 203a for providing channel regions. At a surface portion of each of the channel P layer 203a, N+ type emitter regions 205 are disposed. In an example illustrated in FIG. 24, each of the divided portions of the P type base region 203 becomes the channel P layer 203a. A part of divided portions of the P type base region 203 may also become a floating layer in which the N+ type emitter region 205 is not disposed.

Each of the N+ type emitter regions 205 has an impurity concentration greater than the N− type drift layer 202. Each of the N+ type emitter regions 205 terminates in the P type base region 203 and is in contact with a sidewall of one of the trenches 204. Each of the N+ type emitter regions 205 extends in the longitudinal direction of the one of the trenches 204 and terminates on an inside of an end of the one of the trenches 204.

In each of the trenches 204, a gate insulating layer 206 is disposed so as to cover an inner wall of each of the trenches 204. On a surface of the gate insulating layer 206, a gate electrode 207 is disposed so as to fill each of the trenches 204. The gate electrode 207 is made of, for example, doped polysilicon.

The gate electrodes 207 in the trenches 204 are electrically coupled with each other in a cross section different from a cross section illustrated in FIG. 23. The gate electrodes 207 are coupled with a doped polysilicon layer 209 disposed on an insulating layer 208. On a surface of the doped polysilicon layer 209, an interlayer insulating layer 210 is disposed. The interlayer insulating layer 210 has contact holes 210a, 210b, and 210c. The doped polysilicon layer 209 is electrically coupled with a gate wire 211 through the contact hole 210a. The gate wire 211 is applied with a gate voltage.

The N+ type emitter regions 205 and the channel P layers 203a are electrically coupled with an upper electrode 212 through the contact holes 210b provided in the interlayer insulating layer 210. The upper electrode 212 and the gate wire 211 are electrically insulated, for example, by a protective layer 213. On a rear-surface side of the P++ type collector layer 201a, a lower electrode 214 is disposed. The IGBT 103 has the above-described configuration.

In a diode forming region in the cell section, the trench 204 is not provided at a portion corresponding to the N++ type cathode layer 201b. The P type base region 203 can operate as an anode, and the N+ type FS layer 202a and the N++ type cathode layer 201b can operate as a cathode, and thereby the diode 104 is provided by a PN junction. The P type base region 203 that can operate as the anode of the diode 104 is electrically coupled with the upper electrode 212. The N++ type cathode layer 201b that can operate as a part of the cathode is electrically coupled with the lower electrode 214.

The emitter and the anode are electrically coupled with each other and the collector and the cathode are electrically coupled with each other. Thus, the IGBT 103 and the diode 104 are coupled in parallel in one chip.

In the outer peripheral section, at a surface portion of the N− type drift layer 202, a P type diffusion layer 220 is disposed so as to surround the periphery of the cell section. The P type diffusion layer 220 is deeper than the P type base region 203. In addition, P type guard ring layers 221 having a multiple ring structures are disposed so as to surround an outer periphery of the P type diffusion layer 220. Each of the P type guard ring layers 221 is electrically coupled with one of an outer peripheral electrodes 222 through the contact hole 210c provided in the interlayer insulating layer 210. The outer peripheral electrodes 222 are disposed so as to correspond to the P type guard ring layers 221. The outer peripheral electrodes 222 are electrically separated from each other. The outer peripheral electrodes 222 have a multiple ring structure in a manner similar to the P type guard ring layers 221.

As described above, the semiconductor element 102 in which the IGBT 103 and the diode 104 are integrated is configurated.

Figure 25:
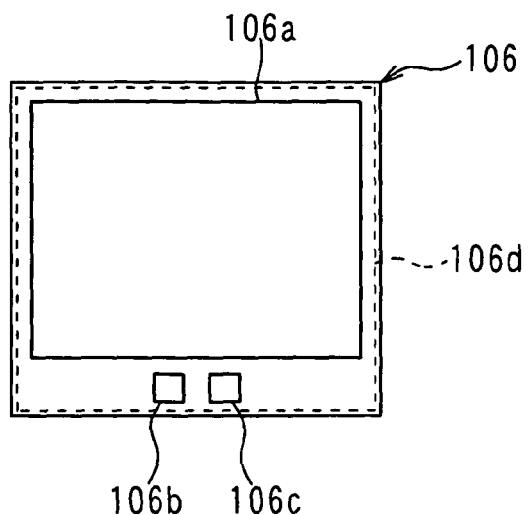
FIG. 25 is a diagram illustrating a top view of a semiconductor chip including the semiconductor element.

The semiconductor element 102 is formed in a semiconductor chip 106 as illustrated in FIG. 25. The semiconductor chip 106 includes a plurality of pads 106a-106d. The pad 106a occupies a large area of the semiconductor chip 106. The pad 106a is provided for being coupled with the upper electrode 212 electrically coupled with the emitter of the IGBT 103 and the anode of the diode 104. The pad 106b is provided for applying a gate voltage to the gate wire 211 in the IGBT 103. The pad 106b is provided for an emitter Kelvin. As shown by the dashed line in FIG. 25, the pad 106d is provided at the whole rear surface of the semiconductor chip 106. The pad 106d is coupled with the lower electrode 214 electrically coupled with the collector of the IGBT 103 and the cathode of the diode 104. The pads 106a-106d are electrically coupled so that each pad of the semiconductor element 102 can be electrically coupled with an external device.

Figure 26C:
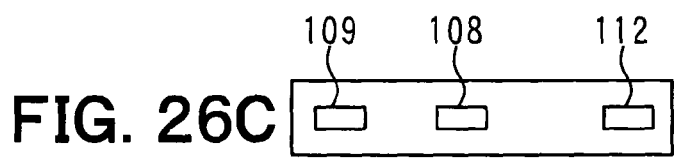
FIG. 26C is a diagram illustrating another side view of the semiconductor device.
Figures 26A, 26D, 26E:
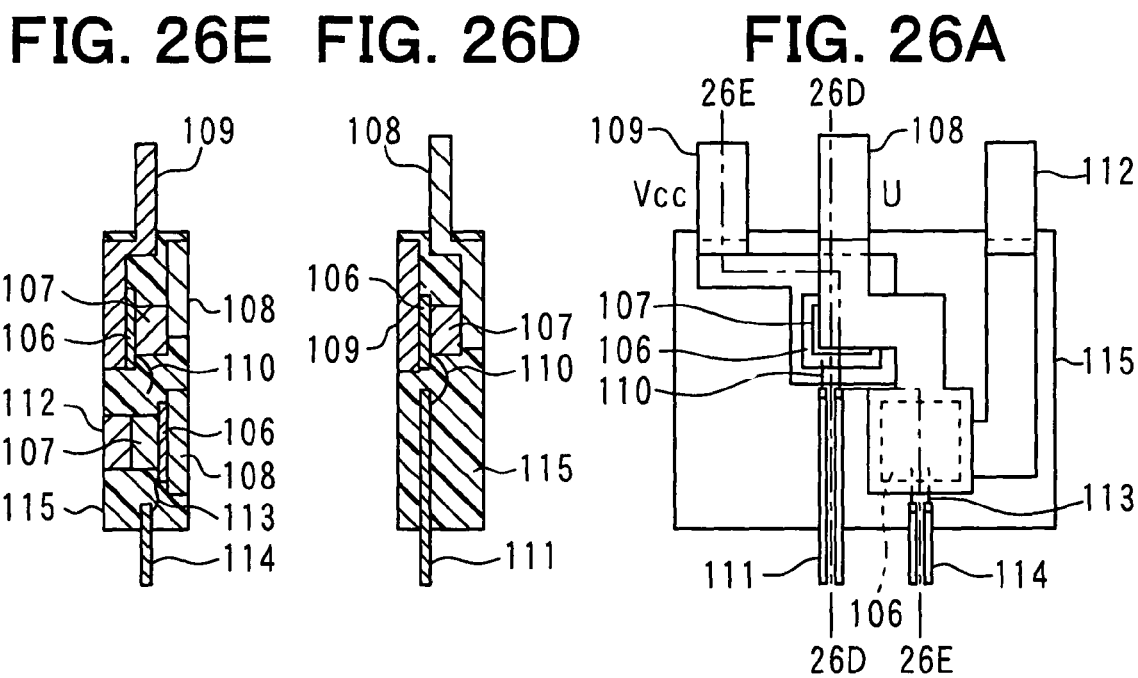
FIG. 26A is diagram illustrating a plan view of the semiconductor device according to the ninth embodiment.
FIG. 26D is a diagram illustrating a cross-sectional view of the semiconductor device taken along line 26D-26D in FIG. 26A.
FIG. 26E is a diagram illustrating a cross-sectional view of the semiconductor device taken along line 26E-26E in FIG. 26A.

In a top view in FIG. 26A, the semiconductor chip 106 in the upper arm is disposed in such a manner that a front side opposes the upper electrode 212 and a rear side opposes the lower electrode 214. In a cross-sectional view in FIG. 26D, the semiconductor chip 106 in the upper arm is disposed in such a manner that a right side opposes the upper electrode 212 and a left side opposes the lower electrode 214.

In the semiconductor chip 106 in the upper arm, the pad 106a for the upper electrode 212 is coupled with a heat sink 107, and the heat sink 107 is coupled with a lead 108 coupled with the three-phase motor 105. The pad 106d for the lower electrode 214 is coupled with a collector lead 109. The pad 106b for the gate wire 211 is coupled with a gate lead 111 through a bonding wire 110. The lead 108 is drawn on a cross section illustrated in FIG. 26D so as to be electrically coupled with the three-phase motor 105. The collector lead 109 and the gate lead 111 are drawn on the cross sections illustrated in FIG. 26D and FIG. 26E so that the voltage Vcc is applied from the power source to the lower electrode 214 and the gate voltage is applied through the gate wire 211.

The semiconductor chip 106 in the lower arm is disposed in a reversed manner compared with the semiconductor chip 106 in the upper arm. That is, in a top view in FIG. 26A, the semiconductor chip 106 in the lower arm is disposed in such a manner that a front side opposes the lower electrode 214 and a rear side opposes the upper electrode 212. In a cross-sectional view in FIG. 26D, the semiconductor chip 106 in the lower arm is disposed in such a manner that a right side opposes the lower electrode 214 and a left side opposes the upper electrode 212.

In the semiconductor chip 106 in the lower arm, the pad 106a for the upper electrode 212 is coupled with a heat sink 107, and the heat sink 107 is coupled with an emitter lead 112 coupled with the ground line 101. The pad 106d for the lower electrode 214 is coupled with the lead 108 coupled with the three-phase motor 105. The pad 106b for the gate wire 211 is coupled with the gate lead 114 through the bonding wire 113. The lead 108 is drawn on the cross section illustrated in FIG. 26D so as to be electrically coupled with the three-phase motor 105. The gate lead 114 is drawn on the cross section illustrated in FIG. 26E so that the gate voltage is applied through the gate wire 211. The emitter lead 112 is drawn on a cross section different from the cross sections illustrated in FIG. 26D and FIG. 26E so that the lower electrode 214 is coupled with the ground.

The semiconductor device is sealed with a molded resin 115 in such a manner that the collector lead 109, the lead 108, the emitter lead 112, the gate leads 111 and 114 protrude from the molded resin 115 and surfaces of the collector lead 109, the lead 108 and the emitter lead 112 are exposed for improving a heat radiation performance on two sides in a thickness direction of the semiconductor chip 106.

An exemplary method of manufacturing the semiconductor device according to the present embodiment will be described with reference to FIG. 27A to FIG. 28D.

Figure 27A:
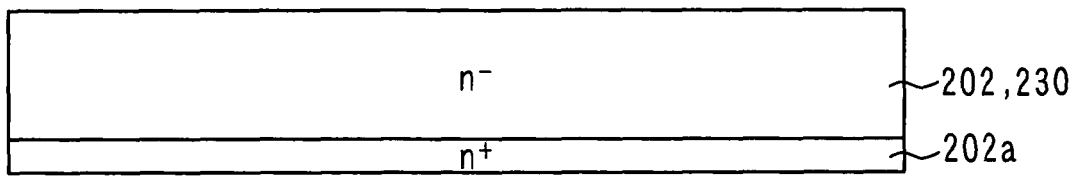
FIG. 27A to FIG. 27E are diagrams illustrating processes of manufacturing the semiconductor device according to the ninth embodiment.

During a process illustrated in FIG. 27A, an N type silicon substrate 230 is prepared. The N type silicon substrate 230 has a thickness of greater than or equal to about 200 μm and is does not warp. The N type silicon substrate 230 is, for example, an FZ substrate. N type impurities are implanted on a rear surface of the N type silicon substrate 230, and the N type silicon substrate 230 is treated with an anneal treatment. Accordingly, the N+ type FS layer 202a having a depth from is formed at a rear-surface portion of the N type silicon substrate 230. A portion of the N type silicon substrate 230 other than the FS layer 202a becomes the N− type drift layer 202.

Figure 27B:
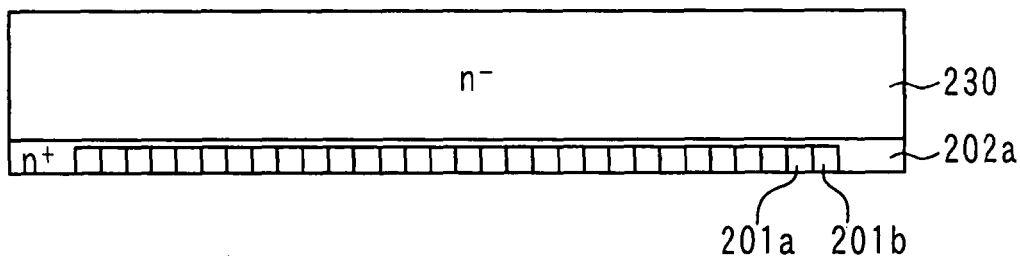

During a process illustrated in FIG. 27B, P type impurities are implanted to the FS layer 202a using a mask having openings at portions where the P++ type collector layer 201 will be formed. Next, N type impurities are implanted to the FS layer 202a using a mask having openings at portions where N++ type cathode layer 201b will be formed. Then, an anneal treatment is performed so as to form the P++ type collector layer 201a and the N++ type cathode layer 201b.

Figure 27C:
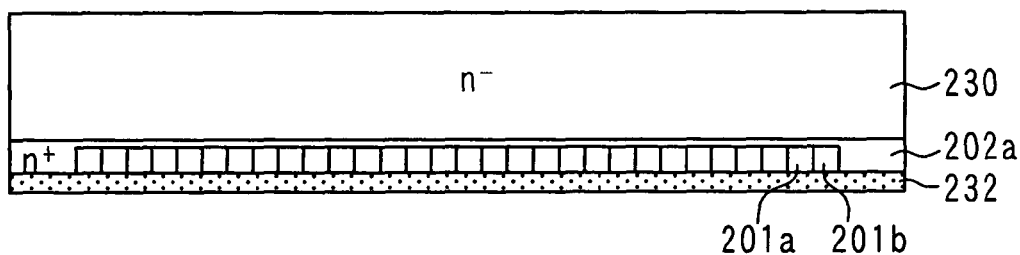

During a process illustrated in FIG. 27C, a bonding layer 232 made of polysilicon or silicon oxide is formed on the rear-surface side of the N type silicon substrate 230, that is, on a surface of the P++ type collector layer 201a and a surface of the N++ type cathode layers 201b.

Figure 27D:
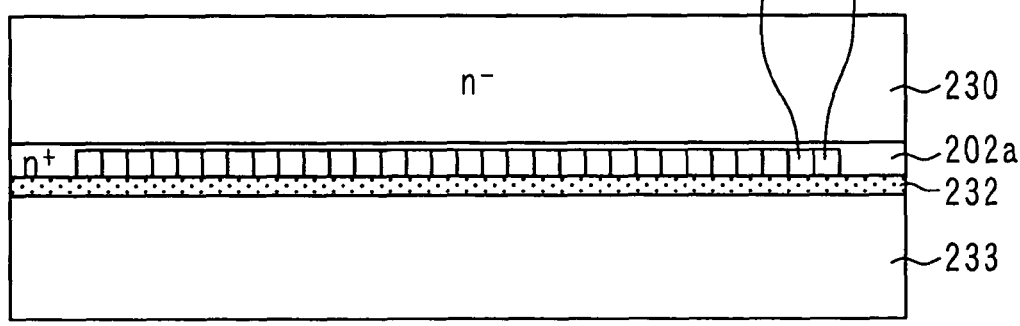

During a process illustrated in FIG. 27D, the support base 233, for example, having a thickness of from about 500 μm to about 600 μm and made of silicon, is bonded on the rear-surface side of the N type silicon substrate 230 through the bonding layer 232. The support base 233 may also be disposed on the rear-surface side of the N type silicon substrate 230, for example, by depositing silicon on a surface of the bonding layer 232 with a chemical vapor deposition process or by epitaxially growing silicon on the surface of the bonding layer 232. The support base 233 may also be made of other material.

Figure 27E:
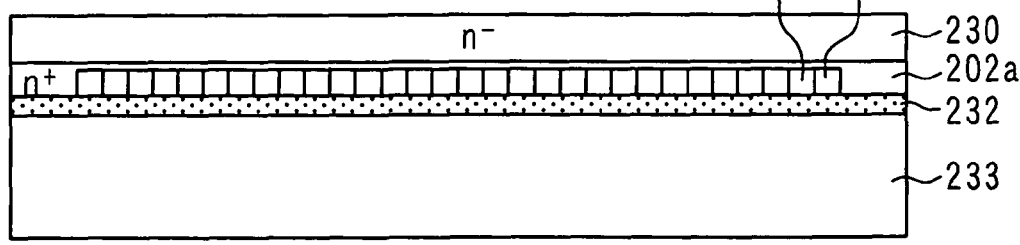

During a process illustrated in FIG. 27E, a thickness of the N type silicon substrate 230 is reduced by grinding or etching from the main surface of the N type silicon substrate 230. Accordingly, the N type silicon substrate 230 provides the N− type drift layer 202 having a predetermined thickness.

Figure 28A:
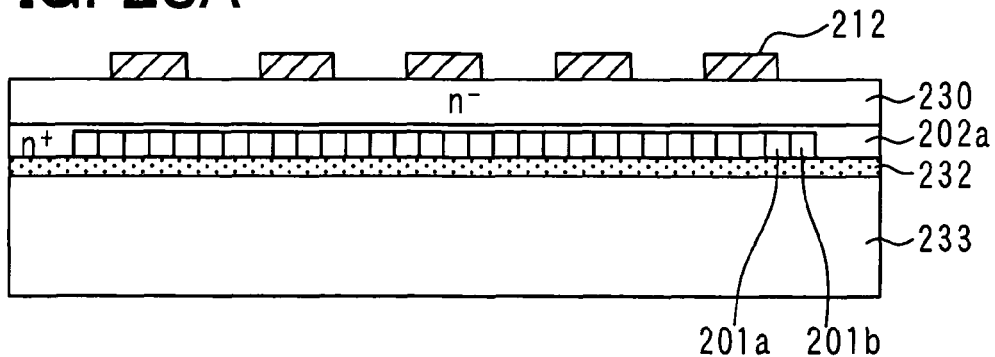
FIG. 28A to FIG. 28D are diagrams illustrating processes of manufacturing the semiconductor device according to the ninth embodiment.

During a process illustrated in FIG. 28A, the P type diffusion layers 220, the P type guard ring layers 221, and the P type base region 203 are formed at the surface portion of the N− type drift layer 202. In addition, an element part including the trenches 204, the N+ type emitter regions 205, the gate insulating layers 206, the gate electrodes 207, an insulating layers 208, a doped polysilicon layer 209, the interlayer insulating layer 210, the gate wire 211, the upper electrode 212 and the protective layer 213 is formed in the IGBT forming region and the diode forming region so that a MOS device is formed. In the outer peripheral section, the outer peripheral electrodes 222 and the protective layer 213 are formed. Although a configuration of the MOS device is simplified in FIG. 28A, a plurality of the MOS devices illustrated in FIG. 24 is formed.

Figure 28B:
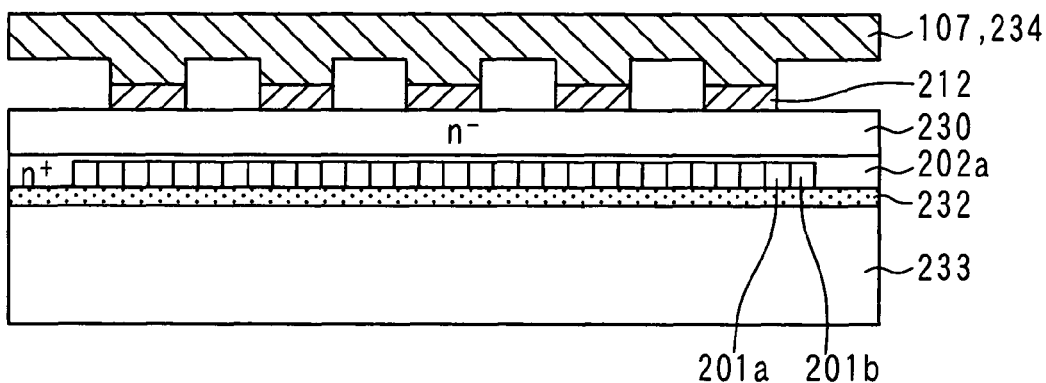

During a process illustrated in FIG. 28B, a heat sink substrate 234 is attached to the main-surface side of the N type silicon substrate 230, that is, surfaces of the upper electrodes 212 and surfaces of the protective layers 213. In the heat sink substrate 234, a plurality of the heat sinks 107 is integrated in a plate shape. The heat sink substrate 234 has a plurality of protruding portions. Each of the protruding portions is located at a position corresponding to one of the upper electrodes 212 so as to be in contact with the one of the upper electrodes 212.

Figure 28C:
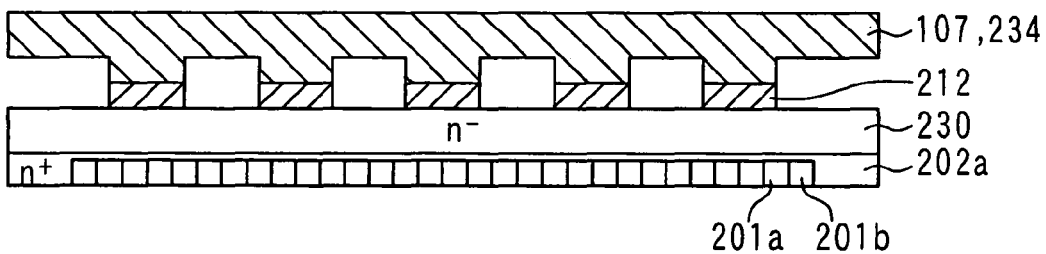

During a process illustrated in FIG. 28C, the support base 233 and the bonding layer 232 are removed from the rear-surface side of the N type silicon substrate 230 and the P++ type collector layer 201a and the N++ type cathode layer 201b are exposed. During this process, the heat sink substrate 234 is attached to the N type silicon substrate 230. Thus, the N type silicon substrate 230, in which the MOS devices are formed, is not handled in a thin-film state.

The support base 233 and the bonding layer 232 may be removed, for example, by grinding or wet etching. In a case where the support base 233 and the bonding layer 232 are removed by wet etching, the wet etching is automatically stopped when the bonding layer 232 made of polysilicon layer appears. Then, polysilicon and silicon oxide are selectively etched so that the support base 233 and the bonding layer 232 are removed with a high degree of accuracy. The support base 233 and the bonding layer 232 may also be removed, for example, a slice cutting method, a smart cutting method, an ELTRAN method, or a laser lift-off method.

Figure 28D:
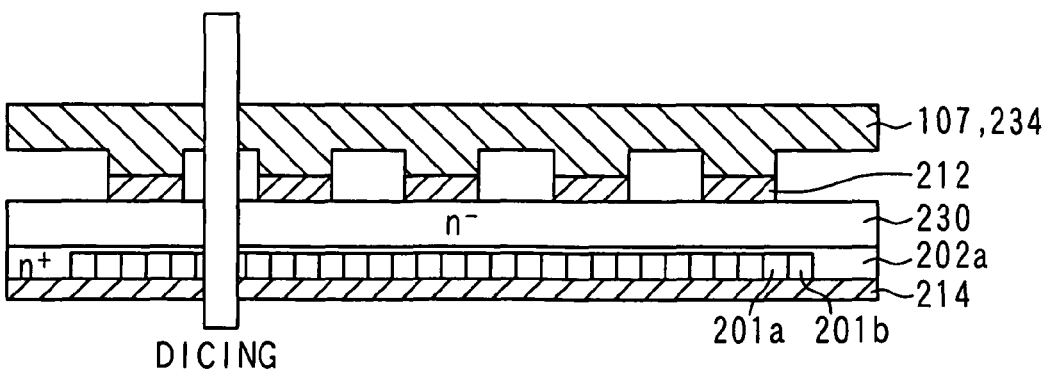
Figure 30:
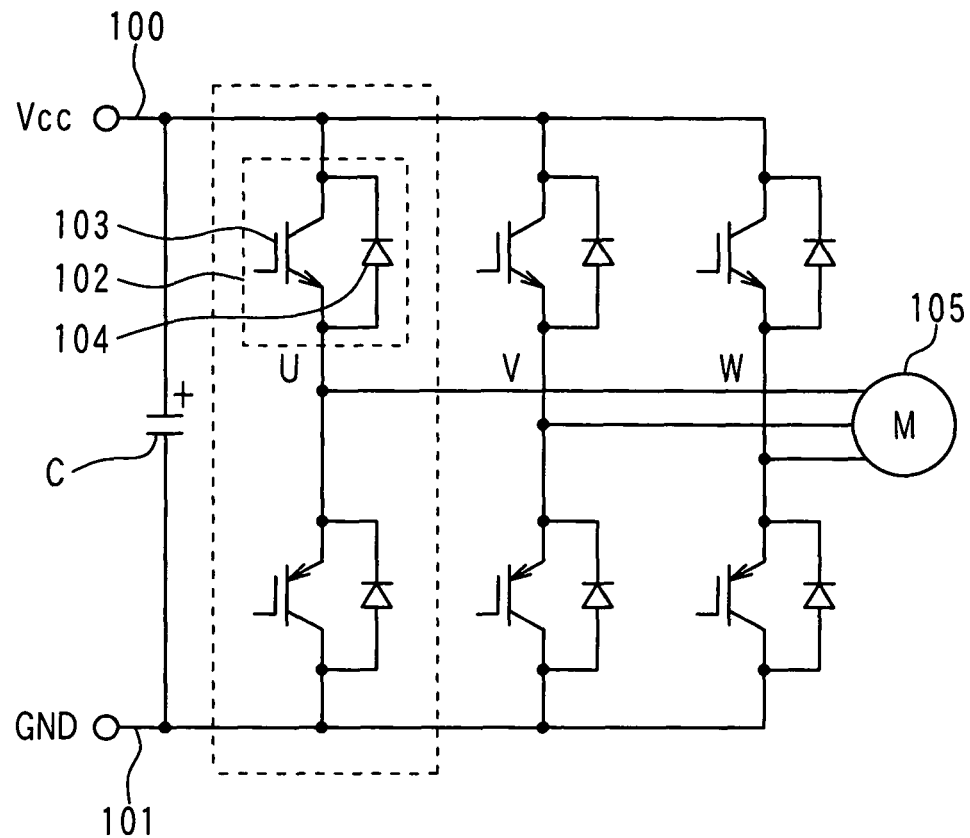
FIG. 30 is a circuit diagram of an inverter circuit in which a semiconductor element provided in a semiconductor device according to an eleventh embodiment of the present invention operates as a switching element.

During a process illustrated in FIG. 28D, the lower electrode 214 is formed on the surfaces of the P++ type collector layers 201a and the surfaces of the N++ type cathode layers 201b. Last, the N type silicon substrate 230 and the heat sink substrate 24 are diced into chips. Accordingly, the semiconductor device in which the heat sink 107 is bonded on the semiconductor chip 106 as illustrated in FIG. 26D and FIG. 26E is formed. In a case where the heat sink substrate 234 has openings at portions other than upper electrode 212, that is, in a case where the heat sink substrate 234 has openings at portions corresponding to exposed portions (the pads 106b) of the gate wires 211, the heat sink substrate 234 is required only to be diced into chips. In a case where the heat sink substrate 234 does not have openings at portions corresponding to the exposed portion of the gate wire 211, the heat sink substrate 234 may be previously diced so that the portions corresponding to the exposed portions of the gate wire 211 are exposed before the N type silicon substrate 230 is diced into chips.

The subsequent processes are not illustrated. The pad 106b for applying the gate voltage to the gate wire 211 and the gate lead 111 are coupled with each other through the bonding wire 110. The collector lead 109 is bonded to the lower electrode 214 of the semiconductor element 102 disposed on the semiconductor chip 106 in the upper arm. The lead 108 is bonded to the upper electrode 212 of the semiconductor element 102 disposed on the semiconductor chip 106 in the upper arm and the lower electrode 214 of the semiconductor element 102 disposed in the semiconductor chip 106 in the lower arm. The emitter lead 112 is coupled with the upper electrode 212 of the semiconductor element 102 disposed on the semiconductor chip 106 in the lower arm. Then, the semiconductor chip 106 in the upper arm and the semiconductor chip 106 in the lower arm are sealed with the molded resin 115, and thereby the semiconductor device according to the present embodiment is formed.

In the manufacturing method according to the present embodiment, the FS layer 202a, the P++ type collector layer 201a, and the N++ type cathode layer 201b are formed before forming the MOS device. Thus, an anneal treatment other than a laser anneal can be performed. In addition, because the heat sink substrate 234 for providing the heat sink 107 is bonded to the N type silicon substrate 230 before forming the MOS device, the N type silicon substrate 230 is not handled in a thin-film state. Then, the N type silicon substrate 230 and the heat sink substrate 234 are concurrently diced into chips so that the semiconductor chip 106 integrated with the heat sink 107 can be formed. Because the semiconductor chip 106 is handled with the heat sink 107, the semiconductor chip 106 is not handled in a thin-film state in the subsequent processes. After the dicing process, the semiconductor chip 106 which has a dimension of about 10 mm$^2$ and a thickness of about 0.03 mm to about 0.2 mm is supported by the heating sink 107 which has a thickness of about 1 mm. Thus, a handling of the semiconductor chip 106 can be easily performed.

Tenth Embodiment

A semiconductor device according to the tenth embodiment of the present invention will be described with reference to FIG. 29A to FIG. 29E.

In the semiconductor device according to the present embodiment, the U phase, the V phase, the W phase are modularized so as to be integrated.

As illustrated in FIG. 29A, three semiconductor chips 106 are disposed in upper arms respectively and three semiconductor chips 106 are disposed in lower arms respectively. Each of the U phase, the V phase, and the W phase is provided by a pair of the semiconductor chips 106 arranged in an upper-lower direction.

As illustrated in FIG. 29A to FIG. 29E, the semiconductor chips 106 in the upper arm and the lower arm of each of the U phase, the V phase, and the W phase are arranged in a manner similar to those of the ninth embodiment illustrated in FIG. 26A to FIG. 26E. The lower electrode 214 of each of the semiconductor chips 106 in the upper arms is electrically coupled with a common collector lead 109. The upper electrode 212 of each of the semiconductor chips 106 in the lower arms is electrically coupled with a common emitter lead 112. The six semiconductor elements 102 configurating the U phase, the V phase, and the W phase are modularized and integrated into the semiconductor device. Other configuration is similar to those of the ninth embodiment. Connecting conditions of the semiconductor ships 106 and various leads are similar to those of the ninth embodiment.

As described above, the six semiconductor chips 106 configurating the three phases may be integrated into the semiconductor device.

Eleventh Embodiment

A semiconductor device according to the tenth embodiment of the present invention will be described with reference to FIG. 29A to FIG. 29E.

In the semiconductor device according to the present embodiment, the IGBT 103 provided in the semiconductor element 102 at the lower arm in each of three phases is a P channel type. Each component of the P channel type IGBT 103 has a reversed conductivity type compared with the IGBT 103 of the ninth embodiment. In the semiconductor device according to the ninth embodiment, the first conductivity type is the N type and the second conductivity type is the P type. In the semiconductor device according to the present embodiment, the first conductivity type is the P type and the second conductivity type is the N type. That is, in an IGBT forming region, an N++ type collector layer, a P+ type FS layer, a P- type drift layer, an N type base region, a P+ type emitter region are formed. In a diode forming region, a P++ type anode region, the P+ type FS layer, and the P- type drift layer operate as an anode, and the N type base region operates as a cathode, and thereby a PN junction is provided.

Figure 31:
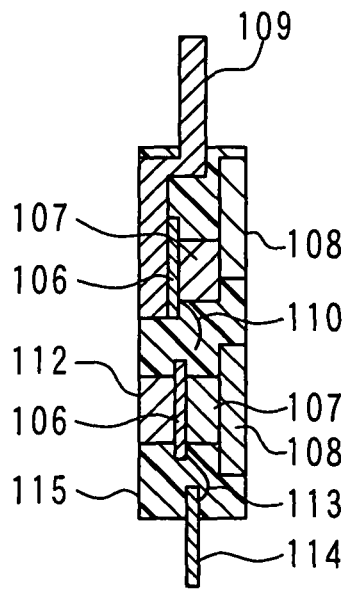
FIG. 31 is a diagram illustrating a cross-sectional view of the semiconductor device according to the eleventh embodiment.

In the semiconductor device, an emitter of the N channel type IGBT 103 and an emitter of the P channel type IGBT are electrically coupled with each other. The IGBT 103 disposed in the lower arm and the IGBT 103 disposed in the upper arm have different structures. Thus, semiconductor chips 106 having different structures are formed. A basic structure of the IGBT 103 disposed in the lower arm is similar to that of the IGBT 103 disposed in the upper arm, and the emitter of the N channel type IGBT 103 and the emitter of the P channel type IGBT 103 are coupled with each other. Thus, as illustrated in FIG. 31, the heat sink 107 coupled with the emitter of the N channel type IGBT 103 through the upper electrode 212 and the heat sink 107 coupled with the emitter of the P channel type IGBT 103 through the upper electrode 212 are disposed in the same direction with respect to the semiconductor chips 106, and both the heat sink 107 are coupled with the same lead 108.

As described above, the N channel type IGBT 103 and the P channel type IGBT 103 may also be combined in the semiconductor device. In the present case, the directions of the semiconductor chip 106 on which the N channel type IGBT 103 is formed and the heat sink 107 can be the same as the direction of the semiconductor chip 106 on which the P channel type IGBT 103 is formed and the heat sink 107. Thus, the bonding wires 110 and 113 can be easily coupled with the gates compared with a case where the directions are different from each other.

In the above-described example, the IGBT 103 in the lower arm in the semiconductor device according to the ninth embodiment is set to be the P channel type. The IGBT 103 in the lower arm in the semiconductor device according to the tenth embodiment may also be set to be the P channel type. Also in this case, the above-described effects can be obtained.

Twelfth Embodiment

A semiconductor device according to a twelfth embodiment of the present invention will be described with reference to FIG. 32 and FIG. 33.

In the present embodiment, after the manufacturing process illustrated in FIG. 27A to FIG. 27D and FIG. 28A are performed, during the process illustrated in FIG. 28B, a heat sink substrate 234 different from that of the ninth embodiment is used.

Figure 32:
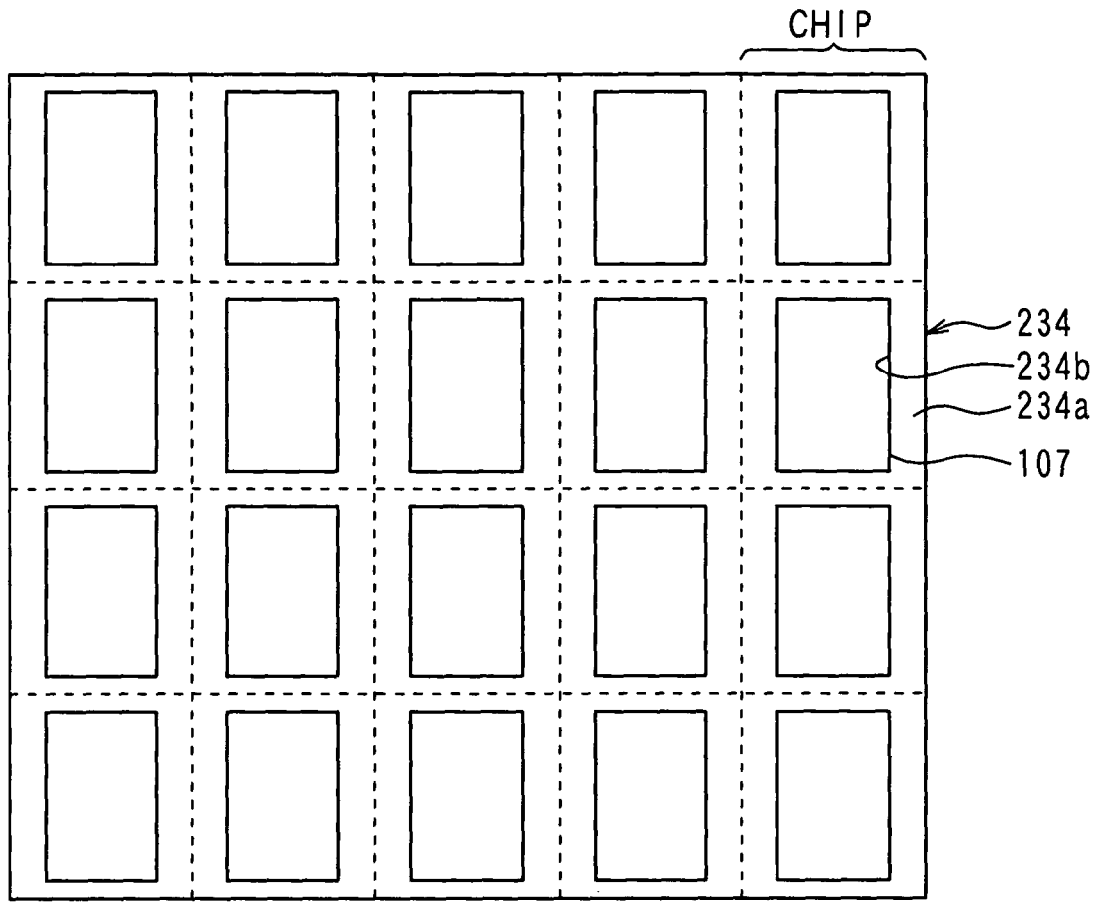
FIG. 32 is a front view of a heat sink substrate used for manufacturing a semiconductor device according to a twelfth embodiment of the present invention.

As illustrated in FIG. 32, the heat sink substrate 234 according to the present embodiment includes a silicon substrate 234a operating as a base and a plurality of heat sinks 107 disposed on the silicon substrate 234a. The silicon substrate 234a has recess portions provided at intervals corresponding to the semiconductor chips 106. Each of the heat sinks 107 is disposed in one of the recess portions 234b so that each of the heat sinks 107 is disposed at a position corresponding to one of the semiconductor chips 106. The heat sinks 107 may be attached to the silicon substrate 234a by any method. In order to reduce influence of a difference in thermal expansion coefficients of the heat sink 107 and the silicon substrate 234a, a silicon resin material for absorbing thermal expansion may be applied in the recess portions 234b.

Figure 33:
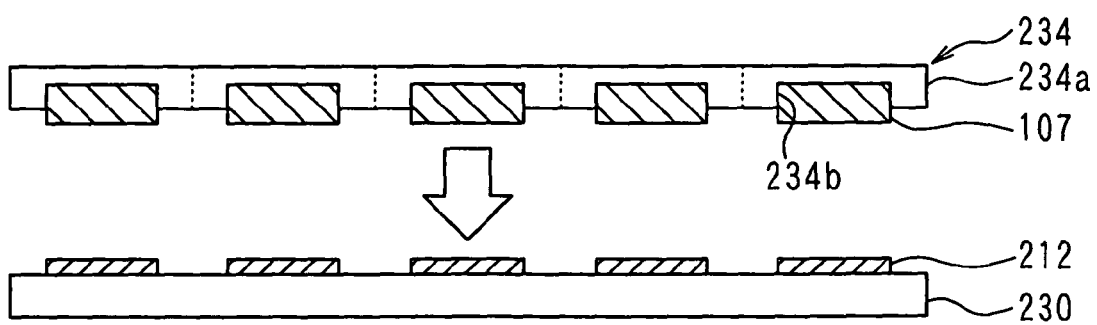
FIG. 33 is a diagram illustrating a manufacturing process of the semiconductor device according to the twelfth embodiment.

The heat sink substrate 234 having the above-described structure is disposed on the N type silicon substrate 230 in which the MOS devices is formed in such a manner that heat sinks 107 oppose the main surface of the N type silicon substrate, as illustrated in FIG. 33. The heat sinks 107 are bonded to the upper electrodes 212, respectively, through a conductive member such as solder. In a case where each of the heat sinks 107 is soldered to one of the upper electrodes 212, a reflow process at about 300° C. is performed. Thus, the heat sink substrate 234 and the N type silicon substrate 230 may thermally expand. Because the base of the heat sink substrate 234 and the N type silicon substrate 230 are made of the same material and have the same thermal expansion coefficient, a difference does not generate in the intervals between the heat sinks 107 by heating.

After the heat sinks 107 are bonded to the upper electrodes 212, the heat sinks 107 are separated from the silicon substrate 234a, for example, by a cooling process at about −40° C. In a case where the silicon resin material is disposed between the heat sinks 107 and the recess portions 234b, the silicon resin material absorbs thermal expansion of constituent material of the heat sinks 107 such as, for example, copper, during a heating process at about 300° C. During the cooling process at about −40° C., the constituent material of the heat sinks 107 contracts. Thus, the heat sinks 107 can easily be separated from the silicon substrate 234a.

Next, a breakdown voltage at a low temperature is measured as needed. At this point, the N type silicon substrate 230 is not diced. The heat sinks 107 are disposed at positions corresponding to the semiconductor elements 102 in the N type silicon substrate 230 having a wafer shape. Thus, the breakdown voltage at the low temperature can be measured by setting the lower electrode 214 coupled with the P++ type collector layers 201a to be a common potential, and proving each emitter potential through each of the heat sinks 107.

In addition, when a probe for controlling each of the gate electrodes 207 is provided in each of the semiconductor chips 106 and a common gate voltage is applied, an on-property of the IGBT can be measured.

Figure 26B:
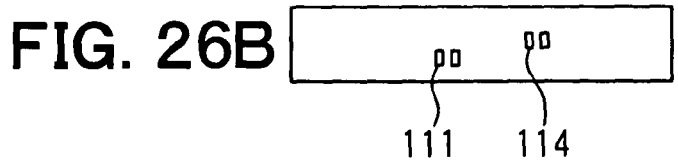
FIG. 26B is a diagram illustrating a side view of the semiconductor device.

Last, the N type silicon substrate 230 in which the MOS devices are formed is diced. Accordingly, the semiconductor device in which the heat sinks 107 are bonded on the semiconductor chip 106 as illustrated in FIG. 26D and FIG. 26B can be obtained.

During the subsequent processes, various leads are coupled and the semiconductor chips 106 are sealed with the molded resin 115, and thereby the semiconductor device having a configuration similar to that of the semiconductor device according to ninth embodiment can be obtained. Thus, also in the manufacturing method according to the present embodiment, effects similar to those of the ninth embodiment can be obtained.

In the present manufacturing method, the heat sinks 107 are separated from each other from the beginning. The heat sink substrate 234 is not required to be diced so that the heat sinks 107 are separated from each other unlike a case where the heat sinks 107 are integrated in the heat sink substrate 234. Thus, the heat sink substrate 234 can have a simple shape and the heat sink substrate 234 is not influenced by residual of the dicing process.

The silicon substrate 234a separated from the heat sink 107 can be reused by attaching another heat sinks 107.

In the above-described example, the heat sinks 107 are made of copper. In a case where the heat sinks 107 are made of a material having a thermal expansion coefficient close to that of the base such as, for example, molybdenum, even when the heat sinks 107 are diced with the silicon substrate 234a, a consistency of the thermal expansion coefficient can be ensured. The thermal expansion coefficient of copper is about 17 ppm/° C., the thermal expansion coefficient of molybdenum is about 5 ppm/° C. and the thermal expansion coefficient of silicon is about 3 ppm/° C. That is, the thermal expansion coefficient of molybdenum is closer to that of silicon than that of copper is. Thus, by using molybdenum, a distortion due to a difference in the thermal expansion coefficients can be reduced. Therefore, when the heat sinks 107 are made of molybdenum, the heat sinks 107 may be diced with the silicon substrate 234a, and the silicon substrate 234a may be used as a part of the heat sinks 107. Because a thermal conductivity of silicon is high, the silicon substrate 234a may be used as a part of the heat sinks 107.

Thirteenth Embodiment

Figure 34A:
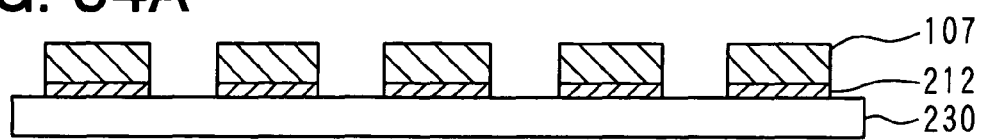
FIG. 34A to FIG. 34D are diagrams illustrating processes of manufacturing a semiconductor device according to a thirteenth embodiment of the present invention.

A manufacturing method of a semiconductor device according to a thirteenth embodiment of the present invention will be described with reference to FIG. 34A to FIG. 34B.

After performing the processes of the ninth embodiment illustrated in FIG. 27A to FIG. 27D and FIG. 28A, the process of the twelfth embodiment illustrated in FIG. 33 is performed, and thereby each of the heat sinks 107 is bonded to one of the upper electrodes 212 formed on the N type silicon substrate 230. That is, after preparing the heat sink substrate 234 in which the heat sinks 107 are disposed on the silicon substrate 234a, each of the heat sinks 107 is bonded to one of the upper electrodes 212 formed on the N type silicon substrate 230. Then, the silicon substrate 234a is separated from the heat sinks 107.

Figure 34B:
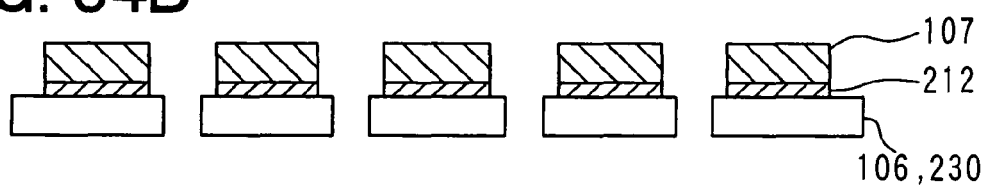
Figure 34C:
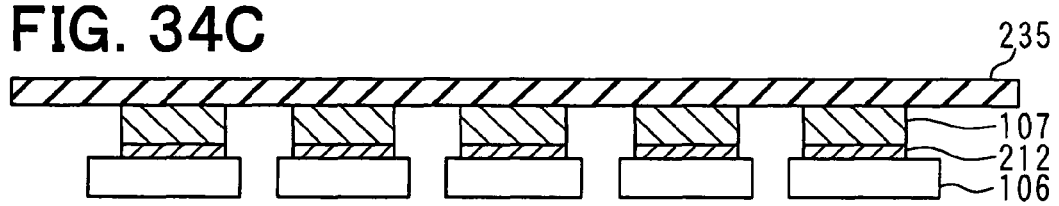

During a process illustrated in FIG. 34B, the N type silicon substrate 230 is diced into chips. Intervals of the semiconductor chips 106 are equal to a separated width by the dicing process. During a process illustrated in FIG. 34C, an adhesive tape 235 is attached to the heat sinks 107 left in a state where the dicing process has been performed. During a process illustrated in FIG. 34D, the adhesive tape 235 is expanded, and thereby the intervals of the semiconductor chips 106 are expanded substantially evenly. When each of the semiconductor chips 106 is sealed with the molded resin 115 in a state where the intervals are maintained, a die mount becomes easy and an insulating breakdown voltage can be ensured due to the expansion of the intervals between the adjacent semiconductor chips 106.

Figure 34D:
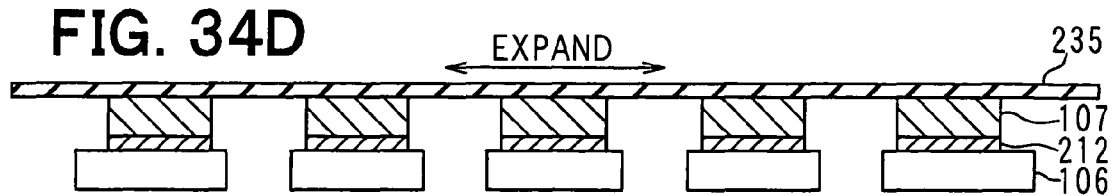
Figure 35A:
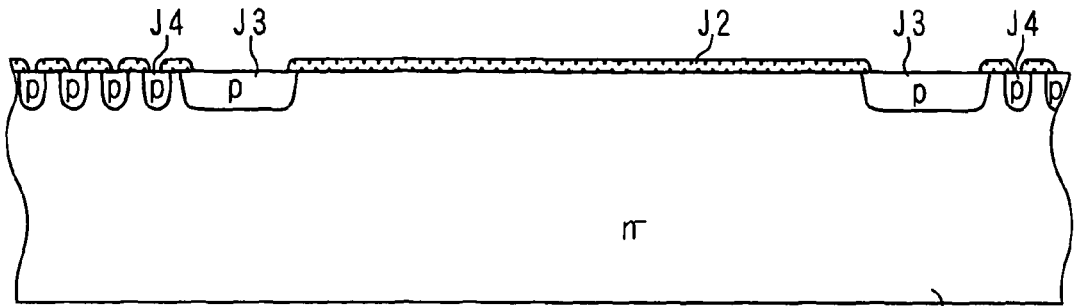
FIG. 35A to FIG. 35D are diagrams illustrating processes of manufacturing a semiconductor device according to the related art.
Figure 35B:
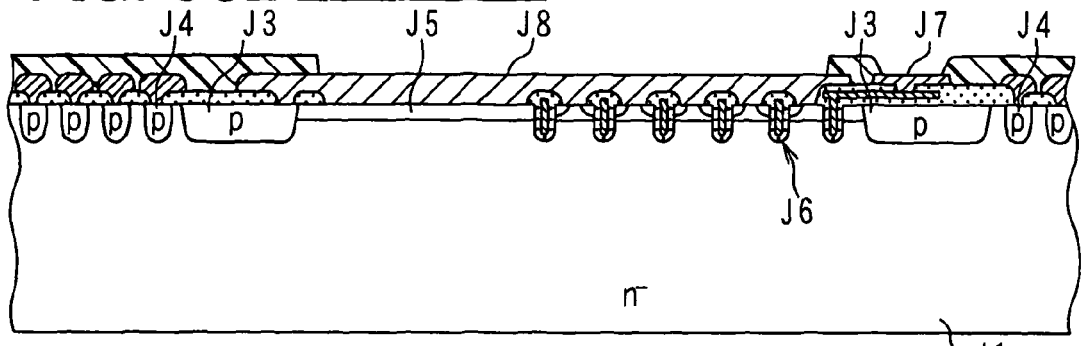
Figure 35C:
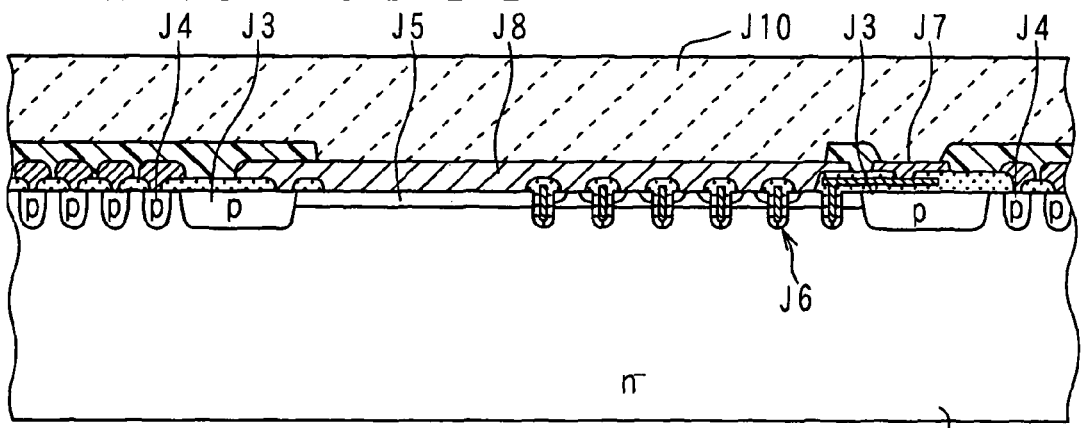
Figure 35D:
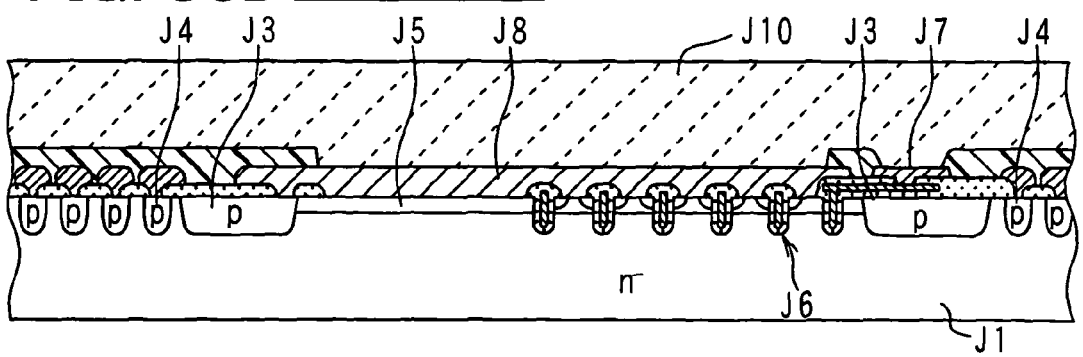
Figure 36A:
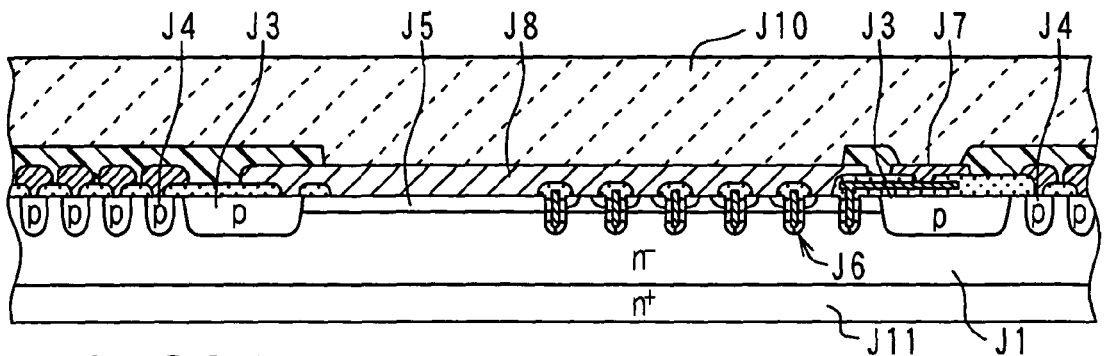
FIG. 36A to FIG. 36D are diagrams illustrating processes of manufacturing the semiconductor device according to the related art.
Figure 36B:
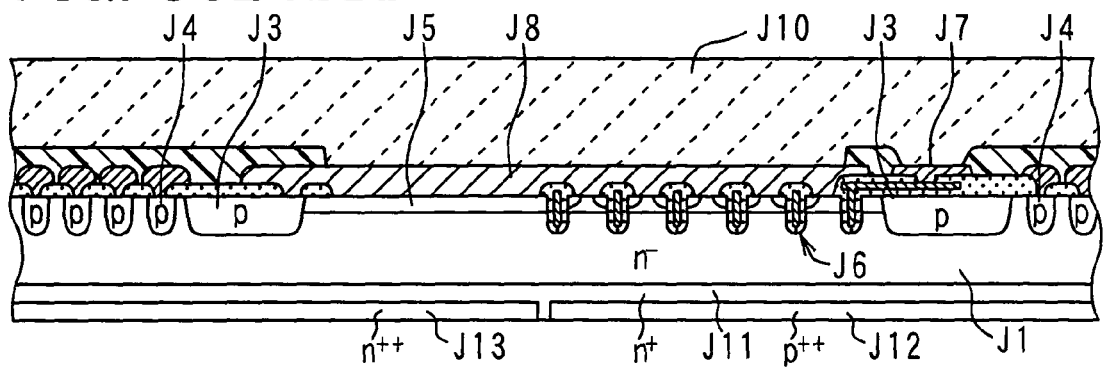
Figure 36C:
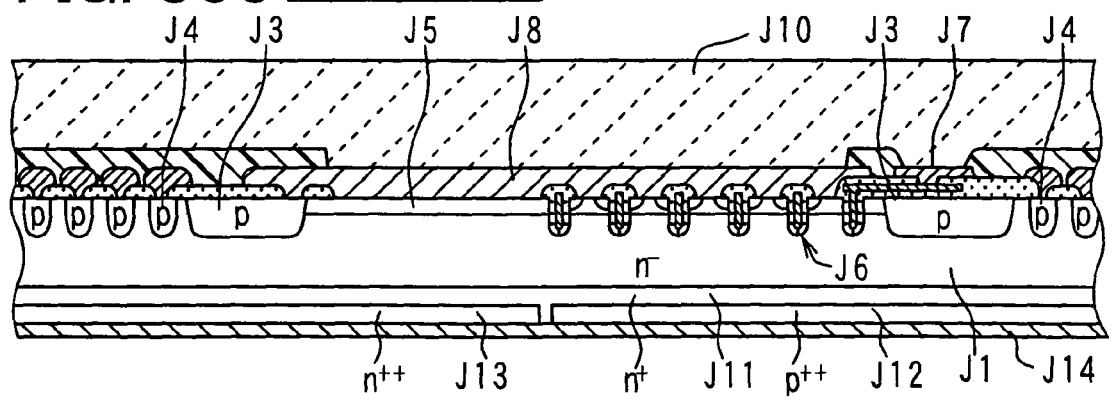
Figure 36D:
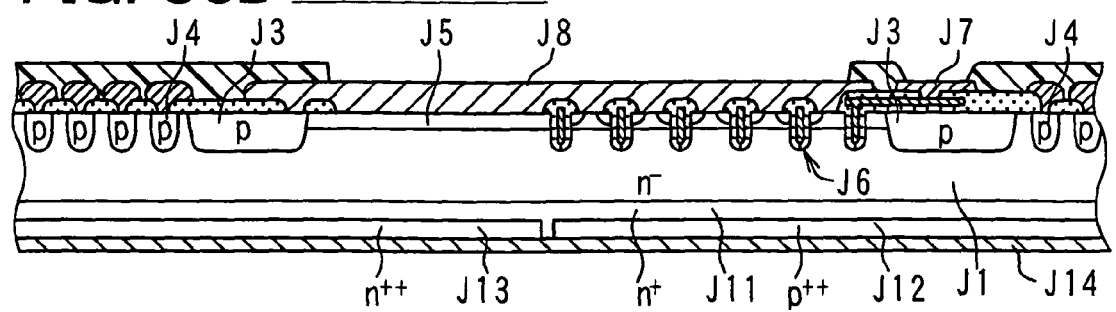

Three consecutive semiconductor chips 106 illustrated in FIG. 34D are mounted at the intervals on the collector lead 109 illustrated in FIG. 29A coupled with a terminal to be applied with a voltage Vcc. In view of a breakdown voltage and intervals at a mounting, the adhesive tape 235 can be expanded in accordance with a mounting structure. Thus, when a semiconductor device having a breakdown voltage of 600 V and a semiconductor device having a breakdown voltage of 1200 V are manufactured, the above-described manufacturing method can be applied only by changing an expansion ratio.

An output terminal of each of the U phase, the V phase, and the W phase can be mounted in a similar manner. Three consecutive semiconductor chips 106 illustrated in FIG. 34D are mounted on the leads 108 coupled at an outer periphery (not shown), and thereby the inverter circuit illustrated in FIG. 23 is formed.

The process of expanding the adhesive tape 235 attached with the semiconductor chips 106 can be applied to the ninth to eleventh embodiments as well as the twelfth embodiment.

Other Embodiments

Although the present invention has been fully described in connection with the exemplary embodiments thereof with reference to the accompanying drawings, it is to be noted that various changes and modifications will become apparent to those skilled in the art.

In the above-described first embodiment, the surface of the FS layer 2a and the surface of the N++ type cathode layer 1b are oxidized, as an example. The oxide layer 31 may also be formed only on the surface of the N++ type cathode layer 1b by enhanced-oxidizing in a state where the surface of the FS layer 2a is covered with the silicon nitride layer.

In this case, the oxide layer 31 is not formed at a portion covered with the silicon nitride layer. Thus, even when the enhanced-oxidization is not prominent, by removing the silicon nitride layer, the ion implantation of the second conductivity type impurities for forming the P++ type collector layer can be performed at a predetermined position.

Each of the IGBTs described in the above-described embodiments is basically an N channel type IGBT in which the first conductivity type is the N type and the second conductivity type is the P type. Alternatively, each of the IGBTs may be a P channel type IGBT in which a conductivity type of each component is reversed. In this case, in an IGBT forming region, an N++ type collector layer, a P+ type FS layer, a P− type drift layer, an N type base region, a P+ type emitter region are formed. In a diode forming region, a P++ type anode region, the P+ type FS layer, and the P− type drift layer operate as an anode, and the N type base region operates as a cathode, and thereby a PN junction is provided.

In a diode formed in the same chip with the N channel type IGBT, the N++ type cathode layer $1b$ or $201b$ corresponds to a first conductivity type layer. In a diode formed in the same chip with the P channel type IGBT, the P++ type anode region corresponds to a first conductivity type layer.

What is claimed is:

1. A method of manufacturing a semiconductor device including an IGBT forming region and a diode forming region, the semiconductor device comprising:
a first conductivity type layer of a first conductivity type disposed in the diode forming region;
a collector layer of a second conductivity type disposed in the IGBT forming region;
a drift layer of the first conductivity type disposed above the first conductivity type layer and the collector layer;
a base region of the second conductivity type disposed above the drift layer;
a plurality of trenches penetrating the base region into the drift layer so as to divide the base region into a plurality of portions;
an emitter region of the first conductivity type disposed in one of the plurality of portions of the base region divided by the plurality of trenches and being in contact with a sidewall of one of the plurality of trenches;
a gate insulating layer disposed on a surface of the plurality of trenches;
a gate electrode disposed on the gate insulating layer in the plurality of the trenches;
a first electrode electrically coupled with the base region and the emitter region; and
a second electrode disposed on an opposite side of the collector layer from the drift layer, wherein:
in the IGBT forming region, the collector layer, the drift layer, the base region, the emitter region, and the gate electrode provide an IGBT;
in the diode forming region, the first conductivity type layer and the drift layer have a PN junction with the base region so as to provide the diode; and
the IGBT and the diode are integrated,
the method comprising:
preparing a semiconductor substrate of the first conductivity type having first and second surfaces opposing each other;
implanting second conductivity type impurities for forming the collector layer to the second surface of the semiconductor substrate using a mask that has an opening at a portion where the collector layer will be formed;
forming an oxide layer by enhanced-oxidizing the collector layer;
implanting first conductivity type impurities for forming the first conductivity type layer to the second surface of the semiconductor substrate using the oxide layer as a mask;
attaching a support base to a side of the semiconductor substrate where the oxide layer and the first conductivity type layer are formed;
reducing a thickness of the semiconductor substrate from the first surface in a state where the semiconductor substrate is attached with the support base; and
forming an element part including the base region, the emitter region, the plurality of trenches, the gate insulating layer, the gate electrode, and the first electrode on the first surface of the semiconductor substrate after reducing the thickness of the semiconductor substrate, wherein
the forming the element part on the first surface of the semiconductor substrate includes positioning the element part with respect to the first conductivity type layer and the collector layer, which are formed to the second surface of the semiconductor substrate, using the oxide layer as a target.

2. The method according to claim 1, wherein:
the implanting the second conductivity type impurities for forming the collector layer is performed using a silicon nitride layer as the mask; and
the forming the oxide layer is performed by enhanced-oxidizing the collector layer using the silicon nitride layer as a mask so that the oxide layer is not formed at a portion covered with the silicon nitride layer.

3. The method according to claim 1, further comprising:
attaching a support member on the first surface of the semiconductor substrate after forming the element part;
removing the support base from the semiconductor substrate in a state where the semiconductor substrate is attached with the support member and exposing a surface of the first conductivity type layer and a surface of the collector layer; and
forming the second electrode on the surface of the first conductive type layer and the surface the collector layer.

4. The method according to claim 3, further comprising planarizing the second electrode.

5. The method according to claim 3, further comprising:
attaching a dicing tape on the second electrode;
removing the support member from the semiconductor substrate; and
dicing the semiconductor substrate into chips in a state where the dicing tape is attached with the second electrode.

6. The method according to claim 1, further comprising forming a field stop layer on the second surface of the semiconductor substrate before implanting the second conductivity type impurities for forming the collector layer and the first conductivity type impurities for forming the first conductivity type layer.

7. A method of manufacturing a semiconductor device including an IGBT forming region and a diode forming region, the semiconductor device comprising:
a first conductivity type layer of a first conductivity type disposed in the diode forming region;
a collector layer of a second conductivity type disposed in the IGBT forming region;
a drift layer of the first conductivity type disposed above the first conductivity type layer and the collector layer;
a base region of the second conductivity type disposed above the drift layer;
a plurality of trenches penetrating the base region into the drift layer so as to divide the base region into a plurality of portions;
an emitter region of the first conductivity type disposed in one of the plurality of portions of the base region divided by the plurality of trenches and being in contact with a sidewall of one of the plurality of trenches;
a gate insulating layer disposed on a surface of the plurality of trenches;
a gate electrode disposed on the gate insulating layer in the plurality of the trenches;
a first electrode electrically coupled with the base region and the emitter region; and a second electrode disposed on an opposite side of the collector layer from the drift layer, wherein:

in the IGBT forming region, the collector layer, the drift layer, the base region, the emitter region, and the gate electrode provide an IGBT;

in the diode forming region, the first conductivity type layer and the drift layer have a PN junction with the base region so as to provide the diode; and the IGBT and the diode are integrated, the method comprising:

preparing a semiconductor substrate of the first conductivity type having first and second surfaces opposing each other;

implanting second conductivity type impurities for forming the collector layer to the second surface of the semiconductor substrate using a mask that has an opening at a portion where the collector layer will be formed;

forming an oxide layer by enhanced-oxidizing the collector layer;

implanting first conductivity type impurities for forming the first conductivity type layer to the second surface of the semiconductor substrate using the oxide layer as a mask;

attaching a support base to a side of the semiconductor substrate where the oxide layer and the first conductivity type layer are formed;

reducing a thickness of the semiconductor substrate from the first surface in a state where the semiconductor substrate is attached with the support base; and forming an element part including the base region, the emitter region, the plurality of trenches, the gate insulating layer, the gate electrode, and the first electrode on the first surface of the semiconductor substrate after reducing the thickness of the semiconductor substrate, wherein:

the implanting the second conductivity type impurities for forming the collector layer is performed using a silicon nitride layer as the mask; and the forming the oxide layer is performed by enhanced-oxidizing the collector layer using the silicon nitride layer as a mask so that the oxide layer is not formed at a portion covered with the silicon nitride layer.

8. The method according to claim 1, wherein:

the collector layer is formed closer to the support base than the first conductivity type layer.

9. The method according to claim 1, wherein:

a thickness of the semiconductor substrate is greater in a region where the collector layer is formed than a region where the first conductivity type layer is formed.

* * * * *